US012687779B2

(12) United States Patent
Toyooka

(10) Patent No.: US 12,687,779 B2
(45) Date of Patent: Jul. 21, 2026

(54) TRANSFER FILM, MANUFACTURING METHOD OF LAMINATE, LAMINATE, AND MICRO LED DISPLAY ELEMENT

(71) Applicant: FUJIFILM Corporation, Tokyo (JP)

(72) Inventor: Kentaro Toyooka, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/756,284

(22) Filed: Jun. 27, 2024

(65) Prior Publication Data

US 2024/0369922 A1 Nov. 7, 2024

Related U.S. Application Data

(63) Continuation of application No. PCT/JP2022/048250, filed on Dec. 27, 2022.

(30) Foreign Application Priority Data

Dec. 28, 2021 (JP) ................................ 2021-214027
Feb. 28, 2022 (JP) ................................ 2022-029680

(51) Int. Cl.
*B32B 3/10* (2006.01)
*B32B 37/00* (2006.01)
(Continued)

(52) U.S. Cl.
CPC .............. *G03F 7/0042* (2013.01); *B32B 3/10* (2013.01); *B32B 37/025* (2013.01); (Continued)

(58) Field of Classification Search
CPC ....... B32B 3/10; B32B 37/025; G03F 7/0007; G03F 7/004; G03F 7/0043; G03F 7/028
See application file for complete search history.

(56) References Cited

U.S. PATENT DOCUMENTS

2009/0141505 A1 6/2009 Ushiki et al.
2017/0003593 A1 1/2017 Yoshinari et al.
(Continued)

FOREIGN PATENT DOCUMENTS

JP 10260388 A 9/1998
JP 2006011180 A 1/2006
(Continued)

OTHER PUBLICATIONS

JP 2017-202631 (Year: 2017).*
(Continued)

*Primary Examiner* — Elizabeth E Mulvaney
(74) *Attorney, Agent, or Firm* — Sughrue Mion, PLLC

(57) ABSTRACT

An object of the present invention is to provide a transfer film in which, in a case of being applied to pattern formation in production of a display element including an LED chip, a display element to be produced has excellent black density in a case of black display and also has excellent brightness in a case of white display. Another object of the present invention is to provide a manufacturing method of a laminate, a laminate, and a micro LED display element.

The transfer film of the present invention includes, in the following order, a temporary support, a photosensitive precursor layer of a light absorbing layer, and a photosensitive precursor layer of a light reflecting layer, in which a thickness of the precursor layer of the light reflecting layer is 3 μm or more.

23 Claims, 8 Drawing Sheets

30

(51) Int. Cl.

| | |
|---|---|
| ***G03F 7/00*** | (2006.01) |
| ***G03F 7/004*** | (2006.01) |
| ***G03F 7/031*** | (2006.01) |
| ***G03F 7/033*** | (2006.01) |
| *H10W 90/00* | (2026.01) |

(52) U.S. Cl.

CPC .......... *G03F 7/0007* (2013.01); *G03F 7/0043* (2013.01); *G03F 7/031* (2013.01); *G03F 7/033* (2013.01); *B32B 2309/105* (2013.01); *B32B 2457/206* (2013.01); *H10W 90/00* (2026.01)

(56) References Cited

U.S. PATENT DOCUMENTS

| | | | | |
|---|---|---|---|---|
| 2020/0159123 | A1 * | 5/2020 | Kanna .................... | H05K 3/064 |
| 2021/0288105 | A1 | 9/2021 | Kawanishi et al. | |
| 2022/0163887 | A1 | 5/2022 | Kim et al. | |

FOREIGN PATENT DOCUMENTS

| | | | |
|---|---|---|---|
| JP | 2010275561 | A | 12/2010 |
| JP | 2012177877 | A | 9/2012 |
| JP | 201477950 | A | 5/2014 |
| JP | 2015184323 | A | 10/2015 |
| JP | 2017202631 | A | 11/2017 |
| JP | 2020205417 | A | 12/2020 |
| JP | 2021144098 | A | 9/2021 |
| JP | 2022083434 | A | 6/2022 |

OTHER PUBLICATIONS

International Preliminary Report on Patentability (with translation of Written Opinion) dated Jun. 20, 2024, issued in International Application No. PCT/JP2022/048250.

Written Opinion (PCT/ISA/237) dated Mar. 20, 2023, issued by the International Searching Authority in International Application No. PCT/JP2022/048250.

International Search Report (PCT/ISA/210) dated Mar. 20, 2023 issued by the International Searching Authority in International Application No. PCT/JP2022/048250.

Communication dated May 26, 2026 issued by the Japanese Patent Office in application No. 2023-571061.

* cited by examiner

TRANSFER FILM, MANUFACTURING METHOD OF LAMINATE, LAMINATE, AND MICRO LED DISPLAY ELEMENT

CROSS-REFERENCE TO RELATED APPLICATIONS

This application is a Continuation of PCT International Application No. PCT/JP2022/048250 filed on Dec. 27, 2022, which claims priority under 35 U.S.C. § 119(a) to Japanese Patent Application No. 2021-214027 filed on Dec. 28, 2021 and Japanese Patent Application No. 2022-029680 filed on Feb. 28, 2022. The above applications are hereby expressly incorporated by reference, in their entirety, into the present application.

BACKGROUND OF THE INVENTION

1. Field of the Invention

The present invention relates to a transfer film, a manufacturing method of a laminate, a laminate, and a micro light emitting diode (LED) display element.

2. Description of the Related Art

In recent years, as a next-generation display element, development of a micro LED display element in which a minute LED chip is mounted on an array substrate of a pixel circuit has been advanced. Typically, the micro LED display element includes, as a constituent member, a micro LED array substrate including a substrate, a plurality of micro LED chips disposed on the substrate, and a partition wall layer disposed between the LED chips for the purpose of suppressing color mixing of light between adjacent pixels.

Meanwhile, JP2010-275561A discloses a white resist used as an insulating layer in a printed wiring board on which an LED chip is mounted, the insulating layer being disposed around the LED chip and can reflect light from the LED chip with high reflectivity. In addition, in JP2010-275561A, the above-described insulating layer is formed by screen printing.

SUMMARY OF THE INVENTION

The present inventor has found that, in a case of producing and examining the printed wiring board on which the LED chip is mounted, which is disclosed in JP2010-275561A, brightness in a case of white display is excellent, but black density in a case of black display is deteriorated. That is, it is clarified that improvement for achieving both the brightness in a case of white display and the black density in a case of black display is required.

In addition, in recent years, a photolithography process is often applied to the production of the wiring board. The photolithography process is a process of exposing a photoresist through a mask and then removing a soluble portion in a developer by development. For example, in a case where the photoresist is a photoresist (negative tone photoresist) which is cured by exposure, curing reaction proceeds in a mask opening portion, and the curing reaction is suppressed in a non-exposed portion shielded by the mask. Therefore, the exposed portion and the non-exposed portion have different solubility in a developer, and only the non-exposed portion having high solubility in the developer is removed in the development treatment. In particular, from the viewpoint of reducing the number of steps for obtaining a predetermined pattern, a method of forming a photoresist using a transfer film has been widely applied.

An object of the present invention is to provide a transfer film in which, in a case of being applied to pattern formation in production of a display element including an LED chip, a display element to be produced has excellent black density in a case of black display and also has excellent brightness in a case of white display.

Another object of the present invention is to provide a manufacturing method of a laminate, a laminate, and a micro LED display element.

As a result of intensive studies, the present inventor has found that the above-described objects can be achieved by the following configurations.

[1] A transfer film comprising, in the following order:

a temporary support;

a photosensitive precursor layer of a light absorbing layer; and a photosensitive precursor layer of a light reflecting layer, in which a thickness of the precursor layer of the light reflecting layer is 3 μm or more.

[2] The transfer film according to [1], in which the precursor layer of the light reflecting layer contains an alkali-soluble resin, a polymerizable compound, and a photopolymerization initiator.

[3] The transfer film according to [1] or [2], in which the precursor layer of the light absorbing layer contains an alkali-soluble resin, a polymerizable compound, and a photopolymerization initiator.

[4] The transfer film according to any one of [1] to [3], in which the thickness of the precursor layer of the light reflecting layer is 5 μm or more.

[5] The transfer film according to [2], in which the precursor layer of the light reflecting layer contains particles having a refractive index higher than a refractive index of a cured substance of the polymerizable compound.

[6] The transfer film according to [5], in which the particles include titanium oxide.

[7] The transfer film according to any one of [1] to [4], in which the precursor layer of the light reflecting layer contains metal particles.

[8] The transfer film according to any one of [1] to [4], in which the precursor layer of the light reflecting layer contains hollow particles.

[9] The transfer film according to any one of [1] to [4], in which the precursor layer of the light reflecting layer contains a liquid crystal compound.

[10] The transfer film according to any one of [1] to [9], in which a thickness of the precursor layer of the light absorbing layer is 1 μm or more.

[11] The transfer film according to any one of [1] to [10], in which the precursor layer of the light absorbing layer contains carbon black.

[12] The transfer film according to any one of [1] to [11], further comprising:

an interlayer between the precursor layer of the light absorbing layer and the precursor layer of the light reflecting layer.

[13] A manufacturing method of a laminate, comprising:

a bonding step of bonding the transfer film according to any one of [1] to [12] to a base material by bringing a surface of the transfer film on a side opposite to the temporary support into contact with the base material to obtain a precursor layer-attached base material including the base material, the precursor layer of the light reflecting layer, the precursor layer of the light-absorbing layer, and the temporary support in this order;

an exposing step of exposing the precursor layer of the light reflecting layer and the precursor layer of the light-absorbing layer in the precursor layer-attached base material; and a developing step of developing the exposed precursor layer of the light reflecting layer and the exposed precursor layer of the light-absorbing layer to form a pattern having a light reflecting layer and a light absorbing layer in order from the base material side, in which the manufacturing method further includes, between the bonding step and the exposing step or between the exposing step and the developing step, a peeling step of peeling the temporary support from the precursor layer-attached base material.

[14] A laminate formed by the manufacturing method of a laminate according to [13].

[15] A laminate comprising:

a base material; and a pattern formed from the transfer film according to any one of [1] to [12], the pattern being disposed on the base material.

[16] A micro LED display element comprising:

the laminate according to [14] or [15].

[17] A laminate comprising, in the following order:

a base material;

a light reflecting layer; and a light absorbing layer, in which a thickness of the light reflecting layer is 3 μm or more, the light absorbing layer has a first opening portion which penetrates in a thickness direction of the light absorbing layer, the light reflecting layer has a second opening portion which penetrates in a thickness direction of the light reflecting layer and communicates with the first opening portion, and the laminate further includes a light emitting element which is disposed on the base material exposed through the second opening portion.

[18] The laminate according to [17], in which an inner wall surface of the second opening portion of the light reflecting layer is inclined such that an area of the second opening portion is reduced from a surface of the light reflecting layer on a side opposite to the base material toward a surface of the light reflecting layer on a base material side.

[19] The laminate according to [17] or [18], in which an angle between an inner wall surface of the second opening portion of the light reflecting layer and a surface of the base material is 20° to 80°.

[20] The laminate according to any one of [17] to [19], in which the thickness of the light reflecting layer is 16 μm or more.

[21] A transfer film comprising, in the following order:

a temporary support;

a photosensitive precursor layer of a light absorbing layer; and a photosensitive layer, in which a thickness of the photosensitive layer is 3 μm or more.

[22] A manufacturing method of a laminate, comprising:

a bonding step of bonding the transfer film according to [21] to a base material by bringing a surface of the transfer film on a side opposite to the temporary support into contact with the base material to obtain a precursor layer-attached base material including the base material, the photosensitive layer, the precursor layer of the light-absorbing layer, and the temporary support in this order;

an exposing step of exposing the photosensitive layer and the precursor layer of the light-absorbing layer in the precursor layer-attached base material; and a developing step of developing the exposed photosensitive layer and the exposed precursor layer of the light-absorbing layer to form a light absorbing layer having a first opening portion penetrating in a thickness direction and a resin layer having a second opening portion penetrating in a thickness direction and communicating with the first opening portion, in which the manufacturing method further includes, between the bonding step and the exposing step or between the exposing step and the developing step, a peeling step of peeling the temporary support from the precursor layer-attached base material, a light reflecting layer forming step of forming a light reflecting layer on an inner wall surface of the second opening portion of the resin layer, and in a case where the base material includes no light emitting element on an exposed surface exposed through the second opening portion, a light emitting element disposing step of disposing the light emitting element on the exposed surface.

[23] A laminate formed by the manufacturing method of a laminate according to [22].

[24] A laminate comprising, in the following order:

a base material;

a resin layer; and a light absorbing layer, in which a thickness of the resin layer is 3 μm or more, the light absorbing layer has a first opening portion which penetrates in a thickness direction of the light absorbing layer, the resin layer has a second opening portion which penetrates in a thickness direction of the resin layer and communicates with the first opening portion, the laminate further includes a light emitting element which is disposed on the base material exposed through the second opening portion, and the laminate further includes a first light reflecting layer on an inner wall surface of the second opening portion of the resin layer.

[25] The laminate according to [24], in which a second light reflecting layer is further disposed between the base material exposed through the second opening portion and the light emitting element.

[26] The laminate according to [24] or [25], in which the inner wall surface of the second opening portion of the resin layer is inclined such that an area of the second opening portion is reduced from a surface of the resin layer on a side opposite to the base material toward a surface of the resin layer on a base material side.

[27] The laminate according to any one of [24] to [26], in which an angle between the inner wall surface of the second opening portion of the resin layer and a surface of the base material is 20° to 80°.

[28] The laminate according to any one of [24] to [27], in which the thickness of the resin layer is 16 μm or more.

[29] The laminate according to any one of [24] to [28], in which a total thickness of the resin layer and the light absorbing layer is larger than a thickness of the light emitting element.

[30] A transfer film comprising:

a temporary support; and a photosensitive precursor layer of a light absorbing layer, in which a thickness of the precursor layer of the light absorbing layer is 3 μm or more.

[31] A manufacturing method of a laminate, comprising:

a bonding step of bonding the transfer film according to [30] to a base material by bringing a surface of the transfer film on a side opposite to the temporary support into contact with the base material to obtain a precursor layer-attached base material including the base material, the precursor layer of the light-absorbing layer, and the temporary support in this order;

an exposing step of exposing the precursor layer of the light-absorbing layer in the precursor layer-attached base material; and a developing step of developing the exposed precursor layer of the light-absorbing layer to form a light absorbing layer having an opening portion penetrating in a thickness direction, in which the manufacturing method further includes, between the bonding step and the exposing step or between the exposing step and the developing step, a peeling step of peeling the temporary support from the precursor layer-attached base material, a light reflecting layer forming step of forming a light reflecting layer on an inner wall surface of the opening portion of the light absorbing layer, and in a case where the base material includes no light emitting element on an exposed surface exposed through the opening portion, a light emitting element disposing step of disposing the light emitting element on the exposed surface.

[32] A laminate formed by the manufacturing method of a laminate according to [31].

[33] A laminate comprising, in the following order:

a base material; and a light absorbing layer, in which a thickness of the light absorbing layer is 3 μm or more, the light absorbing layer has an opening portion which penetrates in a thickness direction of the light absorbing layer, the laminate further includes a light emitting element which is disposed on the base material exposed through the opening portion, and the laminate further includes a first light reflecting layer on an inner wall surface of the opening portion of the light absorbing layer.

[34] The laminate according to [33], in which a second light reflecting layer is further disposed between the base material exposed through the opening portion and the light emitting element.

[35] The laminate according to [33] or [34], in which the inner wall surface of the opening portion of the light absorbing layer is inclined such that an area of the opening portion is reduced from a surface of the light absorbing layer on a side opposite to the base material toward a surface of the light absorbing layer on a base material side.

[36] The laminate according to any one of [33] to [35], in which an angle between the inner wall surface of the opening portion of the light absorbing layer and a surface of the base material is 20° to 80°.

[37] The laminate according to any one of [33] to [36], in which the thickness of the light absorbing layer is 16 μm or more.

[38] The laminate according to any one of [33] to [37], in which the thickness of the light absorbing layer is larger than a thickness of the light emitting element.

According to the present invention, it is possible to provide a transfer film in which, in a case of being applied to pattern formation in production of a display element including an LED chip, a display element to be produced has excellent black density in a case of black display and also has excellent brightness in a case of white display.

In addition, according to the present invention, it is possible to provide a manufacturing method of a laminate, a laminate, and a micro LED display element.

DESCRIPTION OF THE PREFERRED EMBODIMENTS

Figure 1:
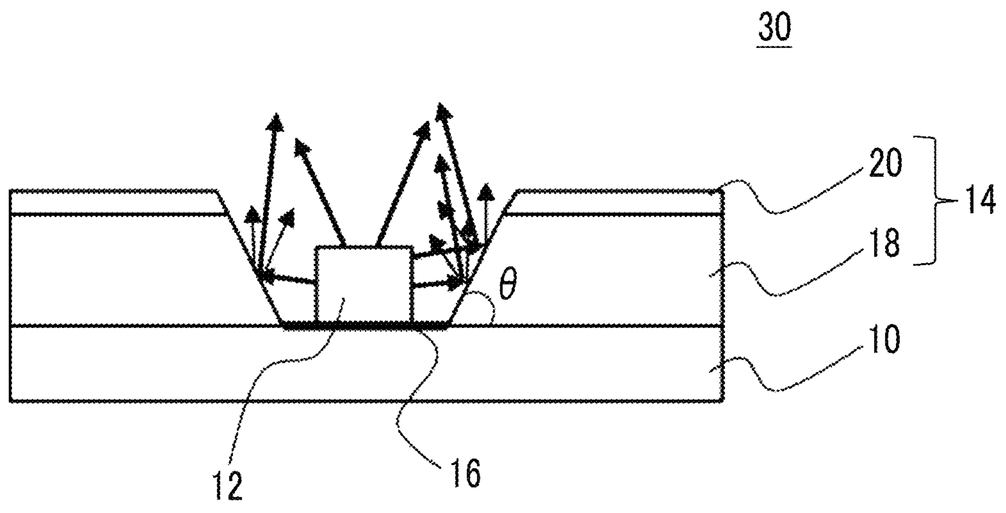
FIG. 1 is a view for describing an action mechanism of a transfer film according to a first embodiment, and is a partial schematic cross-sectional view showing an example of a display element.

Hereinafter, the present invention will be described in detail.

In the present specification, the numerical ranges shown using "to" indicate ranges including the numerical values described before and after "to" as the lower limit value and the upper limit value.

In the numerical range described stepwise in the present specification, the upper limit value or the lower limit value described in a certain numerical range may be replaced with the upper limit value or the lower limit value of another numerical range described stepwise. In addition, regarding the numerical range described in the present specification, an upper limit value or a lower limit value described in a numerical range may be replaced with a value described in Examples.

In the present specification, the term "step" includes not only an independent step but also a step that cannot be clearly distinguished from other steps, as long as the intended purpose of the step is achieved.

In the present specification, unless otherwise specified, a weight-average molecular weight (Mw) and a number-average molecular weight (Mn) are values obtained by a gel permeation chromatography (GPC) analysis apparatus and converted using polystyrene as a standard substance, with TSKgel GMHxL, TSKgel G4000HxL, or TSKgel G2000HxL (all product names manufactured by Tosoh Corporation) as a column, tetrahydrofuran (THF) as an eluent, and a differential refractometer as a detector.

In addition, in the present specification, unless otherwise specified, a molecular weight of a compound having a molecular weight distribution is the weight-average molecular weight (Mw).

In the present specification, unless otherwise specified, a content of metal elements is a value measured by using an inductively coupled plasma (ICP) spectroscopic analysis apparatus.

In the present specification, unless otherwise specified, a hue is a value measured by using a colorimeter (CR-221, manufactured by Konica Minolta, Inc.).

In the present specification, the concept of "(meth)acryl" includes both acryl and methacryl, the concept "(meth) acryloyl" includes both acryloyl and methacryloyl, and the concept of "(meth)acrylate" includes both acrylate and methacrylate.

In the present specification, "alkali-soluble" means that a solubility in 100 g of aqueous solution of 1% by mass sodium carbonate at a liquid temperature of 22° C. is 0.1 g or more. Therefore, for example, an alkali-soluble resin is intended to be a resin which satisfies the above-described solubility condition.

The above-described "alkali-soluble" is preferably 0.5 g or more and more preferably 1.0 g or more in terms of solubility in 100 g of aqueous solution of 1% by mass sodium carbonate at a liquid temperature of 22° C.

In the present specification, "water-soluble" means that the solubility in 100 g of water with a pH of 7.0 at a liquid temperature of 22° C. is 0.1 g or more. Therefore, for example, a water-soluble resin is intended to be a resin which satisfies the above-described solubility conditions.

The above-described "water-soluble" is preferably 0.5 g or more and more preferably 1.0 g or more in terms of solubility in 100 g of water at a pH of 7.0 and a liquid temperature of 22° C.

In the present specification, a "solid content" of a composition refers to components which form a composition layer formed of the composition, and in a case where the composition includes a solvent (an organic solvent, water, and the like), the solid content means all components except the solvent. In addition, in a case where the components are components which form a composition layer, the components are considered to be solid contents even in a case where the components are liquid components.

In the present specification, "transparent" means that an average transmittance of visible light having a wavelength of 400 nm to 700 nm is 80% or more, preferably 90% or more. Therefore, "transparent layer" means a layer having an average transmittance of visible light having a wavelength of 400 to 700 nm of 80% or more. The average transmittance is obtained by measuring direct transmittance light for each 1 nm.

In the present specification, the average transmittance of visible light is a value measured at 25° C. using a spectrophotometer, and can be measured using, for example, a spectrophotometer U-3310 manufactured by Hitachi, Ltd.

In addition, in the present specification, a thickness of each layer (for example, a precursor layer of a light reflecting layer, a precursor layer of a light absorbing layer, and an interlayer) is a value obtained by observing a cross section cut by a microtome with a scanning electron microscope (SEM) or a transmission electron microscope (TEM), and measuring and averaging thicknesses at 10 points, unless otherwise specified. Here, a thickness of 1 μm or more is measured by SEM, and a thickness of less than 1 μm is measured by TEM.

In addition, in the present specification, a refractive index is intended to be a refractive index at a wavelength of 550 nm, which is measured at 25° C. based on a measurement device conforming to an ellipsometry method, unless otherwise specified.

Transfer Film According to First Embodiment

The transfer film according to a first embodiment includes, in the following order, a temporary support, a photosensitive precursor layer of a light absorbing layer, and a photosensitive precursor layer of a light reflecting layer, in which a thickness of the precursor layer of the light reflecting layer is 3 μm or more.

In a display element including an LED chip, in a case where a partition wall layer between LEDs of an array substrate on which a plurality of LED chips are mounted is formed from the transfer film according to the first embodiment, the display element including the LED chip has excellent black density in a case of black display and also has excellent brightness in a case of white display. Hereinafter, an estimated action mechanism of the transfer film according to the first embodiment will be described with reference to FIG. 1.

FIG. 1 is a partial schematic cross-sectional view of a display element including an LED chip.

A display element 30 shown in FIG. 1 includes an LED chip 12 disposed on an array substrate 10, and a partition wall layer 14 formed around the LED chip 12. The LED chip 12 is disposed on the array substrate 10 through a conductive layer 16. The partition wall layer 14 is a layer formed into a pattern by exposure and development treatment from the transfer film according to the first embodiment, and includes, in order from the array substrate 10 side, a light reflecting layer 18 (a layer derived from the precursor layer of the light reflecting layer in the transfer film according to the first embodiment) having a thickness of 3 μm or more and a light absorbing layer 20 (a layer derived from the precursor layer of the light absorbing layer in the transfer film according to the first embodiment). In a case where the display element 30 is in white display (LED is in a light-on state), light emitted from the LED in the LED chip 12 is reflected by the light reflecting layer 18 in the partition wall layer 14, and light reflection efficiency (light extraction efficiency) is improved, and as a result, the brightness is increased. On the other hand, in a case where the display element 30 is in black display (LED is in a light-off state), reflection of external light is suppressed by the light absorbing layer 20 in the partition wall layer 14, and the black density is excellent. Furthermore, in a case where the display element 30 is in white display, the light absorbing layer 20 also has a function of absorbing stray light which is erroneously incident into the light reflecting layer 18.

As described above, the case where the display element is in white display is intended to mean that the LED is in the light-on state, and the case where the display element is in black display state is intended to mean that the LED is in the light-off state. That is, the case where the display element is in white display or black display does not intend to indicate light emission color of the LED.

In addition, the LED may be, for example, an LED having a peak wavelength in a visible light region (hereinafter, also referred to as "visible light LED"), or an LED having a peak wavelength in an ultraviolet region (hereinafter, also referred to as "UV-LED").

Hereinafter, the fact that, in a case where the transfer film according to the first embodiment is applied to formation of a pattern in a display element including an LED chip, the display element to be produced is more excellent in black density in a case of black display and is more excellent in brightness in a case of white display, and/or the fact that the display element to be produced has more excellent contrast in a bright room (a ratio of brightness (white brightness) in the case of white display to brightness (black brightness) in the case of black display in a bright room environment) is also referred to as "effects of the present invention are more excellent".

Hereinafter, the configuration of the transfer film according to the first embodiment will be described in more detail with reference to the accompanying drawings.

Figure 2:
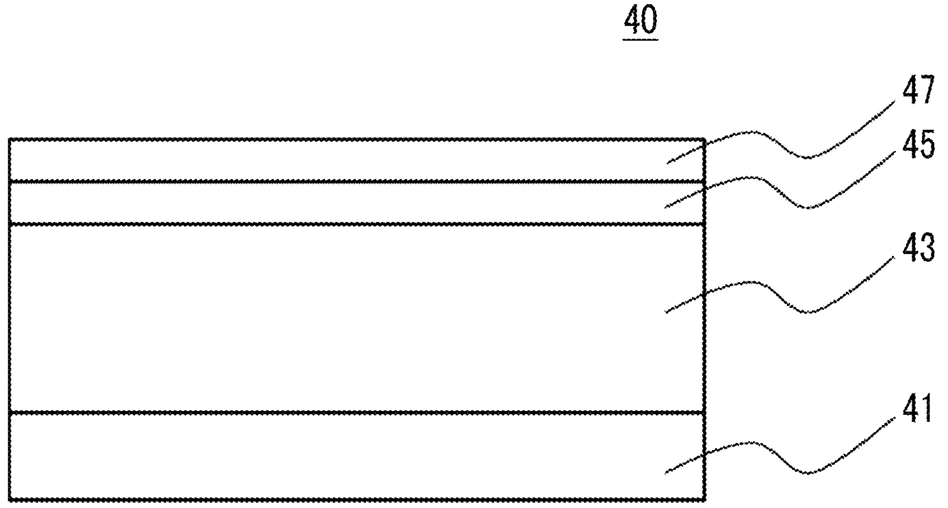
FIG. 2 is a schematic cross-sectional view showing an example of the transfer film according to the first embodiment.
Figure 3:
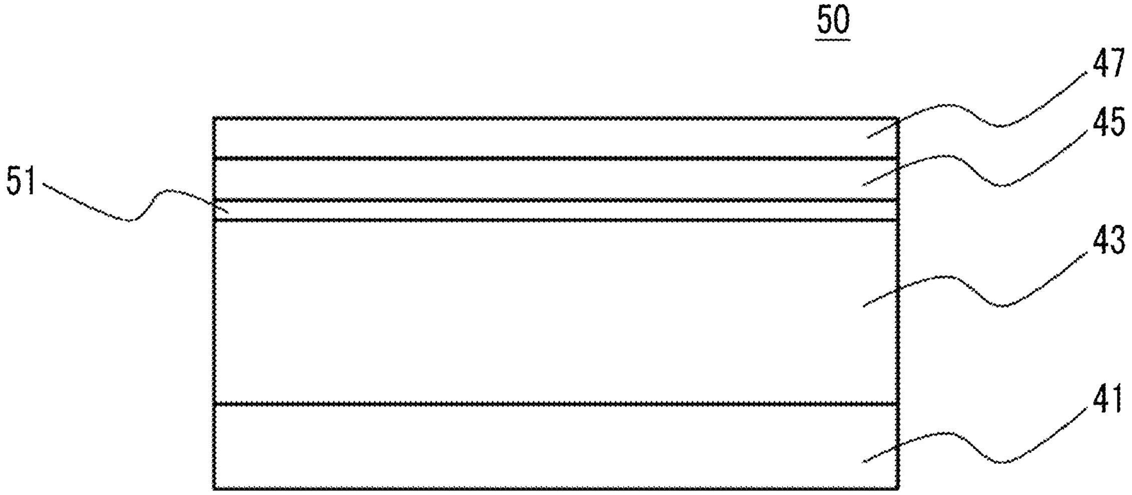
FIG. 3 is a schematic cross-sectional view showing another example of the transfer film according to the first embodiment.

FIGS. 2 and 3 are schematic cross-sectional views showing examples of the transfer film according to the first embodiment.

A transfer film 40 shown in FIG. 2 includes a temporary support 41, a precursor layer 43 of a light absorbing layer, a precursor layer 45 of a light reflecting layer, having a thickness of 3 μm or more, and a protective film 47 in this order.

In addition, a transfer film 50 shown in FIG. 3 includes a temporary support 41, a precursor layer 43 of a light absorbing layer, an interlayer 51, a precursor layer 45 of a light reflecting layer, having a thickness of 3 μm or more, and a protective film 47 in this order.

The precursor layer 43 of the light absorbing layer and the precursor layer 45 of the light reflecting layer are layers exhibiting photosensitivity, and may be either a positive tone photosensitive layer or a negative tone photosensitive layer, but are preferably a negative tone photosensitive layer.

The transfer film 40 shown in FIG. 2 and the transfer film 50 shown in FIG. 3 are in a form in which the protective film 47 is disposed, but the protective film 47 may not be disposed.

Hereinafter, each element constituting the transfer film according to the first embodiment will be described.

<<Temporary Support>>

The transfer film according to the first embodiment includes a temporary support.

The temporary support is a member which supports the precursor layer of the light reflecting layer and the precursor layer of the light absorbing layer, and is finally removed by a peeling treatment.

The temporary support may be a monolayer structure or a multilayer structure.

The temporary support is preferably a film and more preferably a resin film. As the temporary support, a film which has flexibility and does not generate significant deformation, contraction, or stretching under pressure or under pressure and heating is preferable.

Examples of the above-described film include a polyethylene terephthalate film (for example, a biaxial stretching polyethylene terephthalate film), a polymethylmethacrylate film, a cellulose triacetate film, a polystyrene film, a polyimide film, and a polycarbonate film. Among these, as the temporary support, a polyethylene terephthalate film is preferable.

In addition, it is preferable that the film used as the temporary support does not have deformation such as wrinkles or scratches.

From the viewpoint that exposure in a patterned manner through the temporary support can be performed, the temporary support preferably has high transparency, and the transmittance at 365 nm, 405 nm, and 436 nm is preferably 60% or more, more preferably 70% or more, still more preferably 80% or more, and particularly preferably 90% or more. Examples of a preferred value of the transmittance include 87%, 92%, and 98%.

From the viewpoint of pattern formability during pattern exposure through the temporary support and transparency of the temporary support, it is preferable that a haze of the temporary support is small. Specifically, a haze value of the temporary support is preferably 2% or less, more preferably 0.5% or less, and still more preferably 0.1% or less.

From the viewpoint of pattern formability during pattern exposure through the temporary support and transparency of the temporary support, it is preferable that the number of fine particles, foreign substances, and defects included in the temporary support is small. The number of fine particles having a diameter of 1 μm or more, foreign substances, and defects in the temporary support is preferably 50 pieces/10 $mm^2$ or less, more preferably 10 pieces/10 $mm^2$ or less, still more preferably 3 pieces/10 $mm^2$ or less, and particularly preferably 0 piece/10 $mm^2$.

A thickness of the temporary support is not particularly limited, but is preferably 5 to 200 μm. In addition, from the viewpoint of case of handling and general-purpose properties, the thickness of the temporary support is more preferably 5 to 150 μm, still more preferably 5 to 50 μm, and most preferably 5 to 25 μm. The thickness of the temporary support can be calculated as an average value of any five points measured by a cross-sectional observation with a scanning electron microscope (SEM).

In addition, in order to improve adhesiveness between the temporary support and the composition layer formed on the temporary support, a surface of the temporary support on a side in contact with the composition layer may be reformed by ultraviolet (UV) irradiation, corona discharge, plasma, or the like.

In a case where the surface reforming of the temporary support is performed by UV irradiation, an exposure amount is preferably 10 to 2,000 $mJ/cm^2$ and more preferably 50 to 1,000 $mJ/cm^2$. Examples of a light source include a low pressure mercury lamp, a high pressure mercury lamp, an ultra-high pressure mercury lamp, a carbon arc lamp, a metal halide lamp, a xenon lamp, a chemical lamp, an electrodeless discharge lamp, and a light emitting diode (LED), all of which emit a light in a wavelength range of 150 to 450 nm. As long as the amount of light irradiated is within the range, the lamp output or the illuminance is not particularly limited.

Examples of the temporary support include a biaxial stretching polyethylene terephthalate film having a thickness of 16 μm, a biaxial stretching polyethylene terephthalate film having a thickness of 12 μm, and a biaxial stretching polyethylene terephthalate film having a thickness of 9 μm.

The temporary support may be a recycled product. Examples of the recycled product include films obtained washing used films and the like into chips and using the chips as a material. Specific examples of the recycled product include Ecouse series of Toray Industries, Inc.

A preferred aspect of the temporary support is described in, for example, paragraphs [0017] and [0018] of JP2014-085643A, paragraphs [0019] to [0026] of JP2016-027363A, paragraphs [0041] to [0057] of WO2012/081680A, and paragraphs [0029] to [0040] of WO2018/179370A, the contents of which are incorporated herein by reference.

From the viewpoint of imparting handleability, a layer (lubricant layer) including fine particles may be provided on the surface of the temporary support. The lubricant layer may be provided on one surface of the temporary support, or on both surfaces thereof. A diameter of the particles included in the lubricant layer is preferably 0.05 to 0.8 μm.

In addition, a thickness of the lubricant layer is preferably 0.05 to 1.0 μm. Examples of a commercially available product of the temporary support include LUMIRROR 16KS40, LUMIRROR 16FB40, LUMIRROR #38-U48, LUMIRROR #75-U34, and LUMIRROR #25-T60 (all of which are manufactured by Toray Industries, Inc.); and COSMOSHINE A4100, COSMOSHINE A4300, COSMOSHINE A4160, COSMOSHINE A4360, and COSMOSHINE A8300 (all of which are manufactured by TOYOBO Co., Ltd.).

<<Precursor Layer of Light Reflecting Layer>>

<Characteristics of Light Reflecting Layer>

The light reflecting layer formed from the precursor layer of the light reflecting layer is preferably a layer satisfying at least one of the following characteristic 1, characteristic 2, or characteristic A. In particular, in a case where the LED in the light emitting element is a visible light LED, the light reflecting layer is preferably a layer which satisfies at least one of the characteristic 1 or the characteristic 2, and in a case where the LED in the light emitting element is an UV-LED, the light reflecting layer is preferably a layer which satisfies the characteristic A.

(Characteristic 1)

With regard to the total reflection of the light reflecting layer (incidence angle: 8°, light source: D-65 (visual field: 2°)), L* value in a CIE1976 (L*, a*, b*) color space is preferably 80 or more.

The L* value in the CIE 1976 (L*, a*, b*) color space is a value measured using a spectrophotometer with respect to a light reflecting layer having a thickness of 30 μm at 25° C. As the spectrophotometer, for example, a spectrophotometer V-570 manufactured by JASCO Corporation can be used.

The above-described L* value is more preferably 90 or more. The upper limit value thereof is 100 or less.

(Characteristic 2)

An integral reflectance of the light reflecting layer with respect to visible light having a wavelength of 400 to 700 nm is preferably 60% or more. The integral reflectance with respect to visible light having a wavelength of 400 to 700 nm is a value measured using a spectrophotometer with respect to a light reflecting layer having a thickness of 30 μm at 25° C. As the spectrophotometer, for example, a spectrophotometer V-570 manufactured by JASCO Corporation can be used.

The above-described integral reflectance with respect to visible light having a wavelength of 400 to 700 nm is preferably 80% or more. The upper limit value thereof is 100% or less.

(Characteristic A)

A reflectivity of the light reflecting layer at a wavelength of 385 nm is preferably 60% or more, and more preferably 80% or more. The upper limit value thereof is 100% or less. The reflectivity at a wavelength of 385 nm is a value measured using a spectrophotometer with respect to a light reflecting layer having a thickness of 30 μm at 25° C. As the spectrophotometer, for example, a spectrophotometer V-570 manufactured by JASCO Corporation can be used.

<Thickness of Precursor Layer of Light Reflecting Layer>

The thickness of the precursor layer of the light reflecting layer is 3 μm or more, and is preferably 5 μm or more, more preferably 10 μm or more, and still more preferably 16 μm or more. The upper limit value thereof is not particularly limited, but is, for example, preferably 100 μm or less and more preferably 50 μm or less.

<Components of Precursor Layer of Light Reflecting Layer>

The precursor layer of the light reflecting layer may be either a positive tone photosensitive layer or a negative tone photosensitive layer, but is preferably a negative tone photosensitive layer. In a case where the precursor layer of the light reflecting layer is a negative tone photosensitive layer, it is preferable that the precursor layer of the light reflecting layer is configured to contain, for example, at least an alkali-soluble resin, a polymerizable compound, and a photopolymerization initiator. In addition, the precursor layer of the light reflecting layer typically contains a component for exhibiting the above-described characteristic 1 (L* value), the characteristic 2 (integral reflectance), and/or the characteristic A (reflectivity at a wavelength of 385 nm). Examples of such a component include a reflective adjuster described later.

Hereinafter, components which can be contained in the precursor layer of the light reflecting layer will be described in detail.

—Alkali-Soluble Resin—

The precursor layer of the light reflecting layer preferably contains an alkali-soluble resin.

Examples of the alkali-soluble resin include a (meth)acrylic resin, a styrene resin, an epoxy resin, an amide resin, an amido epoxy resin, an alkyd resin, a phenol resin, an ester resin, a urethane resin, an epoxy acrylate resin obtained by a reaction of an epoxy resin and a (meth)acrylic acid, and an acid-modified epoxy acrylate resin obtained by a reaction of an epoxy acrylate resin and acid anhydride.

(Suitable Aspect 1 of Alkali-Soluble Resin)

From the viewpoint of excellent alkali developability and film formability, examples of one suitable aspect of the alkali-soluble resin include a (meth)acrylic resin.

In the present specification, the (meth)acrylic resin means a resin having a constitutional unit derived from a (meth)acrylic compound.

The content of the constitutional unit derived from a (meth)acrylic compound is preferably 50% by mass or more, more preferably 70% by mass or more, and still more preferably 90% by mass or more with respect to all constitutional units of the (meth)acrylic resin. The (meth)acrylic resin may be composed of only the constitutional unit derived from a (meth)acrylic compound, or may have a constitutional unit derived from a polymerizable monomer other than the (meth)acrylic compound. That is, the upper limit of the content of the constitutional unit derived from a (meth)acrylic compound is 100% by mass or less with respect to all constitutional units of the (meth)acrylic resin.

In addition, the content of the constitutional unit derived from a (meth)acrylic compound is preferably 50 mol % or more, more preferably 70 mol % or more, and still more preferably 90 mol % or more with respect to all constitutional units of the (meth)acrylic resin. The (meth)acrylic resin may be composed of only the constitutional unit derived from a (meth)acrylic compound, or may have a constitutional unit derived from a polymerizable monomer other than the (meth)acrylic compound. That is, the upper limit of the content of the constitutional unit derived from a (meth)acrylic compound is 100 mol % or less with respect to all constitutional units of the (meth)acrylic resin.

In the present specification, in a case where the content of a "constitutional unit" is defined by a molar ratio, the "constitutional unit" is synonymous with the "monomer unit". In addition, in the present specification, the "monomer unit" may be modified after polymerization by a polymer reaction or the like. The same applies to the following.

Examples of the (meth)acrylic compound include (meth) acrylic acid, (meth)acrylic acid ester, (meth)acrylamide, and (meth)acrylonitrile.

Examples of the (meth)acrylic acid ester include (meth) acrylic acid alkyl ester, (meth)acrylic acid tetrahydrofurfuryl ester, (meth)acrylic acid dimethylaminoethyl ester, (meth) acrylic acid diethylaminoethyl ester, (meth)acrylic acid glycidyl ester, (meth)acrylic acid benzyl ester, 2,2,2-trifluoroethyl (meth)acrylate, and 2,2,3,3-tetrafluoropropyl (meth) acrylate, and (meth)acrylic acid alkyl ester is preferable.

Examples of the (meth)acrylamide include acrylamides such as diacetone acrylamide.

An alkyl group of the (meth)acrylic acid alkyl ester may be linear or branched. Specific examples thereof include (meth)acrylic acid alkyl esters having an alkyl group having 1 to 12 carbon atoms, such as methyl (meth)acrylate, ethyl (meth)acrylate, propyl (meth)acrylate, butyl (meth)acrylate, pentyl (meth)acrylate, hexyl (meth)acrylate, heptyl (meth) acrylate, octyl (meth)acrylate, 2-ethylhexyl (meth)acrylate, nonyl (meth)acrylate, decyl (meth)acrylate, undecyl (meth) acrylate, and dodecyl (meth)acrylate.

In addition, an alkyl group of the (meth)acrylic acid alkyl ester may be cyclic. The cyclic alkyl group may be monocyclic or polycyclic. Specific examples thereof include cyclohexyl (meth)acrylate.

As the (meth)acrylic acid ester, (meth)acrylic acid alkyl ester having an alkyl group having 1 to 4 carbon atoms is preferable, and methyl (meth)acrylate or ethyl (meth)acrylate is more preferable.

The (meth)acrylic resin may have a constitutional unit other than the constitutional unit derived from a (meth) acrylic compound.

The polymerizable monomer forming the above-described constitutional unit is not particularly limited as long as it is a compound other than the (meth)acrylic compound, which can be copolymerized with the (meth)acrylic compound, and examples thereof include styrene compounds which may have a substituent at an α-position or an aromatic ring, such as styrene, vinyltoluene, and α-methylstyrene, vinyl alcohol esters such as acrylonitrile and vinyl-n-butyl ether, maleic acid monoesters such as maleic acid, maleic acid anhydride, monomethyl maleate, monoethyl maleate, and monoisopropyl maleate, fumaric acid, cinnamic acid, α-cyanocinnamic acid, itaconic acid, and crotonic acid.

These polymerizable monomers may be used alone or in combination of two or more kinds thereof.

In addition, from the viewpoint of improving alkali developability, the (meth)acrylic resin preferably has a constitutional unit having an acid group. Examples of the acid group include a carboxy group, a sulfo group, a phosphoric acid group, and a phosphonic acid group.

Among these, the (meth)acrylic resin more preferably has a constitutional unit having a carboxy group, and still more preferably has a constitutional unit derived from the above-described (meth)acrylic acid.

From the viewpoint of excellent developability, the content of the constitutional unit having an acid group (preferably, the constitutional unit derived from (meth)acrylic acid) in the (meth)acrylic resin is preferably 10% by mass or more with respect to all constitutional units of the (meth)acrylic resin. In addition, the upper limit value thereof is not particularly limited, but from the viewpoint of excellent alkali resistance, is preferably 50% by mass or less and more preferably 40% by mass or less.

From the viewpoint of excellent developability, the content of the constitutional unit having an acid group (preferably, the constitutional unit derived from (meth)acrylic acid) in the (meth)acrylic resin is preferably 10 mol % or more with respect to all constitutional units of the (meth)acrylic resin. In addition, the upper limit value thereof is not particularly limited, but from the viewpoint of excellent alkali resistance, it is preferably 50 mol % or less and more preferably 40 mol % or less.

In addition, it is more preferable that the (meth)acrylic resin has a constitutional unit derived from the above-described (meth)acrylic acid alkyl ester.

The content of the constitutional unit derived from (meth) acrylic acid alkyl ester in the (meth)acrylic resin is preferably 50% to 90% by mass, more preferably 60% to 90% by mass, and still more preferably 65% to 90% by mass with respect to all constitutional units of the (meth)acrylic resin.

In addition, the content of the constitutional unit derived from (meth)acrylic acid alkyl ester in the (meth)acrylic resin is preferably 50 to 90 mol %, more preferably 60 to 90 mol %, and still more preferably 65 to 90 mol % with respect to all constitutional units of the (meth)acrylic resin.

As the (meth)acrylic resin, a resin having both the constitutional unit derived from (meth)acrylic acid and the constitutional unit derived from (meth)acrylic acid alkyl ester is preferable, and a resin composed only of the constitutional unit derived from (meth)acrylic acid and the constitutional unit derived from (meth)acrylic acid alkyl ester is more preferable.

In addition, as the (meth)acrylic resin, an acrylic resin which has a constitutional unit derived from methacrylic acid, a constitutional unit derived from methyl methacrylate, and a constitutional unit derived from ethyl acrylate is also preferable.

In addition, the (meth)acrylic resin preferably has at least one selected from the group consisting of a constitutional unit derived from methacrylic acid and a constitutional unit derived from methacrylic acid alkyl ester, and more preferably has both the constitutional unit derived from methacrylic acid and the constitutional unit derived from methacrylic acid alkyl ester.

The total content of the constitutional unit derived from methacrylic acid and the constitutional unit derived from methacrylic acid alkyl ester in the (meth)acrylic resin is preferably 40% by mass or more and more preferably 60% by mass or more with respect to all constitutional units of the (meth)acrylic resin. The upper limit is not particularly limited, and may be 100% by mass or less, preferably 80% by mass or less.

The total content of the constitutional unit derived from methacrylic acid and the constitutional unit derived from methacrylic acid alkyl ester in the (meth)acrylic resin is preferably 40 mol % or more and more preferably 60 mol % or more with respect to all constitutional units of the (meth)acrylic resin. The upper limit thereof is not particularly limited, and may be 100 mol % or less, preferably 80 mol % or less.

In addition, it is also preferable that the (meth)acrylic resin has at least one selected from the group consisting of a constitutional unit derived from methacrylic acid and a constitutional unit derived from methacrylic acid alkyl ester, and has at least one selected from the group consisting of a constitutional unit derived from acrylic acid and a constitutional unit derived from acrylic acid alkyl ester.

The total content of the constitutional unit derived from methacrylic acid and the constitutional unit derived from methacrylic acid alkyl ester is preferably 60/40 to 80/20 in terms of mass ratio with respect to the total content of the constitutional unit derived from acrylic acid and the constitutional unit derived from acrylic acid alkyl ester.

From the viewpoint of excellent developability of the precursor layer of the light reflecting layer after transfer, the (meth)acrylic resin preferably has an ester group at the terminal.

The terminal portion of the (meth)acrylic resin is composed of a site derived from a polymerization initiator used in the synthesis. The (meth)acrylic resin having an ester group at the terminal can be synthesized by using a polymerization initiator which generates a radical having an ester group.

(Suitable Aspect 2 of Alkali-Soluble Resin)

In addition, examples of another suitable aspect of the alkali-soluble resin include an alkali-soluble resin having an acid value of 60 mgKOH/g or more, from the viewpoint of more excellent developability. Among these alkali-soluble resins, from the viewpoint that it is easy to form a strong film by thermally crosslinking with a crosslinking component by heating, the alkali-soluble resin is more preferably a resin having an acid value of 60 mgKOH/g or more and having a carboxy group (hereinafter, also referred to as "carboxy group-containing resin"), and still more preferably a (meth) acrylic resin having an acid value of 60 mgKOH/g or more and having a carboxy group (hereinafter, also referred to as "carboxy group-containing (meth)acrylic resin"). In a case where the alkali-soluble resin is a resin having a carboxy group, for example, the three-dimensional crosslinking density can be increased by adding a thermal crosslinking compound such as a blocked isocyanate compound and thermally crosslinking. In addition, at this time, in a case where the carboxy group of the resin having a carboxy group is anhydrous and hydrophobized, wet heat resistance can be improved.

The carboxy group-containing (meth)acrylic resin having an acid value of 60 mgKOH/g or more is not particularly limited as long as the above-described conditions of acid value are satisfied, and a known (meth)acrylic resin can be appropriately selected. For example, a carboxy group-containing acrylic resin having an acid value of 60 mgKOH/g or more among polymers described in paragraph [0025] of JP2011-095716A, a carboxy group-containing acrylic resin having an acid value of 60 mgKOH/g or more among polymers described in paragraphs [0033] to [0052] of JP2010-237589A, and the like can be preferably used.

(Suitable Aspect 3 of Alkali-Soluble Resin)

In addition, examples of another suitable aspect of the alkali-soluble resin include an alkali-soluble resin having an aromatic ring structure, from the viewpoint of more excellent developability. Among these, as the alkali-soluble resin having an aromatic ring structure, an alkali-soluble resin having a constitutional unit having an aromatic ring structure is more preferable.

Examples of a monomer forming the constitutional unit having an aromatic ring structure include a monomer having an aralkyl group, styrene, and a polymerizable styrene derivative (for example, methylstyrene, vinyltoluene, tert-butoxystyrene, acetoxystyrene, 4-vinylbenzoic acid, styrene dimer, and styrene trimer). Among these, a monomer having an aralkyl group or styrene is preferable.

Examples of the aralkyl group include a substituted or unsubstituted phenylalkyl group (excluding a benzyl group), and a substituted or unsubstituted benzyl group, and a substituted or unsubstituted benzyl group is preferable.

Examples of a monomer having the phenylalkyl group include phenylethyl (meth)acrylate.

Examples of a monomer having the benzyl group include (meth)acrylates having a benzyl group, such as benzyl (meth)acrylate and chlorobenzyl (meth)acrylate; and vinyl monomers having a benzyl group, such as vinylbenzyl chloride and vinylbenzyl alcohol. Among these, benzyl (meth)acrylate is preferable.

In addition, the alkali-soluble resin more preferably has a constitutional unit represented by Formula (S) (constitutional unit derived from styrene).

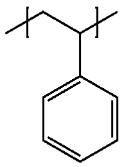

(S)

In a case where the alkali-soluble resin has the constitutional unit having an aromatic ring structure, a content of the constitutional unit having an aromatic ring structure is preferably 5% to 90% by mass, more preferably 10% to 80% by mass, still more preferably 10% to 70% by mass, and particularly preferably 20% to 60% by mass with respect to all constitutional units of the alkali-soluble resin.

In addition, the content of the constitutional unit having an aromatic ring structure in the alkali-soluble resin is preferably 5 to 70 mol %, more preferably 10 to 60 mol %, and still more preferably 20 to 60 mol % with respect to all constitutional units of the alkali-soluble resin.

Furthermore, a content of the above-described constitutional unit represented by Formula (S) in the alkali-soluble resin is preferably 5 to 70 mol %, more preferably 10 to 60 mol %, still more preferably 20 to 60 mol %, and particularly preferably 20 to 50 mol % with respect to all constitutional units of the alkali-soluble resin.

The alkali-soluble resin preferably has an aliphatic hydrocarbon ring structure. That is, the alkali-soluble resin preferably has a constitutional unit having an aliphatic hydrocarbon ring structure. The aliphatic hydrocarbon ring structure may be monocyclic or polycyclic. Among these, the alkali-soluble resin more preferably has a ring structure in which two or more aliphatic hydrocarbon rings are fused.

Examples of a ring constituting the aliphatic hydrocarbon ring structure in the constitutional unit having an aliphatic hydrocarbon ring structure include a tricyclodecane ring, a cyclohexane ring, a cyclopentane ring, a norbornane ring, and an isophorone ring.

Among these, a ring in which two or more aliphatic hydrocarbon rings are fused is preferable, and a tetrahydrodicyclopentadiene ring (tricyclo[5.2.1.0$^{2,6}$]decane ring) is more preferable.

Examples of a monomer forming the constitutional unit having an aliphatic hydrocarbon ring structure include dicyclopentanyl (meth)acrylate, cyclohexyl (meth)acrylate, and isobornyl (meth)acrylate.

In addition, the alkali-soluble resin more preferably has a constitutional unit represented by Formula (Cy), and more preferably has the above-described constitutional unit represented by Formula (S) and the constitutional unit represented by Formula (Cy).

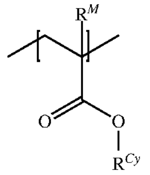

(Cy)

In Formula (Cy), $R^M$ represents a hydrogen atom or a methyl group, and $R^{Cy}$ represents a monovalent group having an aliphatic hydrocarbon ring structure.

$R^M$ in Formula (Cy) is preferably a methyl group.

$R^{Cy}$ in Formula (Cy) is preferably a monovalent group having an aliphatic hydrocarbon ring structure having 5 to 20 carbon atoms, more preferably a monovalent group having an aliphatic hydrocarbon ring structure having 6 to 16 carbon atoms, and still more preferably a monovalent group having an aliphatic hydrocarbon ring structure having 8 to 14 carbon atoms.

In addition, the aliphatic hydrocarbon ring structure in $R^{Cy}$ of Formula (Cy) is preferably a cyclopentane ring structure, a cyclohexane ring structure, a tetrahydrodicyclopentadiene ring structure, a norbornane ring structure, or an isophorone ring structure, more preferably a cyclohexane ring structure or a tetrahydrodicyclopentadiene ring structure, and still more preferably a tetrahydrodicyclopentadiene ring structure.

Furthermore, the aliphatic hydrocarbon ring structure in $R^{Cy}$ of Formula (Cy) is preferably a ring structure in which two or more aliphatic hydrocarbon rings are fused, and more preferably a ring in which two to four aliphatic hydrocarbon rings are fused.

Furthermore, $R^{Cy}$ in Formula (Cy) is preferably a group in which the oxygen atom in —C(═O)O— of Formula (Cy) and the aliphatic hydrocarbon ring structure are directly bonded, that is, an aliphatic hydrocarbon ring group, more preferably a cyclohexyl group or a dicyclopentanyl group, and still more preferably a dicyclopentanyl group.

The alkali-soluble resin may include one constitutional unit having an aliphatic hydrocarbon ring structure alone, or two or more kinds thereof.

In a case where the alkali-soluble resin has the constitutional unit having an aliphatic hydrocarbon ring structure, a content of the constitutional unit having an aliphatic hydrocarbon ring structure is preferably 5% to 90% by mass, more preferably 10% to 80% by mass, and still more preferably 20% to 70% by mass with respect to the all constitutional units of the alkali-soluble resin.

In addition, the content of the constitutional unit having an aliphatic hydrocarbon ring structure in the alkali-soluble resin is preferably 5 to 70 mol %, more preferably 10 to 60 mol %, and still more preferably 20 to 50 mol % with respect to all constitutional units of the alkali-soluble resin.

Furthermore, a content of the above-described constitutional unit represented by Formula (Cy) in the alkali-soluble resin is preferably 5 to 70 mol %, more preferably 10 to 60 mol %, and still more preferably 20 to 50 mol % with respect to all constitutional units of the alkali-soluble resin.

In a case where the alkali-soluble resin includes the constitutional unit having an aromatic ring structure and the constitutional unit having an aliphatic hydrocarbon ring structure, the total content of the constitutional unit having an aromatic ring structure and the constitutional unit having an aliphatic hydrocarbon ring structure is preferably 10% to 90% by mass, more preferably 20% to 80% by mass, and still more preferably 40% to 75% by mass with respect to all constitutional units of the alkali-soluble resin.

In addition, the total content of the constitutional unit having an aromatic ring structure and the constitutional unit having an aliphatic hydrocarbon ring structure in the alkali-soluble resin is preferably 10 to 80 mol %, more preferably 20 to 70 mol %, and still more preferably 40 to 60 mol % with respect to all constitutional units of the alkali-soluble resin.

Furthermore, the total content of the above-described constitutional unit represented by Formula (S) and the above-described constitutional unit represented by Formula (Cy) in the alkali-soluble resin is preferably 10 to 80 mol %, more preferably 20 to 70 mol %, and still more preferably 40 to 60 mol % with respect to all constitutional units of the alkali-soluble resin.

In addition, from the viewpoint that the effects of the present disclosure are more excellent, a molar amount nS of the constitutional unit represented by Formula (S) and a molar amount nCy of the constitutional unit represented by Formula (Cy) in the alkali-soluble resin preferably satisfy the relationship shown in the following expression (SCy), more preferably satisfy the following expression (SCy-1), and still more preferably satisfy the following expression (SCy-2).

$$0.2 \le nS/(nS+nCy) \le 0.8 \qquad \text{Expression (SCy)}$$

$$0.30 \le nS/(nS+nCy) \le 0.75 \qquad \text{Expression (SCy-1)}$$

$$0.40 \le nS/(nS+nCy) \le 0.70 \qquad \text{Expression (SCy-2)}$$

The alkali-soluble resin also preferably includes a constitutional unit having an acid group.

Examples of the above-described acid group include a carboxy group, a sulfo group, a phosphonic acid group, and a phosphoric acid group, and a carboxy group is preferable.

As the above-described constitutional unit having an acid group, constitutional units derived from (meth)acrylic acid, which are shown below, is preferable, and a constitutional unit derived from methacrylic acid is more preferable.

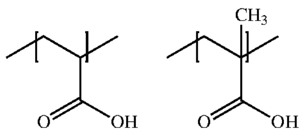

The alkali-soluble resin may include one constitutional unit having an acid group alone, or two or more kinds thereof.

In a case where the alkali-soluble resin includes the constitutional unit having an acid group, a content of the constitutional unit having an acid group is preferably 5% to 50% by mass, more preferably 5% to 40% by mass, still more preferably 10% to 40% by mass, and particularly preferably 10% to 30% by mass with respect to all constitutional units of the alkali-soluble resin.

In addition, the content of the constitutional unit having an acid group in the alkali-soluble resin is preferably 5 to 70 mol % and more preferably 10 to 50 mol %, and still more preferably 20 to 40 mol % with respect to all constitutional units of the alkali-soluble resin.

The alkali-soluble resin preferably has a reactive group, and more preferably includes a constitutional unit having a reactive group.

As the reactive group, a radically polymerizable group is preferable, and an ethylenically unsaturated group is more preferable. In addition, in a case where the alkali-soluble resin has an ethylenically unsaturated group, the alkali-soluble resin preferably has a constitutional unit having an ethylenically unsaturated group in a side chain.

In the present specification, the "main chain" represents a relatively longest binding chain in a molecule of a polymer compound constituting a resin, and the "side chain" represents an atomic group branched from the main chain.

As the ethylenically unsaturated group, an allyl group or a (meth)acryloyloxy group is more preferable.

Examples of the constitutional unit having a reactive group include those shown below, but the constitutional unit having a reactive group is not limited thereto.

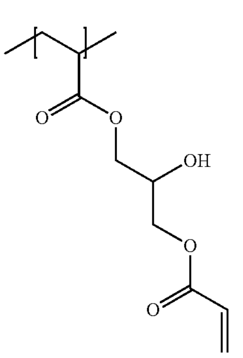

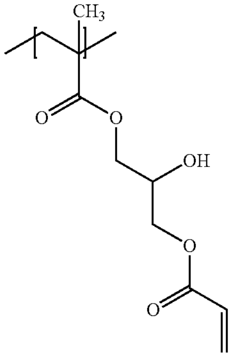

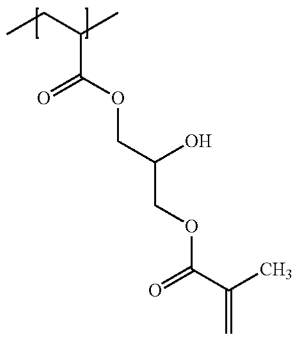

-continued

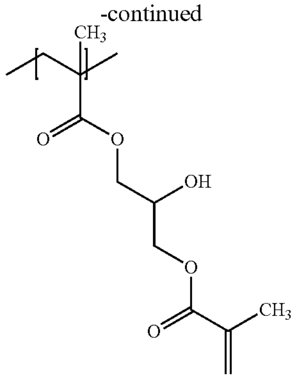

The alkali-soluble resin may include one constitutional unit having a reactive group alone, or two or more kinds thereof.

In a case where the alkali-soluble resin includes the constitutional unit having a reactive group, a content of the constitutional unit having a reactive group is preferably 5% to 70% by mass, more preferably 10% to 50% by mass, and still more preferably 20% to 40% by mass with respect to all constitutional units of the alkali-soluble resin.

In addition, the content of the constitutional unit having a reactive group in the alkali-soluble resin is preferably 5 to 70 mol %, more preferably 10 to 60 mol %, and still more preferably 20 to 50 mol % with respect to all constitutional units of the alkali-soluble resin.

Examples of a method for introducing the reactive group into the alkali-soluble resin include a method of reacting a compound such as an epoxy compound, a blocked isocyanate compound, an isocyanate compound, a vinyl sulfone compound, an aldehyde compound, a methylol compound, and a carboxylic acid anhydride with a functional group such as a hydroxy group, a carboxy group, a primary amino group, a secondary amino group, an acetoacetyl group, and a sulfo group.

Preferred examples of the method for introducing the reactive group into the alkali-soluble resin include a method in which a polymer having a carboxy group is synthesized by a polymerization reaction, and then a glycidyl (meth) acrylate is reacted with a part of the carboxy group of the obtained polymer by a polymer reaction, thereby introducing a (meth)acryloxy group into the polymer. By this method, an alkali-soluble resin having a (meth)acryloyloxy group in the side chain can be obtained.

The above-described polymerization reaction is preferably carried out under a temperature condition of 70° C. to 100° C., and more preferably carried out under a temperature condition of 80° C. to 90° C. As a polymerization initiator used in the above-described polymerization reaction, an azo-based initiator is preferable, and for example, V-601 (product name) or V-65 (product name) manufactured by FUJIFILM Wako Pure Chemical Corporation is more preferable. The above-described polymer reaction is preferably carried out under a temperature condition of 80° C. to 110° C. In the above-described polymer reaction, it is preferable to use a catalyst such as an ammonium salt.

In addition, the alkali-soluble resin also preferably includes a constitutional unit derived from (meth)acrylic acid alkyl ester.

Examples of the above-described constitutional unit derived from (meth)acrylic acid alkyl ester include those described above, and among these, methyl (meth)acrylate is preferable.

The alkali-soluble resin may include one constitutional unit derived from (meth)acrylic acid alkyl ester alone, or two or more kinds thereof.

In a case where the alkali-soluble resin include the constitutional unit derived from (meth)acrylic acid alkyl ester, a content of the constitutional unit derived from (meth)acrylic acid alkyl ester is preferably 1% to 10% by mass and more preferably 1% to 5% by mass with respect to all constitutional units of the alkali-soluble resin.

In addition, the content of the constitutional unit derived from (meth)acrylic acid alkyl ester in the alkali-soluble resin is preferably 1 to 10 mol % and more preferably 1 to 5 mol % with respect to all constitutional units of the alkali-soluble resin.

Specific Examples of Alkali-Soluble Resins of Suitable Aspects 1 to 3

As the alkali-soluble resin, polymers X1 to X4 shown below are preferable. Content ratios (a to d) and weight-average molecular weights Mw of each of the constitutional units shown below can be appropriately changed according to the purpose, but from the viewpoint that the effects of the present invention are more excellent, the following configurations are preferable.

(Polymer X1) a: 20% to 60% by mass, b: 10% to 50% by mass, c: 5.0% to 25% by mass, and d: 10% to 50% by mass (Polymer X2) a: 20% to 60% by mass, b: 10% to 50% by mass, c: 5.0% to 25% by mass, and d: 10% to 50% by mass (Polymer X3) a: 30% to 65% by mass, b: 1.0% to 20% by mass, c: 5.0% to 30% by mass, and d: 10% to 50% by mass (Polymer X4) a: 1.0% to 20% by mass, b: 20% to 60% by mass, c: 5.0% to 230% by mass, and d: 10% to 50% by mass

X1

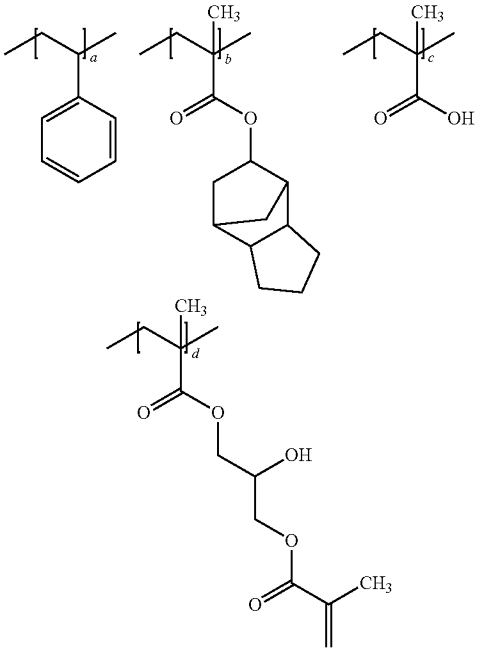

-continued

X2

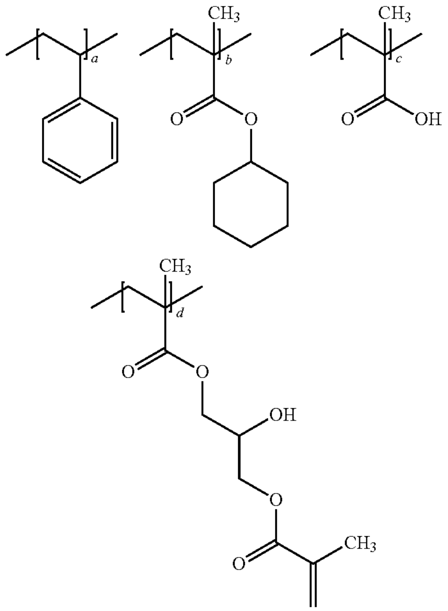

X3

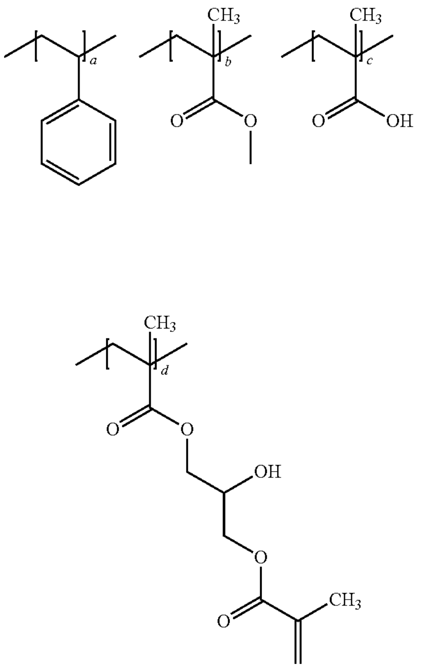

X4

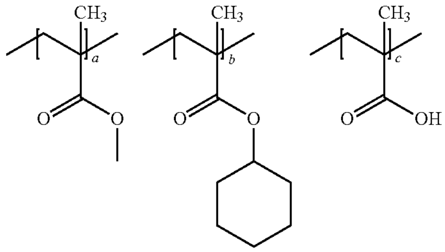

-continued

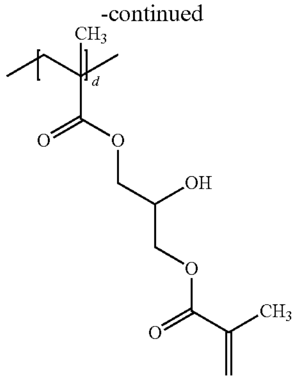

(Suitable Aspect 4 of Alkali-Soluble Resin)

As the alkali-soluble resin, a polymer having a constitutional unit having a carboxylic acid anhydride structure (hereinafter, also referred to as "polymer X") is preferably used.

The carboxylic acid anhydride structure may be either a chain carboxylic acid anhydride structure or a cyclic carboxylic acid anhydride structure, and a cyclic carboxylic acid anhydride structure is preferable.

The ring of the cyclic carboxylic acid anhydride structure is preferably a 5- to 7-membered ring, more preferably a 5-membered ring or a 6-membered ring, and still more preferably a 5-membered ring.

The constitutional unit having a carboxylic acid anhydride structure is preferably a constitutional unit containing a divalent group obtained by removing two hydrogen atoms from a compound represented by Formula P-1 in a main chain, or a constitutional unit in which a monovalent group obtained by removing one hydrogen atom from a compound represented by Formula P-1 is bonded to the main chain directly or through a divalent linking group.

P-1

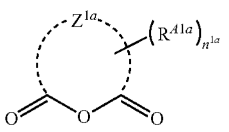

In Formula P-1, $R^{A1a}$ represents a substituent, $n^{1a}$ pieces of $R^{A1a}$'s may be the same or different, $Z^{1a}$ represents a divalent group forming a ring including —C(═O)—O—C(═O)—, and $n^{1a}$ represents an integer of 0 or more.

Examples of the substituent represented by $R^{A1a}$ include an alkyl group.

$Z^{1a}$ is preferably an alkylene group having 2 to 4 carbon atoms, more preferably an alkylene group having 2 or 3 carbon atoms, and still more preferably an alkylene group having 2 carbon atoms.

$n^{1a}$ represents an integer of 0 or more. In a case where $Z^{1a}$ represents an alkylene group having 2 to 4 carbon atoms, $n^{1a}$ is preferably an integer of 0 to 4, more preferably an integer of 0 to 2, and still more preferably 0.

In a case where $n^{1a}$ represents an integer of 2 or more, a plurality of $R^{A1a}$'s existing may be the same or different. In addition, the plurality of $R^{A1a}$'s existing may be bonded to each other to form a ring, but it is preferable that they are not bonded to each other to form a ring.

As the constitutional unit having a carboxylic acid anhydride structure, a constitutional unit derived from an unsaturated carboxylic acid anhydride is preferable, a constitutional unit derived from an unsaturated cyclic carboxylic acid anhydride is more preferable, a constitutional unit derived from an unsaturated aliphatic carboxylic acid anhydride is still more preferable, a constitutional unit derived from maleic acid anhydride or itaconic anhydride is particularly preferable, and a constitutional unit derived from maleic acid anhydride is most preferable.

Hereinafter, specific examples of the constitutional unit having a carboxylic acid anhydride structure will be described, but the constitutional unit having a carboxylic acid anhydride structure is not limited to these specific examples. In the following constitutional units, Rx represents a hydrogen atom, a methyl group, a $CH_2OH$ group, or a $CF_3$ group, and Me represents a methyl group.

Formula a2-1

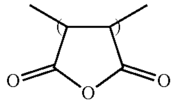

Formula a2-2

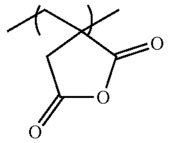

Formula a2-3

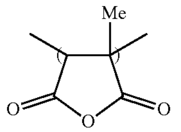

Formula a2-4

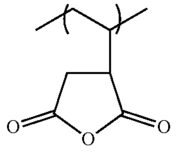

Formula a2-5

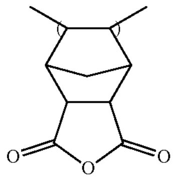

Formula a2-6

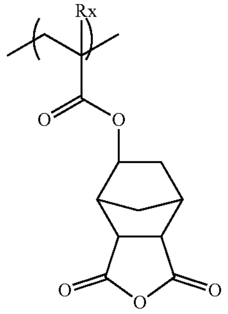

-continued
Formula a2-7
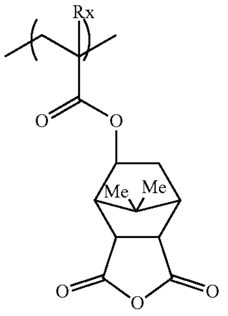
Formula a2-8
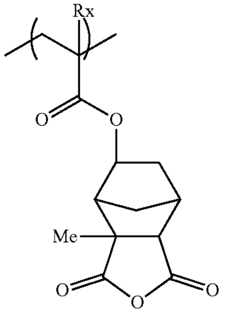
Formula a2-9
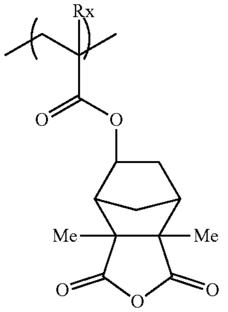
Formula a2-10
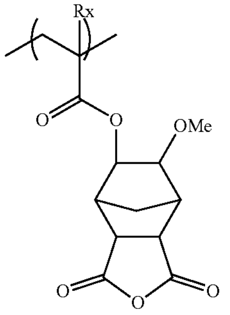
Formula a2-11
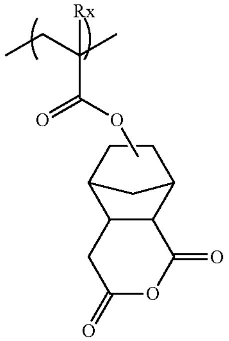
-continued
Formula a2-12
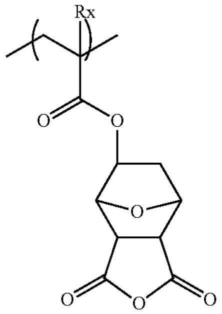
Formula a2-13
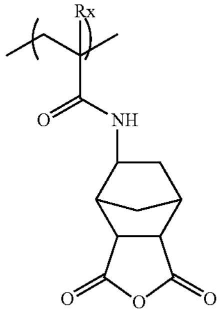
Formula a2-14
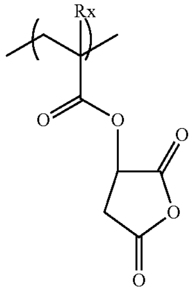
Formula a2-15
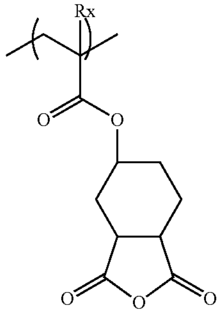
Formula a2-16
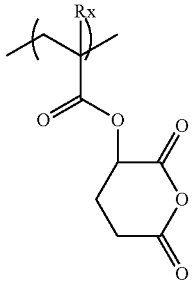

-continued

Formula a2-17

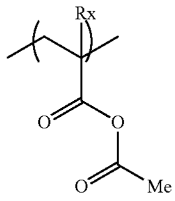

Formula a2-18

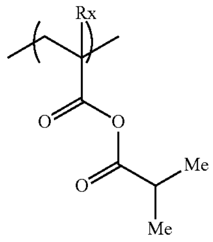

Formula a2-19

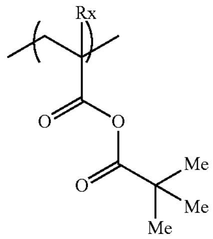

Formula a2-20

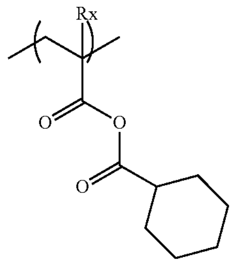

Formula a2-21

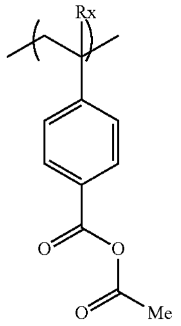

The polymer X may have one constitutional unit having a carboxylic acid anhydride structure alone, or two or more kinds thereof.

The total content of the constitutional unit having a carboxylic acid anhydride structure is preferably 0 to 60 mol %, more preferably 5 to 40 mol %, and still more preferably 10 to 35 mol % with respect to all constitutional units of the polymer X.

It is preferable that the polymer X is used in combination with any of the above-described alkali-soluble resins of the suitable aspects 1 to 3.

In a case where the precursor layer of the light reflecting layer contains the polymer X, a content of the polymer X is preferably 0.1% to 30% by mass, more preferably 0.2% to 20% by mass, still more preferably 0.5% to 20% by mass, and even more preferably 1% to 20% by mass with respect to the total mass of the precursor layer of the light reflecting layer.

The precursor layer of the light reflecting layer may contain only one kind of the polymer X alone, or may contain two or more kinds thereof.

A weight-average molecular weight (Mw) of the alkali-soluble resin is preferably 3,500 or more, more preferably 5,000 or more, still more preferably 10,000 or more, and particularly preferably 20,000 or more. The upper limit value thereof is preferably 50,000 or less and more preferably 30,000 or less.

An acid value of the alkali-soluble resin is preferably 10 to 200 mgKOH/g, more preferably 60 to 200 mgKOH/g, still more preferably 60 to 150 mgKOH/g, and particularly preferably 70 to 125 mgKOH/g. The acid value of the alkali-soluble resin is a value measured according to the method described in JIS K0070: 1992.

From the viewpoint of developability, a dispersity of the alkali-soluble resin is preferably 1.0 to 6.0, more preferably 1.0 to 5.0, still more preferably 1.0 to 4.0, and particularly preferably 1.0 to 3.0.

The precursor layer of the light reflecting layer may contain only one kind of the alkali-soluble resin, or may contain two or more kinds thereof.

A lower limit value of a content of the alkali-soluble resin is preferably 10.0% by mass or more, more preferably 15.0% by mass or more, still more preferably 20.0% by mass or more, and particularly preferably 30.0% by mass or more with respect to the total mass of the precursor layer of the light reflecting layer. In addition, an upper limit value thereof is preferably 90.0% by mass or less, more preferably 80.0% by mass or less, still more preferably 75.0% by mass or less, and particularly preferably 70.0% by mass or less.

—Polymerizable Compound—

The precursor layer of the light reflecting layer preferably contains a polymerizable compound.

The polymerizable compound is a compound having a polymerizable group. Examples of the polymerizable group include a radically polymerizable group and a cationically polymerizable group, and a radically polymerizable group is preferable.

The polymerizable compound preferably includes a radically polymerizable compound having an ethylenically unsaturated group (hereinafter, also simply referred to as an "ethylenically unsaturated compound").

As the ethylenically unsaturated group, a (meth)acryloyloxy group is preferable.

The ethylenically unsaturated compound in the present specification is a compound other than the above-described alkali-soluble resin, and preferably has a molecular weight of less than 5,000.

Examples of one suitable aspect of the polymerizable compound include a compound represented by Formula (M) (simply referred to as a "compound M").

$$Q^2\text{-}R^1\text{-}Q^1 \qquad \text{Formula (M)}$$

In Formula (M), $Q^1$ and $Q^2$ each independently represent a (meth)acryloyloxy group, and $R^1$ represents a divalent linking group having a chain structure.

From the viewpoint of easiness of synthesis, $Q^1$ and $Q^2$ in Formula (M) preferably have the same group.

In addition, from the viewpoint of reactivity, $Q^1$ and $Q^2$ in Formula (M) are preferably acryloyloxy groups.

$R^1$ in Formula (M) is preferably an alkylene group, an alkyleneoxyalkylene group ($-L^1-O-L^1-$), or a polyalkyleneoxyalkylene group ($-(L^1-O)_p-L^1-$), more preferably a hydrocarbon group having 2 to 20 carbon atoms or a polyalkyleneoxyalkylene group, still more preferably an alkylene group having 4 to 20 carbon atoms, and particularly preferably a linear alkylene group having 6 to 18 carbon atoms.

It is sufficient that the above-described hydrocarbon group has a chain structure at least in part, and a portion other than the chain structure is not particularly limited. For example, the portion may be a branched chain, a cyclic or a linear alkylene group having 1 to 5 carbon atoms, an arylene group, an ether bond, or a combination thereof, and an alkylene group or a group in which two or more alkylene groups and one or more arylene groups are combined is preferable, an alkylene group is more preferable, and a linear alkylene group is still more preferable.

The above-described $L^1$'s each independently represent an alkylene group, and an ethylene group, a propylene group, or a butylene group is preferable and an ethylene group or a 1,2-propylene group is more preferable. p represents an integer of 2 or more, and is preferably an integer of 2 to 10.

In addition, the number of atoms in the shortest linking chain which links $Q^1$ and $Q^2$ in the compound M is preferably 3 to 50, more preferably 4 to 40, still more preferably 6 to 20, and particularly preferably 8 to 12.

In the present specification, the "number of atoms in the shortest linking chain which links $Q^1$ and $Q^2$" is the shortest number of atoms linking from an atom in $R^1$ linked to $Q^1$ to an atom in $R^1$ linked to $Q^2$.

Specific examples of the compound M include 1,3-butanediol di(meth)acrylate, tetramethylene glycol di(meth) acrylate, neopentyl glycol di(meth)acrylate, 1,6-hexanediol di(meth)acrylate, 1,7-heptanediol di(meth)acrylate, 1,8-octanediol di(meth)acrylate, 1,9-nonanediol di(meth)acrylate, 1,10-decanediol di(meth)acrylate, hydrogenated bisphenol A di(meth)acrylate, hydrogenated bisphenol F di(meth)acrylate, polyethylene glycol di(meth)acrylate, polypropylene glycol di(meth)acrylate, poly (ethylene glycol/propylene glycol) di(meth)acrylate, and polybutylene glycol di(meth) acrylate. The above-described ester monomers can also be used as a mixture.

Among the above-described compounds, at least one compound selected from the group consisting of 1,6-hexanediol di(meth)acrylate, 1,9-nonanediol di(meth)acrylate, 1,10-decanediol di(meth)acrylate, and neopentyl glycol di(meth)acrylate is preferable, at least one compound selected from the group consisting of 1,6-hexanediol di(meth)acrylate, 1,9-nonanediol di(meth)acrylate, and 1,10-decanediol di(meth)acrylate is more preferable, and at least one compound selected from the group consisting of 1,9-nonanediol di(meth)acrylate and 1,10-decanediol di(meth) acrylate is still more preferable.

In addition, examples of one suitable aspect of the polymerizable compound include a bi- or higher functional ethylenically unsaturated compound.

In the present specification, the "bi- or higher functional ethylenically unsaturated compound" means a compound having two or more ethylenically unsaturated groups in one molecule.

As the ethylenically unsaturated group in the ethylenically unsaturated compound, a (meth)acryloyl group is preferable.

As the ethylenically unsaturated compound, a (meth) acrylate compound is preferable.

The bifunctional ethylenically unsaturated compound can be appropriately selected from a known compound.

Examples of the bifunctional ethylenically unsaturated compound other than the above-described compound M include tricyclodecane dimethanol di(meth)acrylate and 1,4-cyclohexanediol di(meth)acrylate.

Examples of a commercially available product of the bifunctional ethylenically unsaturated compound include tricyclodecane dimethanol diacrylate (product name: NK ESTER A-DCP, manufactured by Shin-Nakamura Chemical Co., Ltd.), tricyclodecane dimethanol dimethacrylate (product name: NK ESTER DCP, manufactured by Shin-Nakamura Chemical Co., Ltd.), 1,9-nonanediol diacrylate (product name: NK ESTER A-NOD-N, manufactured by Shin-Nakamura Chemical Co., Ltd.), and 1,6-hexanediol diacrylate (product name: NK ESTER A-HD-N, manufactured by Shin-Nakamura Chemical Co., Ltd.).

The tri- or higher functional ethylenically unsaturated compound can be appropriately selected from a known compound.

Examples of the tri- or higher functional ethylenically unsaturated compound include dipentaerythritol (tri/tetra/penta/hexa) (meth)acrylate, pentaerythritol (tri/tetra) (meth) acrylate, trimethylolpropane tri(meth)acrylate, ditrimethylolpropane tetra(meth)acrylate, isocyanuric acid (meth) acrylate, and a (meth)acrylate compound of a glycerin tri(meth)acrylate skeleton.

Here, the "(tri/tetra/penta/hexa) (meth)acrylate" has a concept including tri(meth)acrylate, tetra(meth)acrylate, penta(meth)acrylate, and hexa(meth)acrylate, and the "(tri/tetra) (meth)acrylate" has a concept including tri(meth) acrylate and tetra(meth)acrylate.

Examples of one suitable aspect of the polymerizable compound also include a urethane (meth)acrylate compound.

Examples of the urethane (meth)acrylate include urethane di(meth)acrylate, and examples thereof include propylene oxide-modified urethane di(meth)acrylate and ethylene oxide and propylene oxide-modified urethane di(meth)acrylate.

In addition, examples of the urethane (meth)acrylate also include tri- or higher functional urethane (meth)acrylate. The lower limit of the number of functional groups is more preferably 6 or more and still more preferably 8 or more. The upper limit of the number of functional groups is preferably 20 or less. Examples of the tri- or higher functional urethane (meth)acrylate include 8UX-015A (manufactured by Taisei Fine Chemical Co., Ltd.), UA-32P (manufactured by Shin-Nakamura Chemical Co., Ltd.), U-15HA (manufactured by Shin-Nakamura Chemical Co., Ltd.), UA-1100H (manufactured by Shin-Nakamura Chemical Co., Ltd.), AH-600 (product name) manufactured by KYOEISHA CHEMICAL Co., LTD, UA-306H, UA-306T, UA-306I, UA-510H, and UX-5000 (all manufactured by Nippon Kayaku Co., Ltd.).

Examples of one suitable aspect of the polymerizable compound also include an ethylenically unsaturated compound having an acid group.

Examples of the acid group include a phosphoric acid group, a sulfo group, and a carboxy group.

Among these, as the acid group, a carboxy group is preferable.

Examples of the ethylenically unsaturated compound having an acid group include a tri- or tetra-functional ethylenically unsaturated compound having an acid group [component obtained by introducing a carboxy group to pentaerythritol tri- and tetra-acrylate (PETA) skeleton (acid value: 80 to 120 mgKOH/g)), and a penta- to hexa-functional ethylenically unsaturated compound having an acid group [component obtained by introducing a carboxy group to dipentaerythritol penta- and hexa-acrylate (DPHA) skeleton (acid value: 25 to 70 mgKOH/g)].

The tri- or higher functional ethylenically unsaturated compound having an acid group may be used in combination with the bifunctional ethylenically unsaturated compound having an acid group, as necessary.

As the ethylenically unsaturated compound having an acid group, at least one selected from the group consisting of bi- or higher functional ethylenically unsaturated compound having a carboxy group and a carboxylic acid anhydride thereof is preferable.

In a case where the ethylenically unsaturated compound having an acid group is at least one selected from the group consisting of bi- or higher functional ethylenically unsaturated compound having a carboxy group and a carboxylic acid anhydride thereof, developability and film hardness are further enhanced.

The bi- or higher functional ethylenically unsaturated compound having a carboxy group is not particularly limited and can be appropriately selected from a known compound.

Examples of the bi- or higher functional ethylenically unsaturated compound having a carboxy group include ARONIX (registered trademark) TO-2349 manufactured by Toagosei Co., Ltd., ARONIX (registered trademark) M-520 manufactured by Toagosei Co., Ltd., and ARONIX (registered trademark) M-510 manufactured by Toagosei Co., Ltd.

As the ethylenically unsaturated compound having an acid group, polymerizable compounds having an acid group, which are described in paragraphs [0025] to [0030] of JP2004-239942A, are preferable, and the contents described in this publication are incorporated herein by reference.

Examples of the polymerizable compound also include a compound obtained by reacting a polyhydric alcohol with an α,β-unsaturated carboxylic acid, a compound obtained by reacting a glycidyl group-containing compound with an α,β-unsaturated carboxylic acid, urethane monomer such as a (meth)acrylate compound having a urethane bond, phthalate compounds such as γ-chloro-β-hydroxypropyl-β'-(meth)acryloyloxyethyl-o-phthalate, β-hydroxyethyl-β'-(meth)acryloyloxyethyl-o-phthalate, and β-hydroxypropyl-β'-(meth)acryloyloxyethyl-o-phthalate, and (meth)acrylic acid alkyl esters. These compounds may be used alone or in combination of two or more kinds thereof.

Examples of the compound obtained by reacting a polyhydric alcohol with an α,β-unsaturated carboxylic acid include bisphenol A-based (meth)acrylate compounds such as 2,2-bis(4-((meth)acryloxypolyethoxy)phenyl)propane, 2,2-bis(4-((meth)acryloxypolypropoxy)phenyl)propane, and 2,2-bis(4-((meth)acryloxypolyethoxypolypropoxy)phenyl)propane, polyethylene glycol di(meth)acrylate having 2 to 14 ethylene oxide groups, polypropylene glycol di(meth) acrylate having 2 to 14 propylene oxide groups, polyethylene polypropylene glycol di(meth)acrylate having 2 to 14 ethylene oxide groups and 2 to 14 propylene oxide groups, trimethylolpropane di(meth)acrylate, trimethylolpropane tri (meth)acrylate, trimethylolpropane ethoxy tri(meth)acrylate, trimethylolpropane diethoxy tri(meth)acrylate, trimethylolpropane triethoxy tri(meth)acrylate, trimethylolpropane tetraethoxy tri(meth)acrylate, trimethylolpropane pentaethoxy tri(meth)acrylate, di(trimethylolpropane) tetraacrylate, tetramethylolmethane tri(meth)acrylate, tetramethylolmethane tetra(meth)acrylate, dipentaerythritol tetra(meth) acrylate, dipentaerythritol penta(meth)acrylate, and dipentaerythritol hexa(meth)acrylate.

Among these, an ethylenically unsaturated compound having a tetramethylolmethane structure or a trimethylolpropane structure is preferable, and tetramethylolmethane tri(meth)acrylate, tetramethylolmethane tetra(meth)acrylate, trimethylolpropane tri(meth)acrylate, or di(trimethylolpropane) tetraacrylate is more preferable.

Examples of the polymerizable compound also include a caprolactone-modified compound of ethylenically unsaturated compound (for example, KAYARAD (registered trademark) DPCA-20 manufactured by Nippon Kayaku Co., Ltd., A-9300-1CL manufactured by Shin-Nakamura Chemical Co., Ltd., and the like), an alkylene oxide-modified compound of ethylenically unsaturated compound (for example, KAYARAD RP-1040 manufactured by Nippon Kayaku Co., Ltd., ATM-35E or A-9300 manufactured by Shin-Nakamura Chemical Co., Ltd., EBECRYL (registered trademark) 135 manufactured by Daicel-Allnex Ltd., and the like), and ethoxylated glycerin triacrylate (A-GLY-9E manufactured by Shin-Nakamura Chemical Co., Ltd., and the like).

In addition, examples of the polymerizable compound also include bisacrylic acid (2,2-dimethylethylene)(5-ethyl-1,3-dioxane-2,5-diyl)methylene (KAYARAD R-604 manufactured by Nippon Kayaku Co., Ltd.).

Among these, as the polymerizable compound (particularly, the ethylenically unsaturated compound), from the viewpoint of excellent developability of the precursor layer of the light reflecting layer after transfer, an ethylenically unsaturated compound including an ester bond is also preferable.

The ethylenically unsaturated compound including an ester bond is not particularly limited as long as it includes an ester bond in the molecule, but from the viewpoint that the effect of the present invention is excellent, an ethylenically unsaturated compound having a tetramethylolmethane structure or a trimethylolpropane structure is preferable, and tetramethylolmethane tri(meth)acrylate, tetramethylolmethane tetra(meth)acrylate, trimethylolpropane tri(meth)acrylate, or di(trimethylolpropane) tetraacrylate is more preferable.

As the ethylenically unsaturated compound, from the viewpoint of imparting reliability, it is preferable to include an ethylenically unsaturated compound having an aliphatic group having 6 to 20 carbon atoms and the above-described ethylenically unsaturated compound having a tetramethylolmethane structure or a trimethylolpropane structure.

Examples of the ethylenically unsaturated compound having an aliphatic group having 6 to 20 carbon atoms include 1,9-nonanediol di(meth)acrylate, 1,10-decanediol di(meth) acrylate, and tricyclodecane dimethanol di(meth)acrylate.

Examples of one suitable aspect of the polymerizable compound include a polymerizable compound (preferably, a bifunctional ethylenically unsaturated compound) having an aliphatic hydrocarbon ring structure.

As the above-described polymerizable compound, a polymerizable compound having a ring structure in which two or more aliphatic hydrocarbon rings are fused (preferably, a structure selected from the group consisting of a tricyclodecane structure and a tricyclodecene structure) is preferable, a bifunctional ethylenically unsaturated compound having a ring structure in which two or more aliphatic hydrocarbon rings are fused is more preferable, and tricyclodecane dimethanol di(meth)acrylate is still more preferable.

As the above-described aliphatic hydrocarbon ring structure, a cyclopentane structure, a cyclohexane structure, a tricyclodecane structure, a tricyclodecene structure, a norbornane structure, or an isophorone structure is preferable.

A molecular weight of the polymerizable compound is preferably 200 to 3,000, more preferably 250 to 2,600, still more preferably 280 to 2,200, and particularly preferably 300 to 2,200.

In addition, as one suitable aspect of the precursor layer of the light reflecting layer, the precursor layer of the light reflecting layer preferably contains the compound represented by Formula (M) and the ethylenically unsaturated compound having an acid group; and more preferably contains 1,9-nonanediol diacrylate and a polyfunctional ethylenically unsaturated compound having a carboxylic acid group.

In addition, as one suitable aspect of the precursor layer of the light reflecting layer, from the viewpoint of development residue inhibitory property and rust resistance, the precursor layer of the light reflecting layer preferably contains the bifunctional ethylenically unsaturated compound (preferably, a bifunctional (meth)acrylate compound) and the tri- or higher functional ethylenically unsaturated compound (preferably, a tri- or higher functional (meth)acrylate compound).

A mass ratio of the content of the bifunctional ethylenically unsaturated compound to the content of the tri- or higher functional ethylenically unsaturated compound (mass of the bifunctional ethylenically unsaturated compound/mass of the tri- or higher functional ethylenically unsaturated compound) is preferably 10/90 to 90/10, and more preferably 30/70 to 70/30.

The content of the bifunctional ethylenically unsaturated compound is preferably 20.0% by mass or more, more preferably 30.0% by mass or more, and still more preferably 40.0% by mass or more with respect to the total amount of all ethylenically unsaturated compounds. The upper limit thereof is not particularly limited, but is, for example, 100% by mass or less, preferably 90.0% by mass or less and more preferably 80.0% by mass or less.

The content of the bifunctional ethylenically unsaturated compound in the precursor layer of the light reflecting layer is preferably 5.0% to 60.0% by mass, more preferably 5.0% to 40.0% by mass, and still more preferably 5.0% to 40.0% by mass.

In addition, as one suitable aspect of the precursor layer of the light reflecting layer, from the viewpoint of rust resistance, the precursor layer of the light reflecting layer preferably contains the compound M and a bifunctional ethylenically unsaturated compound having an aliphatic hydrocarbon ring structure.

In addition, as one suitable aspect of the precursor layer of the light reflecting layer, from the viewpoint of substrate adhesiveness, development residue inhibitory property, and rust resistance, the precursor layer of the light reflecting layer preferably contains the compound M and the ethylenically unsaturated compound having an acid group; more preferably contains the compound M, the bifunctional ethylenically unsaturated compound having an aliphatic hydrocarbon ring structure, and the ethylenically unsaturated compound having an acid group; and still more preferably contains the compound M, the bifunctional ethylenically unsaturated compound having an aliphatic hydrocarbon ring structure, the tri- or higher functional ethylenically unsaturated compound, and the ethylenically unsaturated compound having an acid group.

The precursor layer of the light reflecting layer may contain a monofunctional ethylenically unsaturated compound as the ethylenically unsaturated compound.

A content of the bi- or higher functional ethylenically unsaturated compound is preferably 50% to 100% by mass with respect to the total content of all ethylenically unsaturated compounds contained in the precursor layer of the light reflecting layer.

The polymerizable compound (particularly, the ethylenically unsaturated compound) may be used alone or in combination of two or more kinds thereof.

The lower limit value of the content of the polymerizable compound (particularly, the ethylenically unsaturated compound) in the precursor layer of the light reflecting layer is preferably 10.0% by mass or more and more preferably 15.0% by mass or more with respect to the total mass of the precursor layer of the light reflecting layer. In addition, the upper limit value thereof is preferably 70.0% by mass or less, more preferably 60.0% by mass or less, still more preferably 50.0% by mass or less, and particularly preferably 40.0% by mass or less.

—Photopolymerization Initiator—

The precursor layer of the light reflecting layer preferably contains a photopolymerization initiator.

The photopolymerization initiator is not particularly limited and a known photopolymerization initiator can be used.

Examples of the photopolymerization initiator include a photopolymerization initiator having an oxime ester structure (hereinafter, also referred to as an "oxime-based photopolymerization initiator"), a photopolymerization initiator having an α-aminoalkylphenone structure (hereinafter, also referred to as an "α-aminoalkylphenone-based photopolymerization initiator"), a photopolymerization initiator having an α-hydroxyalkylphenone structure (hereinafter also referred to as an "α-hydroxyalkylphenone-based photopolymerization initiator"), a photopolymerization initiator having an acylphosphine oxide structure, (hereinafter, also referred to as an "acylphosphine oxide-based photopolymerization initiator"), and a photopolymerization initiator having an N-phenylglycine structure (hereinafter, also referred to as an "N-phenylglycine-based photopolymerization initiator").

The photopolymerization initiator preferably includes at least one kind selected from the group consisting of the oxime-based photopolymerization initiator, the α-aminoalkylphenone-based polymerization initiator, the α-hydroxyalkylphenone-based photopolymerization initiator, and the N-phenylglycine-based photopolymerization initiator, and more preferably includes at least one kind selected from the group consisting of the oxime-based photopolymerization initiator, the α-aminoalkylphenone-based photopolymerization initiator, and the N-phenylglycine-based photopolymerization initiator.

In addition, as the photopolymerization initiator, for example, polymerization initiators described in paragraphs [0031] to [0042] of JP2011-095716A and paragraphs [0064] to [0081] of JP2015-014783A may be used.

In addition, from the viewpoint of photosensitivity, visibility of the exposed portion and the non-exposed portion, and resolution, a photoradical polymerization initiator as the photopolymerization initiator preferably includes at least one selected from the group consisting of a 2,4,5-triarylimidazole dimer and a derivative thereof. Two 2,4,5-triarylimidazole structures in the 2,4,5-triarylimidazole dimer and a derivative thereof may be the same or different from each other.

Examples of the derivative of the 2,4,5-triarylimidazole dimer include a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, a 2-(o-methoxyphenyl)-4,5-diphenylimidazole dimer, and a 2-(p-methoxyphenyl)-4,5-diphenylimidazole dimer.

Examples of a derivative of the 2,4,5-triarylimidazole dimer include 2,2'-bis(2-chlorophenyl)-4,4',5,5'-tetraphenyl-1,2'-biimidazole.

Examples of the photoradical polymerization initiator include dimethylaminobenzoate (DBE, CAS No. 10287-53-3), benzoin methyl ether, anisyl (p,p'-dimethoxybenzyl), TAZ-110 (product name; manufactured by Midori Kagaku Co., Ltd.), benzophenone, 4,4'-bis(diethylamino)benzophenone, TAZ-111 (product name; manufactured by Midori Kagaku Co., Ltd.), Irgacure OXE01, OXE02, OXE03, and OXE04 (manufactured by BASF SE), Omnirad 651 and 369 (product name; manufactured by IGM Resins B.V.), and 2,2'-bis(2-chlorophenyl)-4,4',5,5'-tetraphenyl-1,2'-biimidazole (manufactured by Tokyo Chemical Industry Co., Ltd.).

Examples of a commercially available product of the photoradical polymerization initiator include 1-[4-(phenylthio)phenyl]-1,2-octanedione-2-(O-benzoyloxime) (product name: IRGACURE (registered trademark) OXE-01, manufactured by BASF SE), 1-[9-ethyl-6-(2-methylbenzoyl)-9H-carbazol-3-yl]ethanone-1-(0-acetyloxime) (product name: IRGACURE OXE-02, manufactured by BASF SE), IRGACURE OXE-03 (manufactured by BASF SE), IRGACURE OXE-04 (manufactured by BASF SE), 2-(dimethylamino)-2-[(4-methylphenyl)methyl]-1-[4-(4-morpholinyl)phenyl]-1-butanone (product name: Omnirad 379EG, manufactured by IGM Resins B.V.), 2-methyl-1-(4-methylthiophenyl)-2-morpholinopropan-1-one (product name: Omnirad 907, manufactured by IGM Resins B.V.), 2-hydroxy-1-{4-[4-(2-hydroxy-2-methylpropionyl)benzyl]phenyl}-2-methylpropan-1-one (product name: Omnirad 127, manufactured by IGM Resins B.V.), 2-benzyl-2-dimethylamino-1-(4-morpholinophenyl)butanone-1 (product name: Omnirad 369, manufactured by TGM Resins B.V.), 2-hydroxy-2-methyl-1-phenylpropan-1-one (product name: Omnirad 1173, manufactured by IGM Resins B.V.), 1-hydroxy cyclohexyl phenyl ketone (product name: Omnirad 184, manufactured by IGM Resins B.V.), 2,2-dimethoxy-1,2-diphenylethan-1-one (product name: Omnirad 651, manufactured by IGM Resins B.V.), 2,4,6-trimethylbenzoyl-diphenylphosphine oxide (product name: Omnirad TPO H, manufactured by IGM Resins B.V.), bis(2,4,6-trimethylbenzoyl)phenylphosphine oxide (product name: Omnirad 819, manufactured by IGM Resins B.V.), an oxime ester-based photopolymerization initiator (product name: Lunar 6, manufactured by DKSH Management Ltd.), 2,2'-bis(2-chlorophenyl)-4,4',5,5'-tetraphenylbisimidazole (2-(2-chlorophenyl)-4,5-diphenylimidazole dimer) (product name: B-CIM, manufactured by Hampford Research Inc.), 2-(o-chlorophenyl)-4,5-diphenylimidazole dimer (product name: BCTB, manufactured by Tokyo Chemical Industry Co., Ltd.), 1-[4-(phenylthio)phenyl]-3-cyclopentylpropan-1,2-dione-2-(O-benzoyloxime) (product name: TR-PBG-305, manufactured by TRONLY), 1,2-propanedione, 3-cyclohexyl-1-[9-ethyl-6-(2-furanylcarbonyl)-9H-carbazole-3-yl]-, 2-(O-acetyloxime) (product name: TR-PBG-326, manufactured by TRONLY), and 3-cyclohexyl-1-(6-(2-(benzoyloxyimino)hexanoyl)-9-ethyl-9H-carbazole-3-yl)-propan-1,2-dione-2-(O-benzoyloxime) (product name: TR-PBG-391, manufactured by TRONLY).

In addition, examples of a commercially available product of the photoradical polymerization initiator include an alkylphenone-based compound of a product name "Omnirad 379" (manufactured by IGM Resins B.V).

The photopolymerization initiator may be used alone or in combination of two or more kinds thereof. In a case of using two or more kinds thereof, it is preferable to use at least one selected from the oxime-based photopolymerization initiator, the α-aminoalkylphenone-based polymerization initiator, or the α-hydroxyalkylphenone-based photopolymerization initiator.

In a case where the precursor layer of the light reflecting layer contains the photopolymerization initiator, a content of the photopolymerization initiator is preferably 0.01% by mass or more, more preferably 0.1% by mass or more, and still more preferably 0.5% by mass or more with respect to the total mass of the precursor layer of the light reflecting layer. In addition, the upper limit value thereof is preferably 10.0% by mass or less and more preferably 5.0% by mass or less with respect to the total mass of the precursor layer of the light reflecting layer.

—Reflective Adjuster—

From the viewpoint that a light reflecting layer having predetermined characteristics can be obtained after exposure treatment and development treatment, and the light extraction efficiency in a case of white display is improved, the precursor layer of the light reflecting layer preferably contains one or more selected from the group consisting of a white pigment, metal particles, hollow particles, and a liquid crystal compound (particularly, pigment particles of a cholesteric liquid crystal compound).

In a case where the precursor layer of the light reflecting layer contains a white pigment or hollow particles, the precursor layer of the light reflecting layer is likely to be a white layer, and a light reflecting layer with the above-described characteristic 1 (L* value) is easily obtained. On the other hand, in a case where the precursor layer of the light reflecting layer contains metal particles or a liquid crystal compound (particularly, pigment particles of a cholesteric liquid crystal compound), a light reflecting layer with the above-described characteristic 2 (integral reflectance) or a light reflecting layer with the above-described characteristic A (reflectivity at a wavelength of 385 nm) is easily obtained by reflectivity caused by the metal particles or the liquid crystal compound.

—White Pigment—

Examples of the white pigment include titanium oxide, zinc oxide, lithopone, light calcium carbonate, white carbon, aluminum oxide, aluminum hydroxide, and barium sulfate. From the viewpoint that the effects of the present invention are more excellent, the white pigment is preferably particles having a refractive index higher than a refractive index of a cured substance of the polymerizable compound contained in the precursor layer of the light reflecting layer, more preferably titanium oxide, still more preferably rutile type titanium oxide or anatase type titanium oxide, and particularly preferably rutile type titanium oxide.

A surface of the white pigment may be subjected to a silica treatment, an alumina treatment, a titania treatment, a zirconia treatment, an organic matter treatment, or the like.

In addition, in a case where the precursor layer of the light reflecting layer contains the white pigment, the precursor layer of the light reflecting layer may further contain a pigment dispersant.

A shape of the white pigment is not particularly limited, and examples thereof include a spherical shape, an amorphous shape, a plate shape, a needle shape, and a polyhedron shape.

An average primary particle diameter of the white pigment is not particularly limited, but is, for example, preferably 50 to 1,000 nm and more preferably 100 to 500 nm.

The average primary particle diameter of the white pigment is a value obtained by measuring diameters of any 100 particles by observation with a transmission electron microscope (TEM) and obtaining an arithmetic average of the 100 diameters. In addition, the diameter of the white pigment refers to a diameter of an image obtained by observation with a transmission electron microscope (TEM) in a case where the image is assumed to be a circle having the same area.

—Metal Particles—

As a type of the metal contained in the metal particles, from the viewpoint of having high reflectivity, silver, nickel, cobalt, iron, copper, palladium, gold, platinum, tin, zinc, aluminum, tungsten, or titanium is preferable; silver, gold, tin, nickel, aluminum, or cobalt is more preferable; and from the viewpoint of exhibiting higher reflectivity in the visible light region, gold, silver, or aluminum is still more preferable, and silver is particularly preferable.

The metal particles may be metal monatomic particles or metal alloy particles. In a case where the metal particles are metal alloy particles, the metal alloy particles are preferably alloy particles of two or more of the above-described metal species.

A shape of the metal particles is not particularly limited, and examples thereof include a spherical shape, an amorphous shape, a plate shape, a needle shape, and a polyhedron shape.

An average primary particle diameter of the metal particles is not particularly limited, but is, for example, preferably 1 to 5,000 nm and more preferably 5 to 1,000 nm.

The average primary particle diameter of the metal particles is a value obtained by measuring diameters of any 100 particles by observation with a transmission electron microscope (TEM) and obtaining an arithmetic average of the 100 diameters. In addition, the diameter of the metal particles refers to a diameter of an image obtained by observation with a transmission electron microscope (TEM) in a case where the image is assumed to be a circle having the same area.

The metal particles can be produced, for example, by a method such as reduction of an organic metal compound, as described in JP1998-183207A (JP-H10-183207A).

—Hollow Particles—

The hollow particles are not particularly limited as long as they are particles having a cavity inside, and examples thereof include hollow inorganic particles and hollow resin particles.

As the hollow inorganic particles, for example, hollow inorganic particles in which a shell portion is composed of a metal oxide selected from the group consisting of silica, alumina, zirconia, titanium oxide, and composite oxides thereof are preferable.

Examples of the hollow resin particles include hollow resin particles in which a shell portion is composed of a polymer such as a styrene-based resin, an acrylic resin, a silicone-based resin, an acrylic-styrene-based resin, a vinyl chloride-based resin, a vinylidene chloride-based resin, an amide-based resin, a urethane-based resin, a phenol-based resin, a styrene-conjugated diene-based resin, an acrylic-conjugated diene-based resin, and an olefin-based resin, or composed of an organic substance such as a crosslinked substance of these polymers.

The hollow particles may be subjected to, for example, a physical surface treatment such as a plasma discharge treatment and a corona discharge treatment, or a chemical surface treatment using a surfactant, a coupling agent, or the like.

A shape of the hollow particles is not particularly limited, and examples thereof include a spherical shape, a crushed shape, a fibrous shape, a needle shape, and a scaly shape.

An average primary particle diameter of the hollow particles is not particularly limited, but is, for example, preferably 50 to 5,000 nm and more preferably 100 to 1,000 nm.

The average primary particle diameter of the hollow particles is a value obtained by measuring diameters of any 100 particles by observation with a transmission electron microscope (TEM) and obtaining an arithmetic average of the 100 diameters. In addition, the diameter of the hollow particles refers to a diameter of an image obtained by observation with a transmission electron microscope (TEM) in a case where the image is assumed to be a circle having the same area.

—Liquid Crystal Compound—

Examples of the liquid crystal compound include a compound having liquid crystallinity. The liquid crystal compound may be immobilized in a predetermined alignment state. That is, the precursor layer of the light reflecting layer may contain a polymer obtained by polymerizing an aligned polymerizable liquid crystal compound. In the above-described polymer, the alignment state is immobilized.

From the viewpoint of more excellent reflectivity, the liquid crystal compound is preferably a polymer obtained by polymerizing a polymerizable liquid crystal compound which is cholesteric liquid crystal-aligned (in other words, a polymer in which cholesteric liquid crystal alignment is immobilized). The polymer in which the cholesteric liquid crystal alignment is immobilized is obtained by using a cholesteric liquid crystal composition containing a nematic liquid crystalline compound and a chiral agent and curing the liquid crystal composition in a state of exhibiting a cholesteric liquid crystalline phase. The polymer in which the cholesteric liquid crystal alignment is immobilized usually has a circularly polarized light selective reflection function of selectively reflecting circularly polarized light.

In addition, it is preferable that, in the precursor layer of the light reflecting layer, the polymer in which the cholesteric liquid crystal alignment is immobilized is contained in a form of liquid crystal particles. In other words, it is preferable that the precursor layer of the light reflecting layer contains liquid crystal particles consisting of the polymer in which the cholesteric liquid crystal alignment is immobilized.

A shape of the liquid crystal particles is not particularly limited, but from the viewpoint of more excellent dispersibility, the liquid crystal particles are preferably flakes. An average primary particle diameter of the flakes is, for example, preferably 1 to 120 μm and more preferably 1 to 100 μm.

The average primary particle diameter of the liquid crystal particles is a value obtained by measuring diameters of any 100 particles by observation with a transmission electron microscope (TEM) and obtaining an arithmetic average of the 100 diameters. In addition, the diameter of the liquid crystal particles refers to a diameter of an image obtained by observation with a transmission electron microscope (TEM) in a case where the image is assumed to be a circle having the same area.

Examples of a commercially available product of the liquid crystal particles include “HELICONE HC Sapphire”, “HELICONE HC Aquarius”, “HELICONE HC Scarabeus”, “HELICONE HC Jade”, and “HELICONE HC Maple” (all of which are manufactured by Wacker Asahikasei Silicone co., ltd.).

A content of the reflective adjuster in the precursor layer of the light reflecting layer is preferably 10% to 90% by mass, more preferably 20% to 85% by mass, and still more preferably 30% to 80% by mass with respect to the total mass of the precursor layer of the light reflecting layer.

In particular, in a case where the reflective adjuster contains the white pigment, a content of the white pigment is preferably 30% to 80% by mass and more preferably 40% to 70% by mass with respect to the total mass of the precursor layer of the light reflecting layer. In addition, in a case where the reflective adjuster contains the metal particles, a content of the metal particles is preferably 20% to 95% by mass and more preferably 30% to 90% by mass with respect to the total mass of the precursor layer of the light reflecting layer. In addition, in a case where the reflective adjuster contains the hollow particles, a content of the hollow particles is preferably 20% to 80% by mass and more preferably 30% to 70% by mass with respect to the total mass of the precursor layer of the light reflecting layer. In addition, in a case where the reflective adjuster contains the liquid crystal compound (preferably, the liquid crystal particles), a content of the liquid crystal compound (preferably, the liquid crystal particles) is preferably 10% to 90% by mass, more preferably 20% to 80% by mass, and still more preferably 30% to 70% by mass with respect to the total mass of the precursor layer of the light reflecting layer.

—Heterocyclic Compound—

The precursor layer of the light reflecting layer may contain a heterocyclic compound.

A heterocyclic ring included in the heterocyclic compound may be either a monocyclic or polycyclic heterocyclic ring.

Examples of a heteroatom included in the heterocyclic compound include an oxygen atom, a nitrogen atom, and a sulfur atom. The heterocyclic compound preferably has at least one atom selected from the group consisting of a nitrogen atom, an oxygen atom, and a sulfur atom, and more preferably has a nitrogen atom.

Examples of the heterocyclic compound include a triazole compound, a benzotriazole compound, a tetrazole compound, a thiadiazole compound, a triazine compound, a rhodanine compound, a thiazole compound, a benzothiazole compound, a benzimidazole compound, a benzoxazole compound, and a pyrimidine compound.

Among the above-described compounds, the heterocyclic compound is preferably at least one compound selected from the group consisting of a triazole compound, a benzotriazole compound, a tetrazole compound, a thiadiazole compound, a triazine compound, a rhodanine compound, a thiazole compound, a benzimidazole compounds, and a benzoxazole compound, and more preferably at least one compound selected from the group consisting of a triazole compound, a benzotriazole compound, a tetrazole compound, a thiadiazole compound, a thiazole compound, a benzothiazole compound, a benzimidazole compound, and a benzoxazole compound.

Preferred specific examples of the heterocyclic compound are shown below. Examples of the triazole compound and the benzotriazole compound include the following compounds.

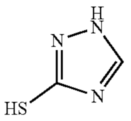
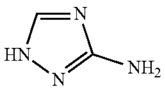
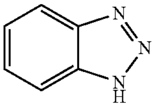

-continued

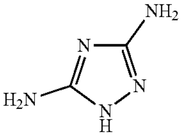
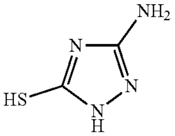
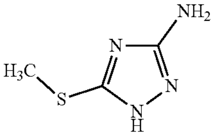
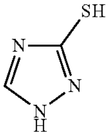
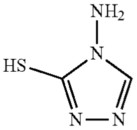
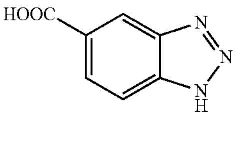
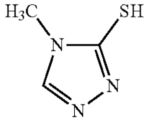
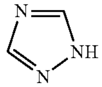

Examples of the thiadiazole compound include the following compounds.

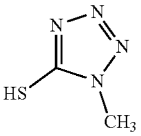
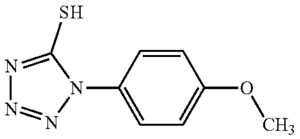
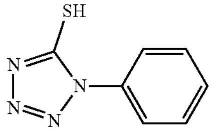
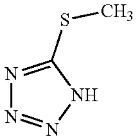
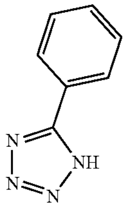
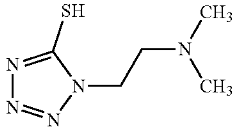
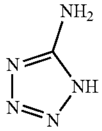

Examples of the thiadiazole compound include the following compounds.

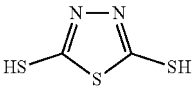
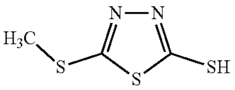
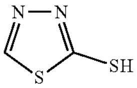
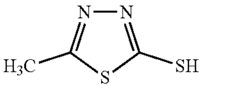
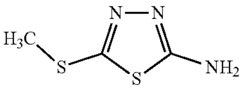
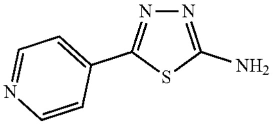
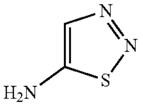
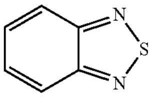
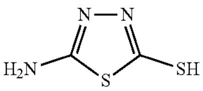

Examples of the triazine compound include the following compounds.

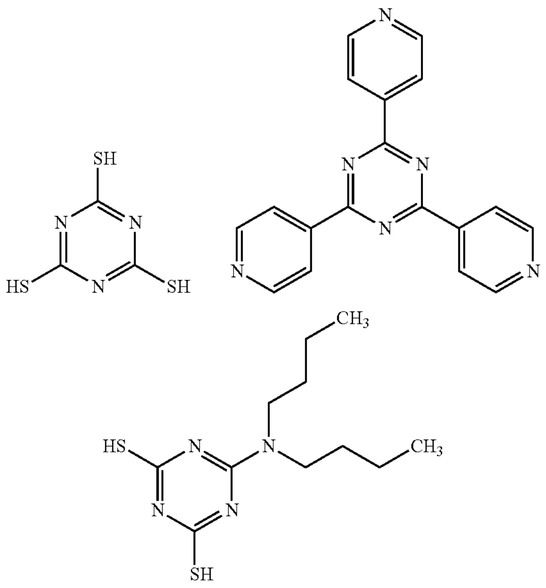

Examples of the rhodanine compound include the following compounds.

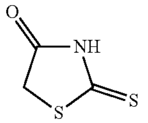

Examples of the thiazole compound include the following compounds.

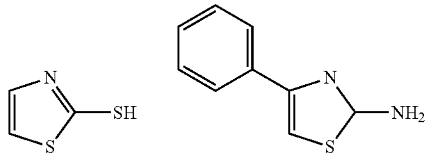 [SMILES: Sc1nccs1 ; NC1NC(c2ccccc2)=CS1]

Examples of the benzothiazole compound include the following compounds.

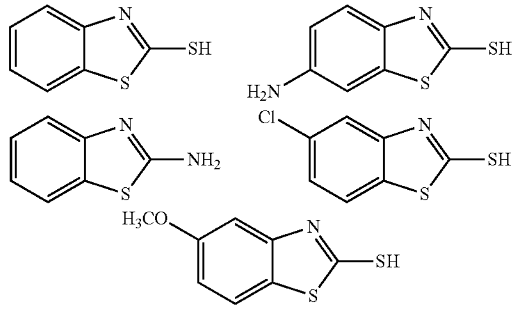

Examples of the benzimidazole compound include the following compounds.

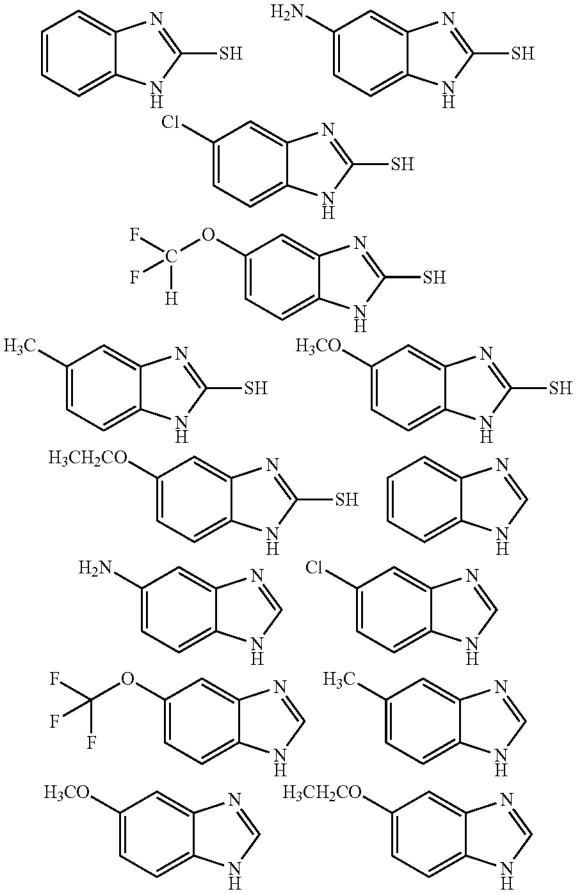

Examples of the benzoxazole compound include the following compounds.

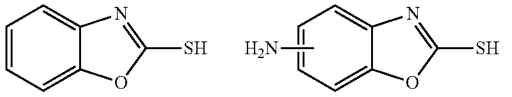

The heterocyclic compound may be used alone or in combination of two or more kinds thereof.

In a case where the precursor layer of the light reflecting layer contains the heterocyclic compound, a content of the heterocyclic compound is preferably 0.01% to 20.0% by mass, more preferably 0.10% to 10.0% by mass, still more preferably 0.30% to 8.0% by mass, and particularly preferably 0.50% to 5.0% by mass with respect to the total mass of the precursor layer of the light reflecting layer.

—Aliphatic Thiol Compound—

The precursor layer of the light reflecting layer may contain an aliphatic thiol compound.

In a case where the precursor layer of the light reflecting layer contains an aliphatic thiol compound, an ene-thiol reaction of the aliphatic thiol compound with the radically polymerizable compound having an ethylenically unsaturated group suppresses a cure shrinkage of the formed film and relieves stress.

As the aliphatic thiol compound, a monofunctional aliphatic thiol compound or a polyfunctional aliphatic thiol compound (that is, bi- or higher functional aliphatic thiol compound) is preferable.

Among the above-described compounds, as the aliphatic thiol compound, from the viewpoint of adhesiveness of the formed pattern (particularly, adhesiveness after exposure), a polyfunctional aliphatic thiol compound is preferable.

In the present specification, the "polyfunctional aliphatic thiol compound" refers to an aliphatic compound having two or more thiol groups (also referred to as "mercapto groups") in a molecule.

As the polyfunctional aliphatic thiol compound, a low-molecular-weight compound having a molecular weight of 100 or more is preferable. Specifically, the molecular weight of the polyfunctional aliphatic thiol compound is more preferably 100 to 1,500 and still more preferably 150 to 1,000.

From the viewpoint of adhesiveness of the formed pattern, for example, the number of functional groups in the polyfunctional aliphatic thiol compound is preferably 2 to 10, more preferably 2 to 8, and still more preferably 2 to 6.

Examples of the polyfunctional aliphatic thiol compound include trimethylolpropane tris(3-mercaptobutyrate), 1,4-bis(3-mercaptobutyryloxy)butane, pentaerythritol tetrakis(3-mercaptobutyrate), 1,3,5-tris(3-mercaptobutyryloxyethyl)-1,3,5-triazine-2,4,6(1H,3H,5H)-trione, 1,3,5-tris(2-(3-sulfanylbutanoyloxy)ethyl)-1,3,5-triazinane-2,4,6-trione, trimethylolethane tris(3-mercaptobutyrate), tris[(3-mercaptopropionyloxy)ethyl] isocyanurate, trimethylolpropane tris(3-mercaptopropionate), pentaerythritol tetrakis(3-mercaptopropionate), tetraethylene glycol bis(3-mercaptopropionate), dipentaerythritol hexakis(3-mercaptopropionate), ethylene glycol bisthiopropionate, 1,2-ethanedithiol, 1,3-propanedithiol, 1,6-hexamethylenedithiol, 2,2'-(ethylenedithio)diethanethiol, meso-2,3-dimercaptosuccinic acid, and di(mercaptoethyl) ether.

Among the above-described compounds, the polyfunctional aliphatic thiol compound is preferably at least one compound selected from the group consisting of trimethylolpropane tris(3-mercaptobutyrate), 1,4-bis(3-mercaptobutyryloxy)butane, and 1,3,5-tris(3-mercaptobutyryloxyethyl)-1,3,5-triazine-2,4,6(1H,3H,5H)-trione.

Examples of the monofunctional aliphatic thiol compound include 1-octanethiol, 1-dodecanethiol, β-mercaptopropionic acid, methyl-3-mercaptopropionate, 2-ethylhexyl-3-mercaptopropionate, n-octyl-3-mercaptopropionate, methoxybutyl-3-mercaptopropionate, and stearyl-3-mercaptopropionate.

The precursor layer of the light reflecting layer may contain only one kind of the aliphatic thiol compound, or may contain two or more kinds of the aliphatic thiol compounds.

In a case where the precursor layer of the light reflecting layer contains the aliphatic thiol compound, a content of the aliphatic thiol compound is preferably 5% by mass or more, more preferably 5% to 50% by mass, still more preferably 5% to 30% by mass, and particularly preferably 8% to 20% by mass with respect to the total mass of the precursor layer of the light reflecting layer.

—Thermal Crosslinking Compound—

From the viewpoint of hardness of a cured film to be obtained and pressure-sensitive adhesiveness of an uncured film to be obtained, the precursor layer of the light reflecting layer also preferably contains a thermal crosslinking compound. In the present specification, a thermal crosslinking compound having an ethylenically unsaturated group, which will be described later, is not treated as the ethylenically unsaturated compound, but is treated as the thermal crosslinking compound.

Examples of the thermal crosslinking compound include an epoxy compound, an oxetane compound, a methylol compound, and a blocked isocyanate compound. Among these, from the viewpoint of hardness of a cured film to be obtained and pressure-sensitive adhesiveness of an uncured film to be obtained, a blocked isocyanate compound is preferable.

Since the blocked isocyanate compound reacts with a hydroxy group and a carboxy group, for example, in a case where at least one of the alkali-soluble resin or the radically polymerizable compound having an ethylenically unsaturated group has at least one of a hydroxy group or a carboxy group, hydrophilicity of the formed film tends to decrease, and the function as a protective film tends to be strengthened.

The blocked isocyanate compound refers to a "compound having a structure in which the isocyanate group of isocyanate is protected (so-called masked) with a blocking agent".

A dissociation temperature of the blocked isocyanate compound is not particularly limited, but is preferably 100° C. to 160° C. and more preferably 130° C. to 150° C.

The dissociation temperature of blocked isocyanate means "temperature at an endothermic peak accompanied with a deprotection reaction of blocked isocyanate, in a case where the measurement is performed by differential scanning calorimetry (DSC) analysis using a differential scanning calorimeter".

As the differential scanning calorimeter, for example, a differential scanning calorimeter (model: DSC6200) manufactured by Seiko Instruments Inc. can be suitably used. However, the differential scanning calorimeter is not limited thereto.

Examples of the blocking agent having a dissociation temperature of 100° C. to 160° C. include an active methylene compound [diester malonates (dimethyl malonate, diethyl malonate, di-n-butyl malonate, di-2-ethylhexyl malonate, and the like)], and an oxime compound (compound having a structure represented by —C(═N—OH)— in a molecule, such as formaldoxime, acetoaldoxime, acetoxime, methyl ethyl ketoxime, and cyclohexanoneoxime).

Among these, from the viewpoint of storage stability, the blocking agent having a dissociation temperature of 100° C. to 160° C. is preferably, for example, at least one selected from oxime compounds.

From the viewpoint of improving brittleness of the film and improving the adhesion to the object to be transferred, for example, the blocked isocyanate compound preferably has an isocyanurate structure.

The blocked isocyanate compound having an isocyanurate structure can be obtained, for example, by isocyanurate-forming and protecting hexamethylene diisocyanate.

Among the blocked isocyanate compounds having an isocyanurate structure, a compound having an oxime structure using an oxime compound as a blocking agent is preferable from the viewpoint that the dissociation temperature can be easily set in a preferred range and the development residue can be easily reduced, as compared with a compound having no oxime structure.

The blocked isocyanate compound may have a polymerizable group.

The polymerizable group is not particularly limited, and a known polymerizable group can be used, and a radically polymerizable group is preferable.

Examples of the polymerizable group include a (meth) acryloxy group, a (meth)acrylamide group, an ethylenically unsaturated group such as styryl group, and an epoxy group such as a glycidyl group.

Among these, as the polymerizable group, an ethylenically unsaturated group is preferable, a (meth)acryloxy group is more preferable, and an acryloxy group still more preferable.

As the blocked isocyanate compound, a commercially available product can be used.

Examples of the commercially available product of the blocked isocyanate compound include Karenz (registered trademark) AOI-BM, Karenz (registered trademark) MOI-BM, Karenz (registered trademark) MOI-BP, and the like (all of which are manufactured by SHOWA DENKO K.K.), and block-type DURANATE series (for example, DURANATE (registered trademark) TPA-B80E, DURANATE (registered trademark) WT32-B75P, and the like manufactured by Asahi Kasei Corporation).

The thermal crosslinking compound may be used alone or in combination of two or more kinds thereof.

In a case where the precursor layer of the light reflecting layer contains the thermal crosslinking compound, a content of the thermal crosslinking compound is preferably 1.0% to 50.0% by mass, more preferably 5.0% to 30.0% by mass, and still more preferably 5.0% to 25.0% by mass with respect to the total mass of the precursor layer of the light reflecting layer.

—Surfactant—

The precursor layer of the light reflecting layer may contain a surfactant.

Examples of the surfactant include surfactants described in paragraph [0017] of JP4502784B and paragraphs [0060] to [0071] of JP2009-237362A.

As the surfactant, a fluorine-based surfactant or a silicone-based surfactant is preferable.

Examples of a commercially available product of the fluorine-based surfactant include: MEGAFACE F-171, F-172, F-173, F-176, F-177, F-141, F-142, F-143, F-144, F-437, F-475, F-477, F-479, F-482, F-551-A, F-552, F-554, F-555-A, F-556, F-557, F-558, F-559, F-560, F-561, F-565, F-563, F-568, F-575, F-780, EXP, MFS-330, R-41, R-41-LM, R-01, R-40, R-40-LM, RS-43, TF-1956, RS-90, R-94, RS-72-K, and DS-21 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.); FTERGENT 710FM, 710FL, 610FM, 601AD, 601ADH2, 602A, 215M, 245F, 251, 212M, 250, 209F, 222F, 208G, 710LA, 710FS, 730LM, 650AC, and 681 (all of which are manufactured by NEOS COMPANY LIMITED).

In addition, as the fluorine-based surfactant, an acrylic compound, which has a molecular structure having a functional group containing a fluorine atom and in which, by applying heat to the molecular structure, the functional group containing a fluorine atom is broken to volatilize a fluorine atom, can also be suitably used. Examples of such a fluorine-based surfactant include MEGAFACE DS series manufactured by DIC Corporation (The Chemical Daily (Feb. 22, 2016) and Nikkei Business Daily (Feb. 23, 2016)), for example, MEGAFACE DS-21.

In addition, as the fluorine-based surfactant, a polymer of a fluorine atom-containing vinyl ether compound having a fluorinated alkyl group or a fluorinated alkylene ether group, and a hydrophilic vinyl ether compound is also preferably used.

In addition, as the fluorine-based surfactant, a block polymer can also be used.

In addition, as the fluorine-based surfactant, a fluorine-containing polymer compound including a constitutional unit derived from a (meth)acrylate compound having a fluorine atom and a constitutional unit derived from a (meth)acrylate compound having 2 or more (preferably 5 or more) alkyleneoxy groups (preferably ethyleneoxy groups or propyleneoxy groups) can also be preferably used.

In addition, as the fluorine-based surfactant, a fluorine-containing polymer having an ethylenically unsaturated bond-containing group in the side chain can also be used. Examples thereof include MEGAFACE RS-101, RS-102, RS-718K, and RS-72-K (all manufactured by DIC Corporation).

As the fluorine surfactant, from the viewpoint of improving environmental suitability, a surfactant derived from a substitute material for a compound having a perfluoroalkyl group having 7 or more carbon atoms, such as perfluorooctanoic acid (PFOA) and perfluorooctanesulfonic acid (PFOS), is preferable.

Examples of the nonionic surfactant include glycerol, trimethylolpropane, trimethylolethane, an ethoxylate and propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC (registered trademark) L10, L31, L61, L62, 10R5, 17R2, and 25R2 (all of which are manufactured by BASF SE), TETRONIC 304, 701, 704, 901, 904, and 150R1 (all of which are manufactured by BASF SE), SOLSPERSE 20000 (all of which are manufactured by Lubrizol Corporation), NCW-101, NCW-1001, and NCW-1002 (all of which are manufactured by FUJIFILM Wako Pure Chemical Corporation), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

Examples of the silicone-based surfactant include a linear polymer consisting of a siloxane bond and a modified siloxane polymer with an organic group introduced in the side chain or the terminal.

Specific examples of the surfactant include DOWSIL 8032 ADDITIVE, TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Toray Co., Ltd.), X-22-4952, X-22-4272, X-22-6266, KF-351A, K354L, KF-355A, KF-945, KF-640, KF-642, KF-643, X-22-6191, X-22-4515, KF-6004, KP-341, KF-6001, and KF-6002 (all of which are manufactured by Shin-Etsu Silicone Co., Ltd.), F-4440, TSF-4300, TSF-4445, TSF-4460, and TSF-4452 (all of which are manufactured by Momentive Performance Materials Co., Ltd.), and BYK307, BYK323, and BYK330 (all of which are manufactured by BYK Chemie).

The surfactant may be used alone or in combination of two or more kinds thereof.

In a case where the precursor layer of the light reflecting layer contains the surfactant, a content of the surfactant is preferably 0.01% to 3.0% by mass, more preferably 0.01% to 1.0% by mass, and still more preferably 0.05% to 0.80% by mass with respect to the total mass of the precursor layer of the light reflecting layer.

—Polymerization Inhibitor—

The precursor layer of the light reflecting layer may contain a polymerization inhibitor.

The polymerization inhibitor means a compound having a function of delaying or prohibiting a polymerization reaction. As the polymerization inhibitor, for example, a known compound used as a polymerization inhibitor can be used.

Examples of the polymerization inhibitor include phenothiazine compounds such as phenothiazine, bis-(1-dimethylbenzyl)phenothiazine, and 3,7-dioctylphenothiazine; hindered phenolic compounds such as bis[3-(3-tert-butyl-4-hydroxy-5-methylphenyl)propionic acid][ethylene bis(oxyethylene)], 2,4-bis[(laurylthio)methyl]-o-cresol, 1,3,5-tris(3,5-di-t-butyl-4-hydroxybenzyl), 1,3,5-tris(4-t-butyl-3-hydroxy-2,6-dimethylbenzyl), 2,4-bis-(n-octylthio)-6-(4-hydroxy-3,5-di-t-butylanilino)-1,3,5-triazine, and pentaerythritol tetrakis3-(3,5-di-tert-butyl-4-hydroxyphenyl)propionate; nitroso compounds or a salt thereof, such as 4-nitrosophenol, N-nitrosodiphenylamine, N-nitrosocyclohexylhydroxylamine, and N-nitrosophenylhydroxylamine; quinone compounds such as methylhydroquinone, t-butylhydroquinone, 2,5-di-t-butylhydroquinone, and 4-benzoquinone; phenolic compounds such as 4-methoxyphenol, 4-methoxy-1-naphthol, and t-butylcatechol; and metal salt compounds such as copper dibutyldithiocarbamate, copper diethyldithiocarbamate, manganese diethyldithiocarbamate, and manganese diphenyldithiocarbamate.

Among these, as the polymerization inhibitor, from the viewpoint that the effects of the present invention are more excellent, at least one selected from the group consisting of a phenothiazine compound, a nitroso compound or a salt thereof, and a hindered phenolic compound is preferable, and phenothiazine, bis[3-(3-tert-butyl-4-hydroxy-5-methylphenyl)propionic acid][ethylene bis(oxyethylene)], 2,4-bis[(laurylthio)methyl]-o-cresol, 1,3,5-tris(3,5-di-t-butyl-4-hydroxybenzyl), or an aluminum salt of N-nitrosophenylhydroxylamine is more preferable.

The polymerization inhibitor may be used alone or in combination of two or more kinds thereof.

In a case where the precursor layer of the light reflecting layer contains the polymerization inhibitor, a content of the polymerization inhibitor is preferably 0.001% to 5.0% by mass, more preferably 0.01% to 3.0% by mass, and still more preferably 0.02% to 2.0% by mass with respect to the total mass of the precursor layer of the light reflecting layer. The content of the polymerization inhibitor is preferably 0.005% by mass to 5.0% by mass, more preferably 0.01% by mass to 3.0% by mass, and still more preferably 0.01% by mass to 1.0% by mass with respect to the total mass of the polymerizable compound.

—Hydrogen Donating Compound—

The precursor layer of the light reflecting layer may contain a hydrogen donating compound.

The hydrogen donating compound has a function of further improving sensitivity of the photopolymerization initiator to actinic ray, suppressing inhibition of polymerization of the polymerizable compound by oxygen, or the like.

Examples of the hydrogen donating compound include amines and an amino acid compound.

Examples of the amines include compounds described in M. R. Sander et al., "Journal of Polymer Society" Vol. 10, page 3173 (1972), JP1969-020189B (JP-S44-020189B), JP1976-082102A (JP-S51-082102A), JP1977-134692A (JP-S52-134692A), JP1984-138205A (JP-S59-138205A), JP1985-084305A (JP-S60-084305A), JP1987-018537A (JP-S62-018537A), JP1989-033104A (JP-S64-033104A), and Research Disclosure 33825. More specific examples thereof include 4,4'-bis(diethylamino)benzophenone, tris(4-dimethylaminophenyl)methane (another name: Leucocrystal Violet), triethanolamine, p-dimethylaminobenzoic acid ethyl ester, p-formyldimethylaniline, and p-methylthiodimethylaniline.

Among these, as the amines, from the viewpoint that the effects of the present invention are more excellent, at least one selected from the group consisting of 4,4'-bis(diethylamino)benzophenone and tris(4-dimethylaminophenyl) methane is preferable.

Examples of the amino acid compound include N-phenylglycine, N-methyl-N-phenylglycine, and N-ethyl-N-phenylglycine.

Among these, as the amino acid compound, from the viewpoint that the effects of the present invention are more excellent, N-phenylglycine is preferable.

In addition, examples of the hydrogen donating compound also include an organic metal compound described in JP1973-042965B (JP-S48-042965B) (tributyl tin acetate and the like), a hydrogen donor described in JP1980-034414B (JP-S55-034414B), and a sulfur compound described in JP1994-308727A (JP-H6-308727A) (trithiane and the like).

The hydrogen donating compound may be used alone or in combination of two or more kinds thereof.

In a case where the precursor layer of the light reflecting layer contains the hydrogen donating compound, from the viewpoint of improving a curing rate by balancing the polymerization growth rate and chain transfer, a content of the hydrogen donating compound is preferably 0.01% to 10.0% by mass, more preferably 0.01% to 8.0% by mass, and still more preferably 0.03% to 5.0% by mass with respect to the total mass of the precursor layer of the light reflecting layer.

—Impurities and the Like—

The precursor layer of the light reflecting layer may contain a predetermined amount of impurities.

Examples of the impurities include sodium, potassium, magnesium, calcium, iron, manganese, copper, aluminum, titanium, chromium, cobalt, nickel, zinc, tin, halogen, and ions of these. Among these, halide ion, sodium ion, and potassium ion are easily mixed as impurities, so that the following content is preferable.

The content of the impurities in the precursor layer of the light reflecting layer is preferably 80 ppm or less, more preferably 10 ppm or less, and still more preferably 2 ppm or less on a mass basis. The content of the impurities in the precursor layer of the light reflecting layer may be 1 ppb or more or 0.1 ppm or more on a mass basis.

Examples of a method of setting the impurities in the above-described range include selecting a raw material having a low content of impurities as a raw material for the precursor layer of the light reflecting layer, preventing the impurities from being mixed in a case of forming the precursor layer of the light reflecting layer, and washing and removing the impurities. By such a method, the amount of impurities can be kept within the above-described range.

The impurities can be quantified by a known method such as inductively coupled plasma (ICP) emission spectroscopy, atomic absorption spectroscopy, and ion chromatography.

In the precursor layer of the light reflecting layer, it is preferable that the content of compounds such as benzene, formaldehyde, trichlorethylene, 1,3-butadiene, carbon tetrachloride, chloroform, N,N-dimethylformamide, N,N-dimethylacetamide, and hexane is low in each layer. The content of these compounds in the precursor layer of the light reflecting layer is preferably 100 ppm or less, more preferably 20 ppm or less, and still more preferably 4 ppm or less on a mass basis. The lower limit thereof may be 10 ppb or more or 100 ppb or more on a mass basis. The content of these compounds can be suppressed in the same manner as in the above-described metal as impurities. In addition, the compounds can be quantified by a known measurement method.

From the viewpoint of improving reliability and laminating property, the content of water in the precursor layer of the light reflecting layer is preferably 0.01% to 1.0% by mass and more preferably 0.05% to 0.5% by mass.

—Residual Monomer—

The precursor layer of the light reflecting layer may contain a residual monomer of each constitutional unit in the above-described alkali-soluble resin.

From the viewpoint of patterning properties and reliability, a content of the residual monomer is preferably 5,000 ppm by mass or less, more preferably 2,000 ppm by mass or less, and still more preferably 500 ppm by mass or less with respect to the total mass of the alkali-soluble resin. The lower limit is not particularly limited, but is preferably 1 ppm by mass or more and more preferably 10 ppm by mass or more.

From the viewpoint of patterning properties and reliability, the residual monomer of each constitutional unit in the alkali-soluble resin is preferably 3,000 ppm by mass or less, more preferably 600 ppm by mass or less, and still more preferably 100 ppm by mass or less with respect to the total mass of the precursor layer of the light reflecting layer. The lower limit is not particularly limited, but is preferably 0.1 ppm by mass or more and more preferably 1 ppm by mass or more.

It is preferable that the amount of residual monomer of the monomer in a case of synthesizing the alkali-soluble resin by the polymer reaction is also within the above-described range. For example, in a case where glycidyl acrylate is reacted with a carboxylic acid side chain to synthesize the alkali-soluble resin, the content of glycidyl acrylate is preferably within the above-described range.

The amount of residual monomers can be measured by a known method such as liquid chromatography and gas chromatography.

—Other Components—

The precursor layer of the light reflecting layer may contain a component other than the above-described components (hereinafter, also referred to as "other components"). Examples of the other components include a colorant, an antioxidant, particles (for example, metal oxide particles), a sensitizer, and a chain transfer agent. In addition, examples of the other components also include other additives described in paragraphs [0058] to [0071] of JP2000-310706A.

—Particles—

As the particles, metal oxide particles are preferable.

The metal of the metal oxide particles also includes semimetal such as B, Si, Ge, As, Sb, or Te.

From the viewpoint of transparency of the cured film, for example, an average primary particle diameter of the particles is preferably 1 to 200 nm and more preferably 3 to 80 nm.

The average primary particle diameter of the particles is calculated by measuring particle diameters of 200 random particles using an electron microscope and arithmetically averaging the measurement result. In a case where the shape of the particle is not a spherical shape, the longest side is set as the particle diameter.

—Colorant—

The precursor layer of the light reflecting layer may contain a trace amount of a colorant (pigment, dye, or the like).

—Antioxidant—

Examples of the antioxidant include 3-pyrazolidones such as 1-phenyl-3-pyrazolidone (another name; phenidone), 1-phenyl-4,4-dimethyl-3-pyrazolidone, and 1-phenyl-4-methyl-4-hydroxymethyl-3-pyrazolidone; polyhydroxybenzenes such as hydroquinone, catechol, pyrogallol, methylhydroquinone, and chlorohydroquinone; paramethylaminophenol, paraaminophenol, parahydroxyphenylglycine, and paraphenylenediamine.

Among these, as the antioxidant, from the viewpoint that the effects of the present invention are more excellent, 3-pyrazolidones are preferable, and 1-phenyl-3-pyrazolidone is more preferable.

<<Precursor Layer of Light Absorbing Layer>>

<Characteristics of Light Absorbing Layer Formed from Precursor Layer of Light Absorbing Layer>

It is preferable that a light absorbing layer formed from the precursor layer of the light absorbing layer satisfies a characteristic 3 and/or a characteristic B. In particular, in a case where the LED in the light emitting element is the visible light LED, from the viewpoint of more excellent antireflection property of external light, the light absorbing layer is preferably a layer satisfying the characteristic 3, and in a case where the LED in the light emitting element is the UV-LED, from the viewpoint of more excellent antireflection property of external light and more excellent suppression property of stray light, the light absorbing layer is preferably a layer satisfying the characteristic B.

(Characteristic 3)

An optical density (OD) of the light absorbing layer at a wavelength of 550 nm is preferably 0.5 or more, more preferably 1.0 or more, still more preferably 2.0 or more, and particularly preferably 3.0 or more. The upper limit value thereof is not particularly limited, but is, for example, preferably 6.0 or less. The optical density of the light absorbing layer can be measured using a Macbeth densitometer (manufactured by Macbeth, TD-904, using a visual filter), or the like.

(Characteristic B)

An optical density (OD) of the light absorbing layer at a wavelength of 385 nm is preferably 0.5 or more, more preferably 1.0 or more, still more preferably 2.0 or more, and particularly preferably 3.0 or more. The upper limit value thereof is not particularly limited, but is, for example, preferably 6.0 or less. The optical density of the light absorbing layer at a wavelength of 385 nm can be measured using an ultraviolet spectrophotometer U-3310 (manufactured by Hitachi, Ltd.), or the like.

<Thickness of Precursor Layer of Light Absorbing Layer>

A thickness of the precursor layer of the light absorbing layer is preferably 1 μm or more, and more preferably 2 μm or more. The upper limit value thereof is not particularly limited, but is, for example, preferably 10 μm or less and more preferably 5 μm or less.

<Optical Density of Precursor Layer of Light Absorbing Layer>

An optical density (OD) of the precursor layer of the light absorbing layer at a wavelength of 550 nm is preferably 0.5 or more, more preferably 1.0 or more, still more preferably 2.0 or more, and particularly preferably 3.0 or more. The upper limit value thereof is not particularly limited, but is, for example, preferably 6.0 or less. The optical density of the precursor layer of the light absorbing layer can be measured using a Macbeth densitometer (manufactured by Macbeth, TD-904, using a visual filter), or the like.

An optical density (OD) of the precursor layer of the light absorbing layer at a wavelength of 385 nm is preferably 0.5 or more, more preferably 1.0 or more, still more preferably 2.0 or more, and particularly preferably 3.0 or more. The upper limit value thereof is not particularly limited, but is, for example, preferably 6.0 or less. The optical density of the precursor layer of the light absorbing layer at a wavelength of 385 nm can be measured using an ultraviolet spectrophotometer U-3310 (manufactured by Hitachi, Ltd.), or the like.

<Components of Precursor Layer of Light Absorbing Layer>

The precursor layer of the light absorbing layer may be either a positive tone photosensitive layer or a negative tone photosensitive layer, but is preferably a negative tone photosensitive layer. In a case where the precursor layer of the light absorbing layer is a negative tone photosensitive layer, it is preferable that the precursor layer of the light absorbing layer is configured to contain, for example, at least an alkali-soluble resin, a polymerizable compound, and a photopolymerization initiator. In addition, the precursor layer of the light absorbing layer typically contains a component for exhibiting the above-described characteristic 3 (OD value at a wavelength of 550 nm) and/or the characteristic B (OD value at a wavelength of 385 nm). As such a component, for example, it is preferable to contain a light absorbing substance described below.

Hereinafter, components which can be contained in the precursor layer of the light absorbing layer will be described in detail.

Components and contents of the precursor layer of the light absorbing layer are the same as the components and contents of the precursor layer of the light reflecting layer described above, except that the precursor layer of the light absorbing layer uses the light absorbing substance instead of the reflective adjuster.

—Light Absorbing Substance—

The light absorbing substance is not particularly limited, and examples thereof include a black pigment and a black dye. Specific examples thereof include carbon black, titanium black, titanium carbon, iron oxide, titanium oxide, and graphite, and carbon black is more preferable.

A shape of the light absorbing substance is not particularly limited, and examples thereof include a spherical shape, an amorphous shape, a plate shape, a needle shape, and a polyhedron shape.

An average primary particle diameter of the light absorbing substance is not particularly limited, but is, for example, preferably 1 to 1,000 nm and more preferably 2 to 500 nm.

The average primary particle diameter of the light absorbing substance is a value obtained by measuring diameters of any 100 particles by observation with a transmission electron microscope (TEM) and obtaining an arithmetic average of the 100 diameters. In addition, the diameter of the light absorbing substance refers to a diameter of an image obtained by observation with a transmission electron microscope (TEM) in a case where the image is assumed to be a circle having the same area.

The light absorbing substance may be subjected to, for example, a physical surface treatment such as a plasma discharge treatment and a corona discharge treatment, or a chemical surface treatment using a surfactant, a coupling agent, a resin, or the like.

In a case where the precursor layer of the light absorbing layer contains the light absorbing substance, a content of the light absorbing substance is preferably 5% to 80% by mass, more preferably 10% to 70% by mass, and still more preferably 20% to 60% by mass with respect to the total mass of the precursor layer of the light absorbing layer.

<<Protective Film>>

The transfer film according to the first embodiment may include a protective film.

As the protective film, a resin film having heat resistance and solvent resistance can be used, and examples thereof include polyolefin films such as a polypropylene film and a polyethylene film, polyester films such as a polyethylene terephthalate film, polycarbonate films, and polystyrene films.

In addition, as the protective film, a resin film formed of the same material as in the above-described temporary support may be used.

Among these, as the protective film, a polyolefin film is preferable, a polypropylene film or a polyethylene film is more preferable, and a polyethylene film is still more preferable.

A thickness of the protective film is preferably 1 to 100 μm, more preferably 5 to 50 μm, still more preferably 5 to 40 μm, and particularly preferably 15 to 30 μm.

From the viewpoint of excellent mechanical hardness, the thickness of the protective film is preferably 1 μm or more, and from the viewpoint of relatively low cost, the thickness of the protective film is preferably 100 μm or less.

In addition, in the protective film, it is preferable that the number of fisheyes with a diameter of 80 μm or more in the protective film is 5 pieces/$m^2$ or less.

The "fisheye" means that, in a case where a material is hot-melted, kneaded, extruded, biaxially stretched, cast or the like to produce a film, foreign substances, undissolved substances, oxidatively deteriorated substances, and the like of the material are incorporated into the film.

The number of particles having a diameter of 3 μm or more included in the protective film is preferably 30 particles/$mm^2$ or less, more preferably 10 particles/$mm^2$ or less, and still more preferably 5 particles/$mm^2$ or less.

As a result, it is possible to suppress defects caused by ruggedness due to the particles contained in the protective film being transferred to the precursor layer of the light reflecting layer or the precursor layer of the light-absorbing layer.

From the viewpoint of imparting take-up property, in the protective film, an arithmetic average roughness Ra on a surface opposite to a surface in contact with the composition layer is preferably 0.01 μm or more, more preferably 0.02 μm or more, and still more preferably 0.03 μm or more. On the other hand, it is preferable to be less than 0.50 μm, more preferable to be 0.40 μm or less, and still more preferable to be 0.30 μm or less.

From the viewpoint of suppressing defects during transfer, in the protective film, the surface roughness Ra on the surface in contact with the composition layer is preferably 0.01 μm or more, more preferably 0.02 μm or more, and still more preferably 0.03 μm or more. On the other hand, it is preferable to be less than 0.50 μm, more preferable to be 0.40 μm or less, and still more preferable to be 0.30 μm or less.

<<Interlayer>>

The transfer film according to the first embodiment may include an interlayer between the precursor layer of the light reflecting layer and the precursor layer of the light absorbing layer. With the interlayer, it is possible to suppress mixing of components which can be generated during coating formation of the precursor layer of the light reflecting layer and the precursor layer of the light absorbing layer and during storage after the coating formation.

As the interlayer, a water-soluble resin layer containing a water-soluble resin can be used.

In addition, as the interlayer, an oxygen blocking layer having an oxygen blocking function, which is described as "separation layer" in JP1993-072724A (JP-H5-072724A), can also be used. In a case where the interlayer is an oxygen blocking layer, the sensitivity during exposure is improved, the time load of the exposure machine is reduced, so that the productivity is improved, which is preferable.

The oxygen blocking layer used as the interlayer may be appropriately selected from a known layer described in the above-described publication and the like. Among these, an oxygen blocking layer which exhibits low oxygen permeability and dispersed and is dispersed or dissolved in water or an alkali aqueous solution (1% by mass aqueous solution of sodium carbonate at 22° C.) is preferable.

Hereinafter, each component which can be included in the interlayer (water-soluble resin layer) will be described.

The interlayer (water-soluble resin layer) contains a resin.

The above-described resin includes a water-soluble resin as a part or all thereof.

Examples of the resin which can be used as the water-soluble resin include resins such as a polyvinyl alcohol-based resin, a polyvinylpyrrolidone-based resin, a cellulose-based resin, an acrylamide-based resin, a polyethylene oxide-based resin, gelatin, a vinyl ether-based resin, a polyamide resin, and a copolymer thereof.

In addition, as the water-soluble resin, a copolymer of (meth)acrylic acid/vinyl compound, or the like can also be used. As the copolymer of (meth)acrylic acid/vinyl compound, a copolymer of (meth)acrylic acid/allyl (meth)acrylic acid is preferable, and a copolymer of methacrylic acid/allyl methacrylate is more preferable.

In a case where the water-soluble resin is a copolymer of (meth)acrylic acid/vinyl compound, for example, a compositional ratio (mol %) of each component is preferably 90/10 to 20/80 and more preferably 80/20 to 30/70.

The lower limit value of the weight-average molecular weight of the water-soluble resin is preferably 5,000 or more, more preferably 7,000 or more, and still more preferably 10,000 or more. In addition, the upper limit value thereof is preferably 200,000 or less, more preferably 100,000 or less, and still more preferably 50,000 or less.

A dispersity (Mw/Mn) of the water-soluble resin is preferably 1 to 10 and more preferably 1 to 5.

From the viewpoint of further improving interlayer mixing inhibitory ability of the interlayer (water-soluble resin layer), it is preferable that the resin in the interlayer (water-soluble resin layer) is a resin different from the resin contained in the precursor layer of the light absorbing layer and the resin contained in the precursor layer of the light reflecting layer.

From the viewpoint of further improving oxygen blocking property and interlayer mixing inhibitory ability, the water-soluble resin preferably includes polyvinyl alcohol, and more preferably includes both polyvinyl alcohol and polyvinylpyrrolidone.

The water-soluble resin may be used alone, or in combination of two or more kinds thereof.

A content of the water-soluble resin is not particularly limited, but from the viewpoint of further improving oxygen blocking property and interlayer mixing inhibitory ability, the content is preferably 50% by mass or more, more preferably 70% by mass or more, still more preferably 80% by mass or more, and particularly preferably 90% by mass or more with respect to the total mass of the interlayer (water-soluble resin layer). The upper limit value thereof is not particularly limited, and for example, 99.9% by mass or less is preferable and 99.8% by mass or less is still more preferable.

The interlayer may contain a known additive such as a surfactant as necessary.

A thickness of the interlayer (water-soluble resin layer) is not particularly limited, but is preferably 0.1 to 5 μm and more preferably 0.5 to 3 μm. In a case where the thickness of the interlayer (water-soluble resin layer) is within the above-described range, the interlayer mixing inhibitory ability is excellent without reducing the oxygen blocking property. In addition, it is also possible to suppress an increase in time for removing the interlayer (water-soluble resin layer) during development.

Manufacturing Method of Transfer Film According to First Embodiment

The manufacturing method of the transfer film according to the first embodiment is not particularly limited, and a known method can be used.

Examples of the manufacturing method of the transfer film according to the first embodiment shown in FIG. 2 include a method including a step of applying a composition for forming the precursor layer of the light absorbing layer onto a surface of the temporary support to form a coating film, and then drying the coating film to form the precursor layer of the light absorbing layer; and a step of applying a composition for forming the precursor layer of the light reflecting layer onto a surface of the precursor layer of the light absorbing layer to form a coating film, and then drying the coating film to form the precursor layer of the light reflecting layer. In addition, examples of the manufacturing method of the transfer film according to the first embodiment shown in FIG. 3 include a method including a step of applying a composition for forming the precursor layer of the light absorbing layer onto a surface of the temporary support to form a coating film, and then drying the coating film to form the precursor layer of the light absorbing layer; a step of applying a composition for forming the interlayer onto a surface of the precursor layer of the light absorbing layer to form a coating film, and then drying the coating film to form the interlayer; and a step of applying a composition for forming the precursor layer of the light reflecting layer onto a surface of the interlayer to form a coating film, and then drying the coating film to form the precursor layer of the light reflecting layer.

In addition, in a case where the transfer film according to the first embodiment, shown in FIGS. 2 and 3, further includes the protective film on a surface of the precursor layer of the light reflecting layer opposite to the temporary support, the manufacturing method of the transfer film according to the first embodiment includes a step of providing the protective film to be in contact with the surface of the precursor layer of the light reflecting layer opposite to the temporary support.

After manufacturing the transfer film according to the first embodiment by the above-described manufacturing methods, a roll-shaped transfer film according to the first embodiment may be produced and stored by winding the transfer film according to the first embodiment. The roll-shaped transfer film according to the first embodiment is provided as it is in a bonding step described later with the substrate in a roll-to-roll method.

In addition, as the manufacturing method of the transfer film according to the first embodiment shown in FIG. 2, a method in which the precursor layer of the light reflecting layer is formed on the protective film, and then the precursor layer of the light absorbing layer is formed on the surface of the precursor layer of the light reflecting layer may be used. In addition, as the manufacturing method of the transfer film according to the first embodiment shown in FIG. 2, a method in which the precursor layer of the light absorbing layer is formed on the temporary support and the precursor layer of the light reflecting layer is separately formed on the protective film separately, and then the precursor layer of the light absorbing layer and the precursor layer of the light reflecting layer are bonded to each other may be used.

<Method of Forming Composition for Forming Precursor Layer of Light Absorbing Layer and Method of Forming Precursor Layer of Light Absorbing Layer, and Method of Forming Composition for Forming Precursor Layer of Light Reflecting Layer and Method of Forming Precursor Layer of Light Reflecting Layer>

From the viewpoint of excellent productivity, it is desirable that the precursor layer of the light absorbing layer in the transfer film according to the first embodiment is formed by a coating method using a composition for forming the precursor layer of the light absorbing layer, containing the above-described components constituting the precursor layer of the light absorbing layer (for example, the alkali-soluble resin, the polymerizable compound, the photopolymerization initiator, the light absorbing substance, and the like) and a solvent. Specifically, as the manufacturing method of the transfer film according to the first embodiment, shown in FIGS. 2 and 3, a method in which the composition for forming the precursor layer of the light absorbing layer is applied onto the temporary support to form a coating film, and the coating film is dried to form the precursor layer of the light absorbing layer is preferable.

As the solvent which can be contained in the composition for forming the precursor layer of the light absorbing layer, an organic solvent is preferable. Examples of the organic solvent include methyl ethyl ketone, propylene glycol monomethyl ether, propylene glycol monomethyl ether acetate (another name: 1-methoxy-2-propyl acetate), diethylene glycol ethyl methyl ether, cyclohexanone, methyl isobutyl ketone, ethyl lactate, methyl lactate, caprolactam, n-propanol, and 2-propanol.

In addition, as the solvent, an organic solvent (high-boiling-point solvent) having a boiling point of 180° C. to 250° C. can also be used, as necessary.

The solvent may be used alone or in combination of two or more kinds thereof.

The total solid content of the composition for forming the precursor layer of the light absorbing layer is preferably 5% to 80% by mass, more preferably 5% to 40% by mass, and still more preferably 5% to 30% by mass with respect to the total mass of the composition for forming the precursor layer of the light absorbing layer. That is, the content of the solvent in the composition for forming the precursor layer of the light absorbing layer is preferably 20% to 95% by mass, more preferably 60% to 95% by mass, and still more preferably 70% to 95% by mass with respect to the total mass of the composition for forming the precursor layer of the light absorbing layer.

For example, from the viewpoint of coating properties, a viscosity of the composition for forming the precursor layer of the light absorbing layer at 25° C. is preferably 1 to 50 mPa·s, more preferably 2 to 40 mPa-s, and still more preferably 3 to 30 mPa-s. The viscosity is measured using a viscometer. As the viscometer, for example, a viscometer (product name: VISCOMETER TV-22) manufactured by Toki Sangyo Co., Ltd. can be suitably used. However, the viscometer is not limited to the above-described viscometer.

For example, from the viewpoint of coating properties, a surface tension of the composition for forming the precursor layer of the light absorbing layer at 25° C. is preferably 5 to 100 mN/m, more preferably 10 to 80 mN/m, and still more preferably 15 to 40 mN/m. The surface tension is measured using a tensiometer. As the tensiometer, for example, a tensiometer (product name: Automatic Surface Tensiometer CBVP-Z) manufactured by Kyowa Interface Science Co., Ltd. can be suitably used. However, the tensiometer is not limited to the above-described tensiometer.

Examples of a method for applying the composition for forming the precursor layer of the light absorbing layer include a printing method, a spray coating method, a roll coating method, a bar coating method, a curtain coating method, a spin coating method, and a die coating method (that is, a slit coating method).

As a method for drying the coating film of the composition for forming the precursor layer of the light absorbing layer, heat drying or vacuum drying is preferable. In the present specification, the "drying" means removing at least a part of the solvent included in the composition. Examples of the drying method include natural drying, heat drying, and vacuum drying. The above-described methods can be adopted alone or in combination of two or more thereof.

The drying temperature is preferably 80° C. or higher and more preferably 90° C. or higher. In addition, the upper limit value thereof is preferably 130° C. or lower and more preferably 120° C. or lower. The drying can be performed by continuously changing the temperature.

In addition, the drying time is preferably 20 seconds or more, more preferably 40 seconds or more, and still more preferably 60 seconds or more. In addition, the upper limit value thereof is not particularly limited, but is preferably 600 seconds or less, and more preferably 300 seconds or less.

The light reflecting layer in the transfer film according to the first embodiment can also be formed by the same procedure as the light absorbing layer described above.

<Method of Forming Composition for Forming Interlayer and Method of Forming Interlayer (Water-Soluble Resin Layer)>

The composition for forming the interlayer preferably contains various components for forming the above-described interlayer (water-soluble resin layer) and a solvent. In the composition for forming the interlayer, a suitable range of the content of each component with respect to the total solid content of the composition is the same as the suitable range of the content of each component with respect to the total mass of the interlayer (water-soluble resin layer) described above.

The solvent is not particularly limited as long as it can dissolve or disperse the water-soluble resin, and at least one selected from the group consisting of water and a water-miscible organic solvent is preferable, water or a mixed solvent of water and a water-miscible organic solvent is more preferable.

Examples of the water-miscible organic solvent include an alcohol having 1 to 3 carbon atoms, acetone, ethylene glycol, and glycerin, and an alcohol having 1 to 3 carbon atoms is preferable and methanol or ethanol is more preferable.

The solvent may be used alone, or in combination of two or more kinds thereof.

A content of the solvent is preferably 50 to 2,500 parts by mass, more preferably 50 to 1,900 parts by mass, and still more preferably 100 to 900 parts by mass with respect to 100 parts by mass of the total solid content of the composition.

A method of forming the water-soluble resin layer is not particularly limited as long as it is a method capable of forming a layer including the components, and examples thereof include known coating methods (slit coating, spin coating, curtain coating, ink jet coating, and the like).

<Protective Film Bonding Step>

A method of bonding the protective film to the precursor layer of the light reflecting layer is not particularly limited, and a known method can be mentioned.

Examples of an apparatus for bonding the protective film to the precursor layer of the light reflecting layer include known laminators such as a vacuum laminator and an auto-cut laminator.

It is preferable that the laminator is equipped with any heatable roller such as a rubber roller and can perform pressurization and heating.

Applications of Transfer Film According to First Embodiment

The applications of the transfer film according to the first embodiment are not particularly limited, but it is preferable that the transfer film is used for forming a partition wall layer between LED chips of a micro LED array substrate in a micro LED display element.

Manufacturing Method of Laminate Using Transfer Film According to First Embodiment By using the above-described transfer film according to the first embodiment, the precursor layer of the light absorbing layer and the precursor layer of the light reflecting layer can be transferred to a base material. In the following description, a layer excluding the protective film formed on the temporary support of the transfer film according to the first embodiment may be referred to as "composition layer".

The manufacturing method of a laminate according to the embodiment of the present invention preferably includes a bonding step of bonding, to a base material, a surface of the transfer film according to the first embodiment on a side opposite to the temporary support to obtain a precursor layer-attached base material including the base material, the composition layer (the composition layer includes the precursor layer of the light reflecting layer and the precursor layer of the light absorbing layer from the base material side), and the temporary support in this order; an exposing step of exposing the composition layer in the obtained precursor layer-attached base material; a developing step of developing the exposed composition layer to form a pattern having the light reflecting layer and the light absorbing layer in this order from the base material side; and a peeling step of peeling off the temporary support from the precursor layer-attached base material, between the bonding step and the exposing step or after the exposing step.

Hereinafter, the procedure of the steps will be specifically described.

[Bonding Step]

The bonding step is a step of bonding the transfer film according to the first embodiment to the base material such that a surface of the transfer film according to the first embodiment opposite to the temporary support of the transfer film (in other words, a surface of the composition layer) and the base material are in contact with each other, to obtain a precursor layer-attached base material including the base material, the composition layer (the composition layer includes the precursor layer of the light reflecting layer and the precursor layer of the light absorbing layer from the base material side), and the temporary support in this order.

In a case where the transfer film according to the first embodiment has a configuration of including the protective film, the protective film is peeled off and then the bonding step is performed.

In the above-described bonding, the base material and the surface of the composition layer are pressure-bonded so that both are in contact with each other.

The above-described pressure-bonding method is not particularly limited, and a known transfer method and laminating method can be used. Among these, it is preferable that the surface of the composition layer is superposed on the base material, and pressurization and heating are performed by a roll or the like.

A known laminator such as a vacuum laminator and an auto-cut laminator can be used for the bonding.

A laminating temperature is not particularly limited, but is preferably, for example, 70° C. to 130° C.

The base material is not particularly limited, and examples thereof include a substrate having a conductive layer. The substrate having a conductive layer has a conductive layer on the substrate, and any layer may be formed as necessary. That is, the substrate having the conductive layer is a conductive substrate having at least a substrate and a conductive layer arranged on the substrate.

Examples of the substrate include a resin substrate, a glass substrate, and a semiconductor substrate.

A preferred aspect of the substrate is described, for example, in paragraph [0140] of WO2018/155193A, the contents of which are incorporated herein by reference. As a material of the resin substrate, a cycloolefin polymer or polyimide is preferable. A thickness of the resin substrate is preferably 5 μm to 200 μm and more preferably 10 μm to 100 μm.

As the conductive layer, from the viewpoint of conductivity and fine line formability, at least one layer selected from the group consisting of a metal layer, a conductive metal oxide layer, a graphene layer, a carbon nanotube layer, and a conductive polymer layer is preferable.

In addition, only one conductive layer may be disposed, or two or more conductive layers may be arranged on the substrate. In a case where two or more conductive layers are arranged, it is preferable to have conductive layers formed of different materials.

A preferred aspect of the conductive layer is described, for example, in paragraph [0141] of WO2018/155193A, the contents of which are incorporated herein by reference.

The base material may be a micro LED array substrate including a plurality of micro LED chips. In addition, as the base material, a wiring board for producing a micro LED array substrate, which is a substrate on which the micro LED is not mounted in the case of the bonding step, may be used.

[Exposing Step]

The exposing step is a step of exposing the composition layer including the precursor layer of the light absorbing layer and the precursor layer of the light reflecting layer in a patterned manner. Here, the "exposure in a patterned manner" refers to exposure in a form of performing the exposure in a patterned manner, that is, a form in which an exposed portion and a non-exposed portion are present.

A positional relationship between the exposed portion and the non-exposed portion in the exposure in a patterned manner is not particularly limited and is appropriately adjusted. For example, in a case of manufacturing the partition wall layer to be disposed between the LED chips of the micro LED array substrate using the transfer film according to the first embodiment, including the precursor layer of the light reflecting layer and the precursor layer of the light absorbing layer, which are negative tone photosensitive layers, it is sufficient that the exposing step is performed using a mask having a pattern in which a portion corresponding to a disposition position of the LED chips is a non-opening portion and a portion corresponding to a disposition position of the partition wall layer is an opening portion. By the above-described exposing step, the precursor layer of the light absorbing layer and the precursor layer of the light reflecting layer can be exposed according to a pattern shape of the mask. The pattern shape of the opening portion in the mask is not particularly limited, and examples thereof include a lattice pattern.

The exposure may be performed from the side opposite to the base material of the composition layer, or may be performed from the base material side of the composition layer.

As a light source for the exposure, a light source can be appropriately selected and used as long as it can emit light in a wavelength range in which the precursor layer of the light absorbing layer and the precursor layer of the light reflecting layer can be cured (for example, 365 nm or 405 nm). Among these, a main wavelength of exposure light for the exposure is preferably 365 nm. The main wavelength is a wavelength having the highest intensity.

Examples of the light source include various lasers, a light emitting diode (LED), an ultra-high pressure mercury lamp, a high pressure mercury lamp, and a metal halide lamp.

An exposure amount is preferably 5 to 200 $mJ/cm^2$ and more preferably 10 to 200 $mJ/cm^2$.

Preferred aspects of the light source, the exposure amount, and the exposing method used for the exposure are described in, for example, paragraphs [0146] and [0147] of WO2018/155193A, the contents of which are incorporated herein by reference.

In addition, it is also preferable that a cross section of the obtained pattern is in a taper shape (specifically, a taper angle θ in FIG. 1 is less than 90°). In a case where the precursor layer of the light reflecting layer and the precursor layer of the light absorbing layer are negative tone photosensitive layers, for example, the cross-sectional shape of the pattern to be formed can be made to be a taper shape by a method such as introducing a light scattering plate into an exposure machine and applying the exposure light from an oblique direction.

[Peeling Step]

The peeling step is a step of peeling off the temporary support from the precursor layer-attached base material, between the bonding step and the exposing step or after the exposing step. In a case where the developing step is performed after the exposing step, the peeling step may be performed after the exposing step and before the developing step.

The peeling method is not particularly limited, and the same mechanism as the cover film peeling mechanism described in paragraphs [0161] and [0162] of JP2010-072589A can be used.

[Developing Step]

The developing step is a step of developing the exposed composition layer to form a pattern.

The development of the above-described composition layer can be performed using a developer.

As the developer, an alkali aqueous solution is preferable. Examples of an alkali compound which can be included in the alkali aqueous solution include sodium hydroxide, potassium hydroxide, sodium carbonate, potassium carbonate, sodium hydrogen carbonate, potassium hydrogencarbonate, tetramethyl ammonium hydroxide, tetraethyl ammonium hydroxide, tetrapropyl ammonium hydroxide, tetrabutylammonium hydroxide, and choline (2-hydroxyethyltrimethylammonium hydroxide).

Examples of the development method include methods such as puddle development, shower development, spin development, and dip development.

Examples of the developer which is suitably used in the present specification include the developer described in paragraph [0194] of WO2015/093271A, and examples of the developing method which is suitably used include the developing method described in paragraph [0195] of WO2015/093271A.

[Post-Exposing Step and Post-Baking Step]

The above-described manufacturing method of a laminate may include an exposing step of exposing the pattern obtained by the above-described developing step (post-exposing step) and/or a step of heating (post-baking step) the pattern.

In a case where both of the post-exposing step and the post-baking step are included, it is preferable that the post-baking is performed after the post-exposure.

An exposure amount of the post-exposure is preferably 100 to 5,000 $mJ/cm^2$ and more preferably 200 to 3,000 $mJ/cm^2$.

A temperature of the post-baking is preferably 80° C. to 250° C. and more preferably 90° C. to 160° C.

A post-baking time is preferably 1 to 180 minutes and more preferably 10 to 60 minutes.

Laminate and Micro LED Display Element Formed of Transfer Film According to First Embodiment The laminate formed of the transfer film according to the first embodiment includes the base material and a pattern formed from the transfer film according to the first embodiment, the pattern being disposed on the base material. In addition, the above-described pattern has a light reflecting layer having a thickness of 3 μm or more and a light absorbing layer in order from the base material side.

The above-described laminate can be formed, for example, by the above-described manufacturing method of a laminate.

The above-described laminate may be, for example, a micro LED array substrate in a micro LED display element. In a case where the laminate is a micro LED array substrate, in the above-described substrate, the partition wall layer between the respective LEDs corresponds to the pattern formed from the transfer film according to the first embodiment, and the pattern has the light reflecting layer and the light absorbing layer in this order from the substrate side.

Laminate According to First Embodiment

The laminate according to a first embodiment includes, in the following order, a base material, a light reflecting layer, and a light absorbing layer, in which a thickness of the light reflecting layer is 3 μm or more, the light absorbing layer has a first opening portion which penetrates in a thickness direction of the light absorbing layer, the light reflecting layer has a second opening portion which penetrates in a thickness direction of the light reflecting layer and communicates with the first opening portion, and the laminate further includes a light emitting element which is disposed on the base material exposed through the second opening portion.

In a case where the laminate according to the first embodiment is applied to a display element, the display element including the laminate according to the first embodiment has excellent black density in a case of black display and has excellent brightness in a case of white display. The case where the display element is in white display is intended to mean that the light emitting element in the laminate is in the light-on state, and the case where the display element is in black display state is intended to mean that the light emitting element in the laminate is in the light-off state. That is, the case where the display element is in white display or black display does not intend to indicate light emission color of the light emitting element in the laminate.

In addition, the LED may be, for example, an LED having a peak wavelength in a visible light region (hereinafter, also referred to as "visible light LED"), or an LED having a peak wavelength in an ultraviolet region (hereinafter, also referred to as "UV-LED").

Hereinafter, the fact that, in a case where the laminate according to the first embodiment is applied to a display element, the display element is more excellent in black density in a case of black display and is more excellent in brightness in a case of white display, and/or the fact that the display element to be produced has more excellent contrast in a bright room (a ratio of brightness (white brightness) in the case of white display to brightness (black brightness) in the case of black display in a bright room environment) is also referred to as "effects of the present invention are more excellent".

Hereinafter, a configuration of the laminate according to the first embodiment will be described in more detail with reference to FIGS. 4 and 5.

Figure 4:
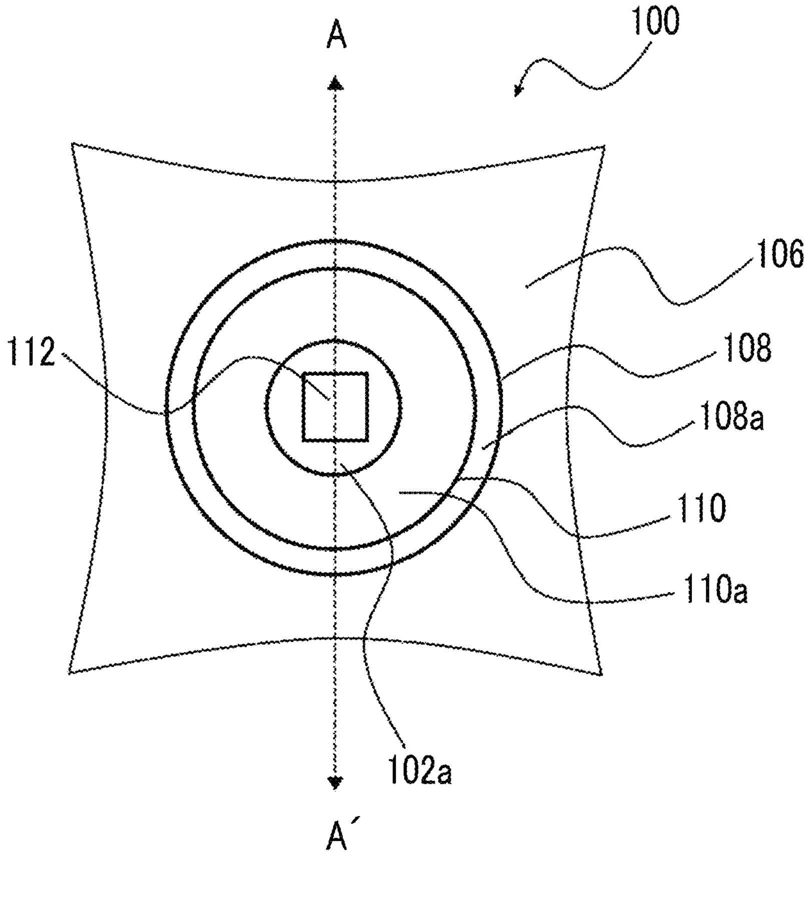
FIG. 4 is a top schematic view showing an example of a laminate according to a first embodiment.
Figure 5:
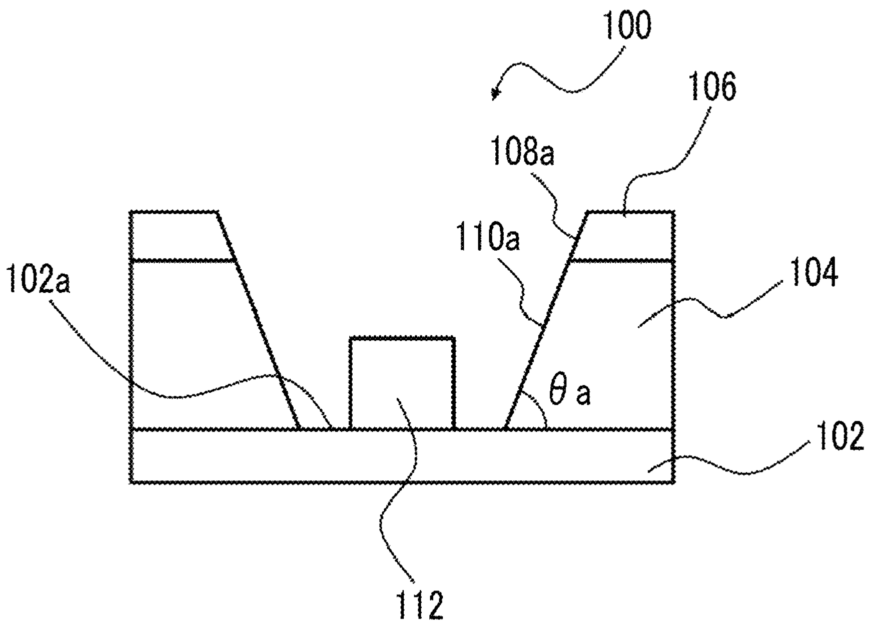
FIG. 5 is a schematic cross-sectional view taken along an A-A' cross section in FIG. 4.

FIG. 4 is a top schematic view showing an example of the laminate according to the first embodiment, and FIG. 5 is a schematic cross-sectional view taken along an A-A' cross section in FIG. 4.

A laminate 100 shown in FIGS. 4 and 5 includes a base material 102, a light reflecting layer 104 having a thickness of 3 μm or more, and a light absorbing layer 106 in this order. The light absorbing layer 106 has a first opening portion 108 which penetrates in a thickness direction of the light absorbing layer 106. The light reflecting layer 104 has a second opening portion 110 which penetrates in a thickness direction of the light reflecting layer 104 and communicates with the first opening portion 108.

An inner wall surface **110*a* of the second opening portion 110 of the light reflecting layer 104 is inclined such that an area of the second opening portion 110 is continuously reduced from a surface on the light absorbing layer 106 side toward a surface of the base material 102 side. In other words, an angle θa between the inner wall surface 110*a* and the base material 102 is less than 90°. In addition, in the laminate 100, an inner wall surface 108*a* of the first opening portion 108 of the light absorbing layer 106 is inclined such that an area of the first opening portion 210 is continuously reduced from a surface on an air interface side toward a surface on the light reflecting layer 104 side, so that the inner wall surface 108*a* is present in substantially the same plane as the inner wall surface 110*a***.

A light emitting element 112 is disposed on an exposed surface **102*a* of the base material 102 exposed through the second opening portion 110**.

In a case where the laminate according to the first embodiment is applied to a display element, the display element has excellent black density in a case of black display and also has excellent brightness in a case of white display.

An estimated action mechanism of the laminate according to the first embodiment is as follows.

In a case where the display element (not shown) is in white display (the light emitting element 112 is in a light-on state), light emitted from the light emitting element 112 is reflected by the light reflecting layer 104, and light reflection efficiency (light extraction efficiency) is improved, and as a result, the brightness is increased. On the other hand, in a case where the display element is in black display (the light emitting element 112 is in a light-off state), reflection of external light is suppressed by the light absorbing layer 106, and the black density is excellent. Furthermore, in a case where the display element is in white display, the light absorbing layer 106 also has a function of absorbing stray light which is erroneously incident into the light reflecting layer 104.

Shapes of the first opening portion 108 and the second opening portion 110 are not particularly limited, and examples thereof include a circle and a polygon such as quadrangular and hexagon.

An area of the exposed surface **102*a* of the base material 102 exposed through the second opening portion 110 is, for example, preferably 100 to 2,500 $\mu m^2$. Sizes of the first opening portion 108 and the second opening portion 110 can be appropriately set, for example, in relation to the area of the exposed surface 102*a* of the base material 102 exposed through the second opening portion 110 and the angle θa between the inner wall surface 110*a* and the base material 102**.

In addition, in the laminate 100, the angle θa between the inner wall surface **110*a* and the base material 102** is set to be less than 90°, but may be 90°. From the viewpoint that the effects of the present invention are more excellent, θa is preferably less than 90°, preferably 10° to 80°, more preferably 15° to 80°, still more preferably 20° to 80°, and particularly preferably 400 to 60°.

The angle θa between the inner wall surface **110*a* and the base material 102 corresponds to an angle between a projection surface obtained by projecting the inner wall surface 110*a* onto the base material 102 and the inner wall surface 110*a***.

The inner wall surface **110*a* of the second opening portion 110 of the light reflecting layer 104 is inclined such that the area of the second opening portion 110 is continuously reduced from the surface on the light absorbing layer 106 side toward the surface of the base material 102 side. A reduction rate of the area of the second opening portion 110 can be appropriately set such that the angle θa between the inner wall surface 110*a* and the base material 102** is to be a predetermined angle.

In addition, the inner wall surface **108*a* of the first opening portion 108 of the light absorbing layer 106 is inclined such that the area of the first opening portion 210 is continuously reduced from the surface on the air interface side toward the surface on the light reflecting layer 104 side, so that the inner wall surface 108*a* is present in substantially the same plane as the inner wall surface 110*a*. A reduction rate of the area of the first opening portion 108 can be appropriately set such that the inner wall surface 108*a* is present in substantially the same plane as the inner wall surface 110***a* (in other words, an angle between the plane including the inner wall surface 108*a* and the base material 102 and the angle θa between the inner wall surface 110*a* and the base material 102 are substantially the same).

The laminate according to the first embodiment can be produced using the transfer film according to the first embodiment described above. The production method thereof is as described above. Hereinafter, each element constituting the laminate according to the first embodiment will be described.

<<Base Material>>

The base material is not particularly limited, and examples thereof include a substrate having a conductive layer. The substrate having a conductive layer has a conductive layer on the substrate, and any layer may be formed as necessary. That is, the substrate having the conductive layer is a conductive substrate having at least a substrate and a conductive layer arranged on the substrate.

Examples of the substrate include a resin substrate, a glass substrate, and a semiconductor substrate.

A preferred aspect of the substrate is described, for example, in paragraph [0140] of WO2018/155193A, the contents of which are incorporated herein by reference. As a material of the resin substrate, a cycloolefin polymer or polyimide is preferable. A thickness of the resin substrate is preferably 5 μm to 200 μm and more preferably 10 μm to 100 μm.

As the conductive layer, from the viewpoint of conductivity and fine line formability, at least one layer selected from the group consisting of a metal layer, a conductive metal oxide layer, a graphene layer, a carbon nanotube layer, and a conductive polymer layer is preferable.

In addition, only one conductive layer may be disposed, or two or more conductive layers may be arranged on the substrate. In a case where two or more conductive layers are arranged, it is preferable to have conductive layers formed of different materials.

A preferred aspect of the conductive layer is described, for example, in paragraph [0141] of WO2018/155193A, the contents of which are incorporated herein by reference.

<<Light Reflecting Layer>>

<Characteristics of Light Reflecting Layer>

The light reflecting layer is preferably a layer satisfying at least one of the following characteristic 1, characteristic 2, or characteristic A. In particular, in a case where the LED in the light emitting element is a visible light LED, the light reflecting layer is preferably a layer which satisfies at least one of the characteristic 1 or the characteristic 2, and in a case where the LED in the light emitting element is an UV-LED, the light reflecting layer is preferably a layer which satisfies the characteristic A.

(Characteristic 1)

With regard to the total reflection of the light reflecting layer (incidence angle: 8°, light source: D-65 (visual field: 2°)), L* value in a CIE1976 (L*, a*, b*) color space is preferably 80 or more.

The L* value in the CIE 1976 (L*, a*, b*) color space is a value measured using a spectrophotometer with respect to a light reflecting layer having a thickness of 30 μm at 25° C. As the spectrophotometer, for example, a spectrophotometer V-570 manufactured by JASCO Corporation can be used.

The above-described L* value is more preferably 90 or more. The upper limit value thereof is 100 or less.

(Characteristic 2)

An integral reflectance of the light reflecting layer with respect to visible light having a wavelength of 400 to 700 nm is preferably 60% or more. The integral reflectance with respect to visible light having a wavelength of 400 to 700 nm is a value measured using a spectrophotometer with respect to a light reflecting layer having a thickness of 30 μm at 25° C. As the spectrophotometer, for example, a spectrophotometer V-570 manufactured by JASCO Corporation can be used.

The above-described integral reflectance with respect to visible light having a wavelength of 400 to 700 nm is preferably 80% or more. The upper limit value thereof is 100% or less.

(Characteristic A)

A reflectivity of the light reflecting layer at a wavelength of 385 nm is preferably 60% or more, and more preferably 80% or more. The upper limit value thereof is 100% or less. The reflectivity at a wavelength of 385 nm is a value measured using a spectrophotometer with respect to a light reflecting layer having a thickness of 30 μm at 25° C. As the spectrophotometer, for example, a spectrophotometer V-570 manufactured by JASCO Corporation can be used.

<Thickness of Light Reflecting Layer>

The thickness of the light reflecting layer is 3 μm or more, and is preferably 5 μm or more, more preferably 10 μm or more, still more preferably 16 μm or more, and particularly preferably 30 μm or more. The upper limit value thereof is not particularly limited, but is, for example, preferably 100 μm or less and more preferably 50 μm or less.

<Components of Light Reflecting Layer>

The light reflecting layer contains a resin.

The resin is not particularly limited, but is preferably a resin obtained by curing a thermosetting resin. Examples of the resin include a resin obtained by curing components such as the alkali-soluble resin and the polymerizable compound, mentioned as the components which can be contained in the precursor layer of the light reflecting layer in the transfer film according to the first embodiment described above.

The light reflecting layer contains a reflective adjuster.

Examples of the reflective adjuster include the same one as the reflective adjuster described in the transfer film according to the first embodiment, and a suitable aspect thereof is also the same.

A content of the reflective adjuster in the light reflecting layer is preferably 10% to 90% by mass, more preferably 20% to 85% by mass, and still more preferably 30% to 80% by mass with respect to the total mass of the light reflecting layer.

In particular, in a case where the reflective adjuster contains the white pigment, a content of the white pigment is preferably 30% to 80% by mass and more preferably 40% to 70% by mass with respect to the total mass of the light reflecting layer. In addition, in a case where the reflective adjuster contains the metal particles, a content of the metal particles is preferably 20% to 95% by mass and more preferably 30% to 90% by mass with respect to the total mass of the light reflecting layer. In addition, in a case where the reflective adjuster contains the hollow particles, a content of the hollow particles is preferably 20% to 80% by mass and more preferably 30% to 70% by mass with respect to the total mass of the light reflecting layer. In addition, in a case where the reflective adjuster contains the liquid crystal compound (preferably, the liquid crystal particles), a content of the liquid crystal compound (preferably, the liquid crystal particles) is preferably 10% to 90% by mass, more preferably 20% to 80% by mass, and still more preferably 30% to 70% by mass with respect to the total mass of the light reflecting layer.

The light reflecting layer may further contain other components in addition to the above-described components.

The light reflecting layer can be formed, for example, by performing a pattern exposure treatment and a development treatment on the precursor layer of the light reflecting layer as a negative tone photosensitive layer in the transfer film according to the first embodiment described above.

<<Light Absorbing Layer>>

<Characteristics of Light Absorbing Layer>

It is preferable that the light absorbing layer satisfies a characteristic 3 and/or a characteristic B. In particular, in a case where the LED in the light emitting element is the visible light LED, from the viewpoint of more excellent antireflection property of external light, the light absorbing layer is preferably a layer satisfying the characteristic 3, and in a case where the LED in the light emitting element is the UV-LED, from the viewpoint of more excellent suppression property of stray light and more excellent antireflection property of external light, the light absorbing layer is preferably a layer satisfying the characteristic B.

(Characteristic 3)

An optical density (OD) of the light absorbing layer at a wavelength of 550 nm is preferably 0.5 or more, more preferably 1.0 or more, still more preferably 2.0 or more, and particularly preferably 3.0 or more. The upper limit value thereof is not particularly limited, but is, for example, preferably 6.0 or less. The optical density of the light absorbing layer can be measured using a Macbeth densitometer (manufactured by Macbeth, TD-904, using a visual filter), or the like.

(Characteristic B)

An optical density (OD) of the light absorbing layer at a wavelength of 385 nm is preferably 0.5 or more, more preferably 1.0 or more, still more preferably 2.0 or more, and particularly preferably 3.0 or more. The upper limit value thereof is not particularly limited, but is, for example, preferably 6.0 or less. The optical density of the light absorbing layer at a wavelength of 385 nm can be measured using an ultraviolet spectrophotometer U-3310 (manufactured by Hitachi, Ltd.), or the like.

<Thickness of Light Absorbing Layer>

A thickness of the light absorbing layer is preferably 1 μm or more, and more preferably 2 μm or more. The upper limit value thereof is not particularly limited, but is, for example, preferably 10 μm or less and more preferably 5 μm or less.

<Components of Light Absorbing Layer>

The light absorbing layer contains a resin.

The resin is not particularly limited, but is preferably a resin obtained by curing a thermosetting resin. Examples of the resin include a resin obtained by curing components such as the alkali-soluble resin and the polymerizable compound, mentioned as the components which can be contained in the precursor layer of the light reflecting layer in the transfer film according to the first embodiment described above.

The light absorbing layer contains a light absorbing substance.

Examples of the light absorbing substance include the same one as the light absorbing substance described in the transfer film according to the first embodiment, and a suitable aspect thereof is also the same.

A content of the light absorbing substance in the light absorbing layer is preferably 5% to 80% by mass, more preferably 10% to 70% by mass, and still more preferably 20% to 60% by mass with respect to the total mass of the light absorbing layer.

The light absorbing layer may further contain other components in addition to the above-described components.

The light absorbing layer can be formed, for example, by performing a pattern exposure treatment and a development treatment on the precursor layer of the light absorbing layer as a negative tone photosensitive layer in the transfer film according to the first embodiment described above.

<<Light Emitting Element>>

Examples of the light emitting element include an LED chip.

From the viewpoint that the effects of the present invention are more excellent, it is preferable that the total thickness of the light reflecting layer and the light absorbing layer is larger than the thickness of the light emitting element.

Laminate According to Second Embodiment

The laminate according to a second embodiment includes, in the following order, a base material, a resin layer, and a light absorbing layer, in which a thickness of the resin layer is 3 μm or more, the light absorbing layer has a first opening portion which penetrates in a thickness direction of the light absorbing layer, the resin layer has a second opening portion which penetrates in a thickness direction of the resin layer and communicates with the first opening portion, the laminate further includes a light emitting element which is disposed on the base material exposed through the second opening portion, and the laminate further includes a first light reflecting layer on an inner wall surface of the second opening portion of the resin layer.

In a case where the laminate according to the second embodiment is applied to a display element, the display element including the laminate according to the second embodiment has excellent black density in a case of black display and has excellent brightness in a case of white display. The case where the display element is in white display is intended to mean that the light emitting element in the laminate is in the light-on state, and the case where the display element is in black display state is intended to mean that the light emitting element in the laminate is in the light-off state. That is, the case where the display element is in white display or black display does not intend to indicate light emission color of the light emitting element in the laminate.

In addition, the LED may be, for example, an LED having a peak wavelength in a visible light region (hereinafter, also referred to as "visible light LED"), or an LED having a peak wavelength in an ultraviolet region (hereinafter, also referred to as "UV-LED").

Hereinafter, the fact that, in a case where the laminate according to the second embodiment is applied to a display element, the display element is more excellent in black density in a case of black display and is more excellent in brightness in a case of white display, and/or the fact that the display element has more excellent contrast in a bright room (a ratio of brightness (white brightness) in the case of white display to brightness (black brightness) in the case of black display in a bright room environment) is also referred to as "effects of the present invention are more excellent".

Hereinafter, a configuration of the laminate according to the second embodiment will be described in more detail with reference to FIGS. 6 and 7.

Figure 6:
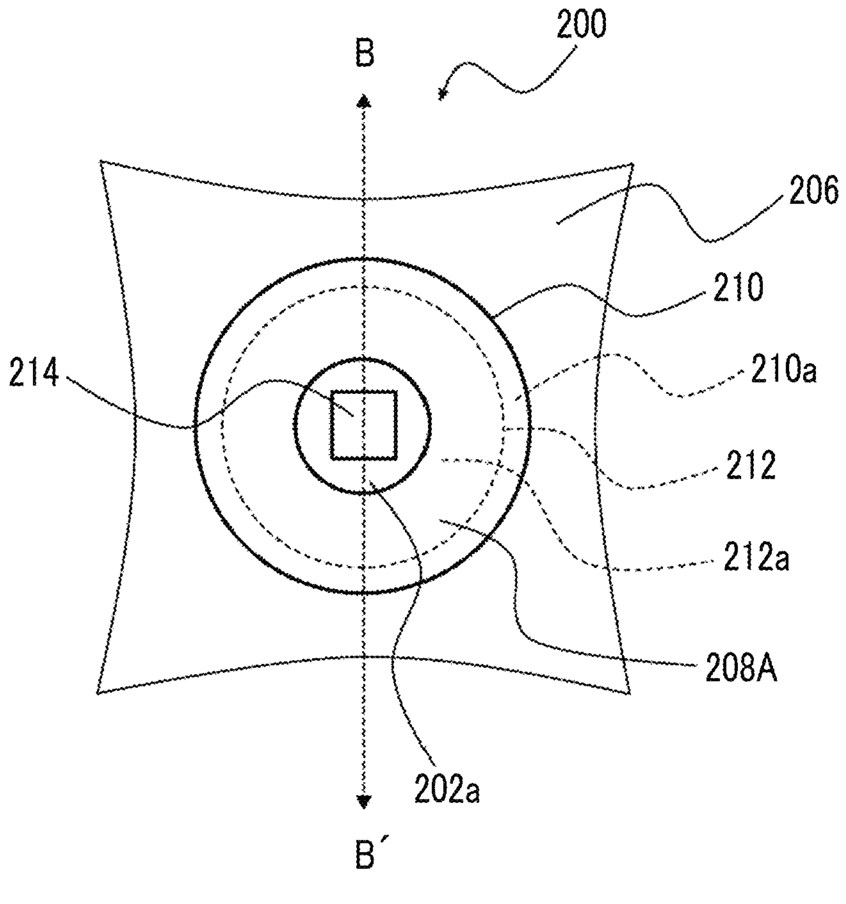
FIG. 6 is a top schematic view showing an example of a laminate according to a second embodiment.
Figure 7:
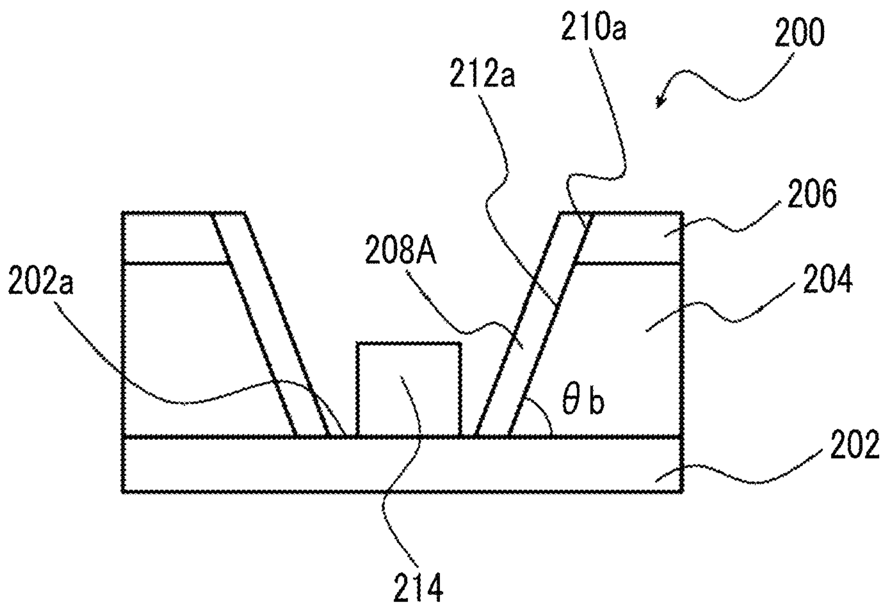
FIG. 7 is a schematic cross-sectional view taken along a B-B' cross section in FIG. 6.

FIG. 6 is a top schematic view showing an example of the laminate according to the second embodiment, and FIG. 7 is a schematic cross-sectional view taken along a B-B' cross section in FIG. 6.

A laminate 200 shown in FIGS. 6 and 7 includes a base material 202, a resin layer 204 having a thickness of 3 μm or more, and a light absorbing layer 206 in this order. The light absorbing layer 206 has a first opening portion 210 which penetrates in a thickness direction of the light absorbing layer 206. The resin layer 204 has a second opening portion 212 which penetrates in a thickness direction of the resin layer 204 and communicates with the first opening portion 210.

An inner wall surface 212*a* of the second opening portion 212 of the resin layer 204 is inclined such that an area of the second opening portion 212 is continuously reduced from a surface on the light absorbing layer 206 side toward a surface of the base material 202 side. In other words, an angle θb between the inner wall surface 212*a* and the base material 202 is less than 90°. In addition, in the laminate 200, an inner wall surface 210*a* of the first opening portion 210 of the light absorbing layer 206 is inclined such that an area of the first opening portion 210 is continuously reduced from a surface on an air interface side toward a surface on the resin layer 204 side, so that the inner wall surface 210*a* is present in substantially the same plane as the inner wall surface 212*a*.

A first light reflecting layer 208A is disposed on the inner wall surface 210*a* of the light absorbing layer 206 and the inner wall surface 212*a* of the resin layer 204 so as to cover the inner wall surface 210*a* and the inner wall surface 212*a*.

A light emitting element 214 is disposed on an exposed surface 202*a* of the base material 202 exposed through the second opening portion 212.

In a case where the laminate according to the second embodiment is applied to a display element, the display element has excellent black density in a case of black display and also has excellent brightness in a case of white display.

An estimated action mechanism of the laminate according to the second embodiment is as follows. In a case where the display element (not shown) is in white display (the light emitting element 214 is in a light-on state), light emitted from the light emitting element 214 is reflected by the first light reflecting layer 208A, and light reflection efficiency (light extraction efficiency) is improved, and as a result, the brightness is increased. On the other hand, in a case where the display element is in black display (the light emitting element 214 is in a light-off state), reflection of external light is suppressed by the light absorbing layer 206, and the black density is excellent. Furthermore, in a case where the display element is in white display, the light absorbing layer 206 also has a function of absorbing stray light which is erroneously incident into the first light reflecting layer 208A.

Shapes of the first opening portion 210 and the second opening portion 212 are not particularly limited, and examples thereof include a circle and a quadrangular.

An area of the exposed surface 202*a* of the base material 202 exposed through the second opening portion 212 is, for example, preferably 100 to 2,500 $\mu m^2$. Sizes of the first opening portion 210 and the second opening portion 212 can be appropriately set, for example, in relation to the area of the exposed surface 202*a* of the base material 202 exposed through the second opening portion 212 and the angle θb between the inner wall surface 212*a* and the base material 202.

In addition, in the laminate 200, the angle θb between the inner wall surface 212*a* and the base material 202 is set to be less than 90°, but may be 90°. From the viewpoint that the effects of the present invention are more excellent, θb is preferably less than 90°, preferably 10° to 80°, more preferably 15° to 80°, and still more preferably 20° to 80°.

The angle θb between the inner wall surface 212*a* and the base material 202 corresponds to an angle between a projection surface obtained by projecting the inner wall surface 212*a* onto the base material 202 and the inner wall surface 212*a*.

The inner wall surface 212*a* of the second opening portion 212 of the resin layer 204 is inclined such that the area of the second opening portion 212 is continuously reduced from the surface on the light absorbing layer 206 side toward the surface of the base material 202 side. A reduction rate of the area of the second opening portion 212 can be appropriately set such that the angle θb between the inner wall surface 212*a* and the base material 202 is to be a predetermined angle.

In addition, the inner wall surface 210*a* of the first opening portion 210 of the light absorbing layer 206 is inclined such that the area of the first opening portion 210 is continuously reduced from the surface on the air interface side toward the surface on the resin layer 204 side, so that the inner wall surface 210*a* is present in substantially the same plane as the inner wall surface 212*a*. A reduction rate of the area of the first opening portion 210 can be appropriately set such that the inner wall surface 210*a* is present in substantially the same plane as the inner wall surface 212*a* (in other words, an angle between the plane including the inner wall surface 210*a* and the base material 202 and the angle θb between the inner wall surface 212*a* and the base material 202 are substantially the same).

Hereinafter, each element constituting the laminate according to the second embodiment will be described.

The base material, the light emitting element, and the light absorbing layer, constituting the laminate according to the second embodiment, are the same as the base material, the light emitting element, and the light absorbing layer, constituting the laminate according to the first embodiment, and suitable aspects thereof are also the same. Therefore, hereinafter, the resin layer and the light reflecting layer will be mainly described.

In the laminate according to the second embodiment, from the viewpoint that the effects of the present invention are more excellent, it is preferable that the total thickness of the resin layer and the light absorbing layer is larger than the thickness of the light emitting element.

<<Resin Layer>>

<Thickness of Resin Layer>

The thickness of the resin layer is 3 μm or more, and is preferably 5 μm or more, more preferably 10 μm or more, and still more preferably 16 μm or more. The upper limit value thereof is not particularly limited, but is, for example, preferably 100 μm or less and more preferably 50 μm or less.

<Components of Resin Layer>

The resin layer is a layer formed of a resin as a main component.

The resin constituting the resin layer is not particularly limited, but is preferably a resin obtained by curing a thermosetting resin. Examples of the resin include a resin obtained by curing components such as the alkali-soluble resin and the polymerizable compound, mentioned as the components which can be contained in the precursor layer of the light reflecting layer in the transfer film according to the first embodiment described above.

The resin layer may further contain other components in addition to the above-described components.

The resin layer can be formed, for example, by performing a pattern exposure treatment and a development treatment on a negative tone photosensitive layer in the transfer film according to the second embodiment described later.

<<Light Reflecting Layer>>

<Thickness of Light Reflecting Layer>

The thickness of the light reflecting layer is preferably 10 nm or more, more preferably 50 nm or more, and still more preferably 250 nm or more. The upper limit value thereof is not particularly limited, but for example, is preferably 100 μm or less, more preferably 50 μm or less, still more preferably 10 μm or less, particularly preferably 1 μm or less, and most preferably 800 nm or less.

The light reflecting layer preferably contains a metal.

A type of the metal is not particularly limited, but from the viewpoint of having high reflectivity, silver, nickel, cobalt, iron, copper, palladium, gold, platinum, tin, zinc, aluminum, tungsten, or titanium is preferable; silver, gold, tin, nickel, aluminum, or cobalt is more preferable; and from the viewpoint of exhibiting higher reflectivity in the visible light region, gold, silver, or aluminum is still more preferable, and silver is particularly preferable.

A method of forming the light reflecting layer is not particularly limited, and a sputtering method, a vapor deposition method, a plating method, printing with an ink containing metal particles (screen printing, ink jet printing, or the like), or the like can be adopted. In addition, the light reflecting layer may be formed by patterning such that only necessary portions are left by a known method such as wet etching and dry etching.

The light reflecting layer is preferably a layer which satisfies at least one of the following characteristic C or characteristic D. In particular, in a case where the LED in the light emitting element is a visible light LED, the light reflecting layer is preferably a layer which satisfies the characteristic C, and in a case where the LED in the light emitting element is an UV-LED, the light reflecting layer is preferably a layer which satisfies the characteristic D.

(Characteristic C)

An integral reflectance of the light reflecting layer with respect to visible light having a wavelength of 400 to 700 nm is preferably 60% or more. The integral reflectance with respect to visible light having a wavelength of 400 to 700 nm is a value measured using a spectrophotometer with respect to a light reflecting layer having a thickness of 30 μm at 25° C. As the spectrophotometer, for example, a spectrophotometer V-570 manufactured by JASCO Corporation can be used.

The above-described integral reflectance with respect to visible light having a wavelength of 400 to 700 nm is preferably 80% or more. The upper limit value thereof is 100% or less.

(Characteristic D)

A reflectivity of the light reflecting layer at a wavelength of 385 nm is preferably 60% or more, and more preferably 80% or more. The upper limit value thereof is 100% or less. The reflectivity at a wavelength of 385 nm is a value measured using a spectrophotometer with respect to a light reflecting layer having a thickness of 30 μm at 25° C. As the spectrophotometer, for example, a spectrophotometer V-570 manufactured by JASCO Corporation can be used.

Modification Example of Laminate According to Second Embodiment

In the laminate 200 shown in FIGS. 6 and 7, the first light reflecting layer 208A is disposed on each surface of the inner wall surface 212*a* of the second opening portion 212 of the resin layer 204 and the inner wall surface 210*a* of the first opening portion 210 of the light absorbing layer 206, but the first light reflecting layer 208A may be disposed only on the inner wall surface 212*a* of the second opening portion 212 of the resin layer 204.

Figure 8:
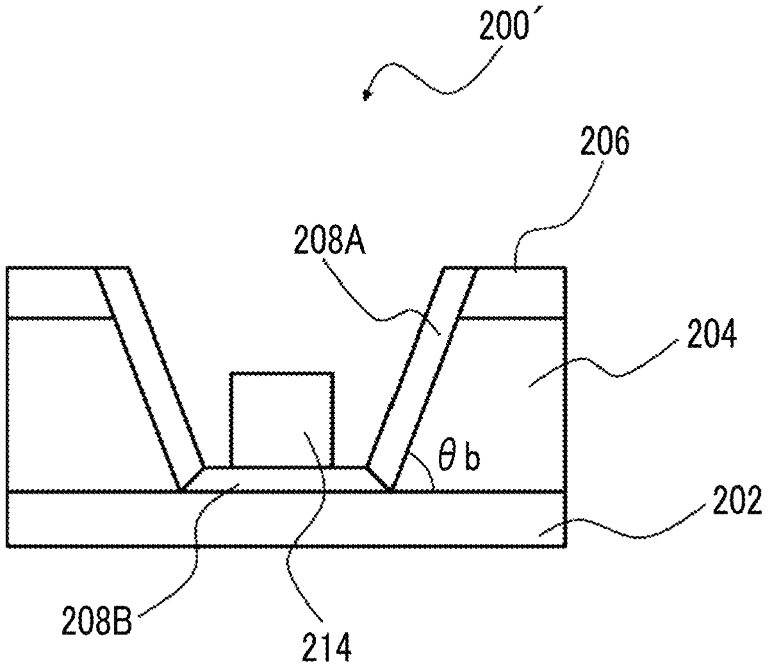
FIG. 8 is a schematic cross-sectional view showing another example of the laminate according to the second embodiment.

In addition, as a laminate 200' shown in FIG. 8, a second light reflecting layer 208B may be provided between the base material 202 exposed through the second opening portion 212 of the resin layer 204 (corresponding to the exposed surface 202*a* of the base material 202 exposed through the second opening portion 212 of the resin layer 204 in FIGS. 6 and 7) and the light emitting element 214.

The first light reflecting layer 208A and the second light reflecting layer 208B may be integrally provided of the same material, or may be respectively provided of different materials.

Transfer Film According to Second Embodiment

The transfer film according to a second embodiment includes, in the following order, a temporary support, a photosensitive precursor layer of a light absorbing layer, and a photosensitive layer, in which a thickness of the photosensitive layer is 3 μm or more.

The above-described laminate according to the second embodiment includes the resin layer and the light absorbing layer in order from the base material. The transfer film according to the second embodiment can be applied to formation of the resin layer and the light absorbing layer of the laminate according to the second embodiment described above. That is, the transfer film according to the second embodiment may be transferred onto a predetermined base material which may have a light emitting element, and by performing a pattern exposure treatment and a development treatment, a resin layer (layer derived from the photosensitive layer) having a predetermined opening portion and a light absorbing layer (layer derived from the precursor layer of the light absorbing layer) can be formed on the base material.

Hereinafter, the configuration of the transfer film according to the second embodiment will be described in more detail with reference to the accompanying drawings.

Figure 9:
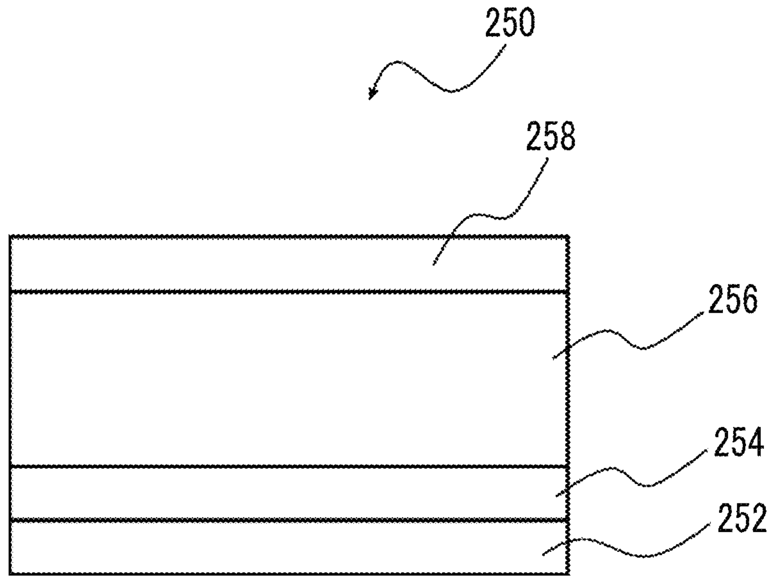
FIG. 9 is a schematic cross-sectional view showing an example of a transfer film according to a second embodiment.

FIG. 9 is a schematic cross-sectional view showing an example of the transfer film according to the second embodiment.

A transfer film 250 shown in FIG. 9 includes a temporary support 252, a precursor layer 254 of a light absorbing layer, a photosensitive layer 256 having a thickness of 3 μm or more, and a protective film 258 in this order.

The precursor layer 254 of the light absorbing layer and the photosensitive layer 256 are layers exhibiting photosensitivity, and may be either a positive tone photosensitive layer or a negative tone photosensitive layer, but are preferably a negative tone photosensitive layer.

The transfer film 250 shown in FIG. 9 is in a form in which the protective film 258 is disposed, but the protective film 258 may not be disposed.

In addition, in the transfer film 250 shown in FIG. 9, the photosensitive layer 256 and the precursor layer 254 of the light absorbing layer are in contact with each other, but an interlayer (not shown) may be further disposed between the photosensitive layer 256 and the precursor layer 254 of the light absorbing layer. Examples of the interlayer include the same one as the interlayer which can be included in the transfer film according to the first embodiment described above.

Hereinafter, each element constituting the transfer film according to the second embodiment will be described.

The temporary support, the precursor layer of the light absorbing layer, the interlayer, and the protective film, constituting the transfer film according to the second embodiment, are the same as the temporary support, the light precursor layer of the light absorbing layer, the interlayer, and the protective film, constituting the transfer film according to the first embodiment, and suitable aspects thereof are also the same.

Hereinafter, the photosensitive layer constituting the laminate according to the second embodiment will be described in detail.

<<Photosensitive Layer>>

<Components of Photosensitive Layer>

The photosensitive layer may be either a positive tone photosensitive layer or a negative tone photosensitive layer, but is preferably a negative tone photosensitive layer. In a case where the photosensitive layer is a negative tone photosensitive layer, it is preferable that the photosensitive layer is configured to contain, for example, at least an alkali-soluble resin, a polymerizable compound, and a photopolymerization initiator.

Hereinafter, components which can be contained in the photosensitive layer will be described in detail.

—Alkali-Soluble Resin—

The photosensitive layer preferably contains an alkali-soluble resin. Examples of the alkali-soluble resin contained in the photosensitive layer include the same one as the alkali-soluble resin which can be contained in the precursor layer of the light reflecting layer in the transfer film according to the first embodiment described above, and a suitable aspect thereof is also the same.

A lower limit value of a content of the alkali-soluble resin is preferably 10.0% by mass or more, more preferably 15.0% by mass or more, still more preferably 20.0% by mass or more, and particularly preferably 30.0% by mass or more with respect to the total mass of the photosensitive layer. In addition, an upper limit value thereof is preferably 90.0% by mass or less, more preferably 80.0% by mass or less, still more preferably 75.0% by mass or less, and particularly preferably 70.0% by mass or less.

—Polymerizable Compound—

The photosensitive layer preferably contains a polymerizable compound. Examples of the polymerizable compound contained in the photosensitive layer include the same one as the polymerizable compound which can be contained in the precursor layer of the light reflecting layer in the transfer film according to the first embodiment described above, and a suitable aspect thereof is also the same.

The lower limit value of the content of the polymerizable compound (particularly, the ethylenically unsaturated compound) in the photosensitive layer is preferably 10.0% by mass or more and more preferably 15.0% by mass or more with respect to the total mass of the photosensitive layer. In addition, the upper limit value thereof is preferably 70.0% by mass or less, more preferably 60.0% by mass or less, still more preferably 50.0% by mass or less, and particularly preferably 40.0% by mass or less.

—Photopolymerization Initiator—

The photosensitive layer preferably contains a photopolymerization initiator. Examples of the photopolymerization initiator contained in the photosensitive layer include the same one as the photopolymerization initiator which can be contained in the precursor layer of the light reflecting layer in the transfer film according to the first embodiment described above, and a suitable aspect thereof is also the same.

In a case where the photosensitive layer contains the photopolymerization initiator, a content of the photopolymerization initiator is preferably 0.01% by mass or more, more preferably 0.1% by mass or more, and still more preferably 0.5% by mass or more with respect to the total mass of the photosensitive layer. In addition, the upper limit value thereof is preferably 10.0% by mass or less and more preferably 5.0% by mass or less with respect to the total mass of the photosensitive layer.

—Heterocyclic Compound—

The photosensitive layer may contain a heterocyclic compound.

Examples of the heterocyclic compound contained in the photosensitive layer include the same one as the heterocyclic compound which can be contained in the precursor layer of the light reflecting layer in the transfer film according to the first embodiment described above, and a suitable aspect thereof is also the same.

In a case where the photosensitive layer contains the heterocyclic compound, a content of the heterocyclic compound is preferably 0.01% to 20.0% by mass, more preferably 0.10% to 10.0% by mass, still more preferably 0.30% to 8.0% by mass, and particularly preferably 0.50% to 5.0% by mass with respect to the total mass of the photosensitive layer.

—Aliphatic Thiol Compound—

The photosensitive layer may contain an aliphatic thiol compound.

Examples of the aliphatic thiol compound contained in the photosensitive layer include the same one as the aliphatic thiol compound which can be contained in the precursor layer of the light reflecting layer in the transfer film according to the first embodiment described above, and a suitable aspect thereof is also the same.

In a case where the photosensitive layer contains the aliphatic thiol compound, a content of the aliphatic thiol compound is preferably 5% by mass or more, more preferably 5% to 50% by mass, still more preferably 5% to 30% by mass, and particularly preferably 8% to 20% by mass with respect to the total mass of the photosensitive layer.

—Thermal Crosslinking Compound—

From the viewpoint of hardness of a cured film to be obtained and pressure-sensitive adhesiveness of an uncured film to be obtained, it is also preferable that the photosensitive layer contains a thermal crosslinking compound.

Examples of the thermal crosslinking compound contained in the photosensitive layer include the same one as the thermal crosslinking compound which can be contained in the precursor layer of the light reflecting layer in the transfer film according to the first embodiment described above, and a suitable aspect thereof is also the same.

In a case where the photosensitive layer contains the thermal crosslinking compound, a content of the thermal crosslinking compound is preferably 1.0% to 50.0% by mass, more preferably 5.0% to 30.0% by mass, and still more preferably 5.0% to 25.0% by mass with respect to the total mass of the photosensitive layer.

—Surfactant—

The photosensitive layer may contain a surfactant.

Examples of the surfactant contained in the photosensitive layer include the same one as the surfactant which can be contained in the precursor layer of the light reflecting layer in the transfer film according to the first embodiment described above, and a suitable aspect thereof is also the same.

In a case where the photosensitive layer includes the surfactant, a content of the surfactant is preferably 0.01% to 3.0% by mass, more preferably 0.01% to 1.0% by mass, and still more preferably 0.05% to 0.80% by mass with respect to the total mass of the photosensitive layer.

—Polymerization Inhibitor—

The photosensitive layer may contain a polymerization inhibitor.

Examples of the polymerization inhibitor contained in the photosensitive layer include the same one as the polymerization inhibitor which can be contained in the precursor layer of the light reflecting layer in the transfer film according to the first embodiment described above, and a suitable aspect thereof is also the same.

In a case where the photosensitive layer contains the polymerization inhibitor, a content of the polymerization inhibitor is preferably 0.001% to 5.0% by mass, more preferably 0.01% to 3.0% by mass, and still more preferably 0.02% to 2.0% by mass with respect to the total mass of the photosensitive layer. The content of the polymerization inhibitor is preferably 0.005% by mass to 5.0% by mass, more preferably 0.01% by mass to 3.0% by mass, and still more preferably 0.01% by mass to 1.0% by mass with respect to the total mass of the polymerizable compound.

—Hydrogen Donating Compound—

The photosensitive layer may contain a hydrogen donating compound.

Examples of the hydrogen donating compound contained in the photosensitive layer include the same one as the hydrogen donating compound which can be contained in the precursor layer of the light reflecting layer in the transfer film according to the first embodiment described above, and a suitable aspect thereof is also the same.

In a case where the photosensitive layer contains the hydrogen donating compound, from the viewpoint of improving a curing rate by balancing the polymerization growth rate and chain transfer, a content of the hydrogen donating compound is preferably 0.01% to 10.0% by mass, more preferably 0.01% to 8.0% by mass, and still more preferably 0.03% to 5.0% by mass with respect to the total mass of the photosensitive layer.

—Impurities and the Like—

The photosensitive layer may contain a predetermined amount of impurities.

Examples of the impurities include sodium, potassium, magnesium, calcium, iron, manganese, copper, aluminum, titanium, chromium, cobalt, nickel, zinc, tin, halogen, and ions of these. Among these, halide ion, sodium ion, and potassium ion are easily mixed as impurities, so that the following content is preferable.

A content of the impurities in the photosensitive layer is preferably 80 ppm or less, more preferably 10 ppm or less, and still more preferably 2 ppm or less on a mass basis. The content of the impurities in the photosensitive layer may be 1 ppb or more or 0.1 ppm or more on a mass basis.

Examples of a method of setting the impurities in the above-described range include selecting a raw material having a low content of impurities as a raw material for the photosensitive layer, preventing the impurities from being mixed in a case of forming the photosensitive layer, and washing and removing the impurities. By such a method, the amount of impurities can be kept within the above-described range.

The impurities can be quantified by a known method such as inductively coupled plasma (ICP) emission spectroscopy, atomic absorption spectroscopy, and ion chromatography.

In the photosensitive layer, it is preferable that a content of compounds such as benzene, formaldehyde, trichloroethylene, 1,3-butadiene, carbon tetrachloride, chloroform, N,N-dimethylformamide, N,N-dimethylacetamide, and hexane is low. The content of these compounds in the photosensitive layer is preferably 100 ppm or less, more preferably 20 ppm or less, and still more preferably 4 ppm or less on a mass basis. The lower limit thereof may be 10 ppb or more or 100 ppb or more on a mass basis. The content of these compounds can be suppressed in the same manner as in the above-described metal as impurities. In addition, the compounds can be quantified by a known measurement method.

From the viewpoint of improving reliability and laminating property, the content of water in the photosensitive layer is preferably 0.01% to 1.0% by mass and more preferably 0.05% to 0.5% by mass.

—Residual Monomer—

The photosensitive layer may contain a residual monomer of each constitutional unit in the above-described alkali-soluble resin.

From the viewpoint of patterning properties and reliability, a content of the residual monomer is preferably 5,000 ppm by mass or less, more preferably 2,000 ppm by mass or less, and still more preferably 500 ppm by mass or less with respect to the total mass of the alkali-soluble resin. The lower limit is not particularly limited, but is preferably 1 ppm by mass or more and more preferably 10 ppm by mass or more.

From the viewpoint of patterning properties and reliability, the residual monomer of each constitutional unit in the alkali-soluble resin is preferably 3,000 ppm by mass or less, more preferably 600 ppm by mass or less, and still more preferably 100 ppm by mass or less with respect to the total mass of the photosensitive layer. The lower limit is not particularly limited, but is preferably 0.1 ppm by mass or more and more preferably 1 ppm by mass or more.

It is preferable that the amount of residual monomer of the monomer in a case of synthesizing the alkali-soluble resin by the polymer reaction is also within the above-described range. For example, in a case where glycidyl acrylate is reacted with a carboxylic acid side chain to synthesize the alkali-soluble resin, the content of glycidyl acrylate is preferably within the above-described range.

The amount of residual monomers can be measured by a known method such as liquid chromatography and gas chromatography.

—Other Components—

The photosensitive layer may contain a component other than the above-mentioned components (hereinafter, also referred to as "other components"). Examples of the other components include a colorant, an antioxidant, particles (for example, metal oxide particles), a sensitizer, and a chain transfer agent. In addition, examples of the other components also include other additives described in paragraphs [0058] to [0071] of JP2000-310706A.

The type and content of the colorant, antioxidant, and particles contained in the photosensitive layer are the same as the type and content of the colorant, antioxidant, and particles, which can be contained in the precursor layer of the light reflecting layer in the transfer film according to the first embodiment described above, and suitable aspects thereof are also the same.

<Thickness of Photosensitive Layer>

The thickness of the photosensitive layer is 3 μm or more, and is preferably 5 μm or more, more preferably 10 μm or more, and still more preferably 16 μm or more. The upper limit value thereof is not particularly limited, but is, for example, preferably 100 μm or less and more preferably 50 μm or less.

Manufacturing Method of Transfer Film According to Second Embodiment

The manufacturing method of the transfer film according to the second embodiment is not particularly limited, and a known method can be used.

Examples of the manufacturing method of the transfer film according to the second embodiment shown in FIG. 9 include a method including a step of applying a composition for forming the precursor layer of the light absorbing layer onto a surface of the temporary support to form a coating film, and then drying the coating film to form the precursor layer of the light absorbing layer; as an optional step, a step of applying a composition for forming the interlayer onto a surface of the precursor layer of the light absorbing layer to form a coating film, and then drying the coating film to form the interlayer; and a step of applying a composition for forming the photosensitive layer onto a surface of the precursor layer of the light absorbing layer (in a case of including the interlayer, a surface of the interlayer) to form a coating film, and then drying the coating film to form the photosensitive layer.

Examples of a method of forming the composition for forming the precursor layer of the light absorbing layer and method of forming the precursor layer of the light absorbing layer, and a method of forming the composition for forming the photosensitive layer and method of forming the photosensitive layer include the same method as the method of forming the composition for forming the precursor layer of the light absorbing layer and method of forming the precursor layer of the light absorbing layer in the transfer film according to the first embodiment described above, and suitable aspects thereof are also the same.

Examples of a method of forming the composition for forming the interlayer and method of forming the interlayer include the same method as the method of forming the composition for forming the interlayer and method of forming the interlayer in the transfer film according to the first embodiment described above, and suitable aspects thereof are also the same.

In addition, in a case where the transfer film according to the second embodiment, shown in FIG. 9, further includes the protective film on a surface of the photosensitive layer opposite to the temporary support, the manufacturing method of the transfer film according to the second embodiment includes a step of providing the protective film to be in contact with the surface of the photosensitive layer opposite to the temporary support.

After manufacturing the transfer film according to the second embodiment by the above-described manufacturing method, a roll-shaped transfer film according to the second embodiment may be produced and stored by winding the transfer film according to the second embodiment. The roll-shaped transfer film according to the second embodiment is provided as it is in a bonding step described later with the substrate in a roll-to-roll method.

Examples of the protective film bonding step include the same forming method as the protective film bonding step in the transfer film according to the first embodiment described above, and a suitable aspect thereof is also the same.

In addition, as the manufacturing method of the transfer film according to the second embodiment shown in FIG. 9, a method in which the photosensitive layer is formed on the protective film, and then the precursor layer of the light absorbing layer is formed on the surface of the photosensitive layer may be used. In addition, as the manufacturing method of the transfer film according to the second embodiment shown in FIG. 9, a method in which the precursor layer of the light absorbing layer is formed on the temporary support and the photosensitive layer is separately formed on the protective film separately, and then the precursor layer of the light absorbing layer and the photosensitive layer are bonded to each other may be used.

Manufacturing Method of Laminate Using Transfer Film According to Second Embodiment As described above, the transfer film according to the second embodiment can be applied to formation of the resin layer and the light absorbing layer in the manufacturing of the laminate according to the second embodiment described above. Specifically, the transfer film according to the second embodiment may be transferred onto a predetermined base material which may have a light emitting element, and by performing a pattern exposure treatment and a development treatment, a resin layer (layer derived from the photosensitive layer) having a predetermined opening portion and a light absorbing layer (layer derived from the precursor layer of the light absorbing layer) can be formed on the base material.

Hereinafter, the manufacturing method of the laminate according to the second embodiment using the transfer film according to the second embodiment will be described in detail.

The manufacturing method of the laminate according to the second embodiment includes: a bonding step of bonding the transfer film according to the second embodiment to a base material by bringing a surface of the transfer film on a side opposite to the temporary support into contact with the base material to obtain a precursor layer-attached base material including the base material, the photosensitive layer, the precursor layer of the light-absorbing layer, and the temporary support in this order; an exposing step of exposing the photosensitive layer and the precursor layer of the light-absorbing layer in the precursor layer-attached base material; and a developing step of developing the exposed photosensitive layer and the exposed precursor layer of the light-absorbing layer to form a light absorbing layer having a first opening portion penetrating in a thickness direction and a resin layer having a second opening portion penetrating in a thickness direction and communicating with the first opening portion, in which the manufacturing method further includes, between the bonding step and the exposing step or between the exposing step and the developing step, a peeling step of peeling the temporary support from the precursor layer-attached base material, a light reflecting layer forming step of forming a light reflecting layer on at least an inner wall surface of the second opening portion of the resin layer, and in a case where the base material includes no light emitting element on an exposed surface exposed through the second opening portion, a light emitting element disposing step of disposing the light emitting element on the exposed surface.

Hereinafter, the procedure of the above-described steps will be specifically described. In the following description, a layer excluding the protective film formed on the temporary support of the transfer film according to the second embodiment may be referred to as "composition layer".

[Bonding Step]

The bonding step is a step of bonding the transfer film according to the second embodiment to the base material such that a surface of the transfer film according to the second embodiment opposite to the temporary support of the transfer film (in other words, a surface of the composition layer) and the base material are in contact with each other, to obtain a precursor layer-attached base material including the base material, the composition layer (the composition layer includes the photosensitive layer and the precursor layer of the light absorbing layer from the base material side), and the temporary support in this order.

In a case where the transfer film according to the second embodiment has a configuration of including the protective film, the protective film is peeled off and then the bonding step is performed.

A specific procedure of the bonding step is the same as the bonding step in [Manufacturing method of laminate using transfer film according to first embodiment] described above, and a suitable aspect thereof is also the same.

In addition, the base material which can be used in the bonding step is the same as the base material which can be used in the bonding step in [Manufacturing method of laminate using transfer film according to first embodiment] described above, and a suitable aspect thereof is also the same. The base material may be a base material on which the light emitting element has already been mounted, or may be a base material on which the light emitting element has not been mounted. In a case where the base material on which the light emitting element has not been mounted is used, after the exposing step, developing step, and light reflecting layer forming step are performed, a step of disposing the light emitting element in the second opening portion of the resin layer is performed.

[Exposing Step]

The exposing step is a step of exposing the composition layer including the precursor layer of the light absorbing layer and the photosensitive layer in a patterned manner. Here, the "exposure in a patterned manner" refers to exposure in a form of performing the exposure in a patterned manner, that is, a form in which an exposed portion and a non-exposed portion are present.

A positional relationship between the exposed portion and the non-exposed portion in the exposure in a patterned manner is not particularly limited and is appropriately adjusted.

In a case where the exposing step is performed using a mask, typically, a cured film having a predetermined opening portion in a thickness direction is obtained according to a mask pattern. For example, in a case where the laminate according to the second embodiment is manufactured using the transfer film according to the second embodiment that the photosensitive layer and the precursor layer of the light absorbing layer, which are negative tone photosensitive layers, are included, a composition layer located at an opening portion of the mask is exposed to be cured, and a composition layer located at a non-opening portion of the mask is not exposed and is removed by the developing step described later. That is, by passing through the exposing step, a cured film having an opening portion penetrating in a thickness direction can be formed at a position corresponding to the non-opening portion of the mask. The pattern shape of the opening portion in the mask may be appropriately set according to a desired shape. As the mask, a mask for through-hole formation can be suitably used.

The exposure may be performed from the side opposite to the base material of the composition layer, or may be performed from the base material side of the composition layer.

As a light source for the exposure, a light source can be appropriately selected and used as long as it can emit light in a wavelength range in which the precursor layer of the light absorbing layer and the photosensitive layer can be cured (for example, 365 nm or 405 nm). Among these, a main wavelength of exposure light for the exposure is preferably 365 nm. The main wavelength is a wavelength having the highest intensity.

Examples of the light source include various lasers, a light emitting diode (LED), an ultra-high pressure mercury lamp, a high pressure mercury lamp, and a metal halide lamp.

An exposure amount is preferably 5 to 200 $mJ/cm^2$ and more preferably 10 to 200 $mJ/cm^2$.

Preferred aspects of the light source, the exposure amount, and the exposing method used for the exposure are described in, for example, paragraphs [0146] and [0147] of WO2018/155193A, the contents of which are incorporated herein by reference.

In addition, in a case where the angle (θb in FIGS. 6 and 7) between the inner wall surface of the resin layer and the base material of the laminate according to the second embodiment is set to less than 90° C., for example, a method of introducing a light scattering plate into an exposure machine, a method of applying exposure light from an oblique direction, and the like can be performed.

[Peeling Step]

The peeling step is a step of peeling off the temporary support from the precursor layer-attached base material, between the bonding step and the exposing step or after the exposing step. In a case where the developing step is performed after the exposing step, the peeling step may be performed after the exposing step and before the developing step.

The peeling method is not particularly limited, and the same mechanism as the cover film peeling mechanism described in paragraphs [0161] and [0162] of JP2010-072589A can be used.

[Developing Step]

The developing step is a step of developing the exposed composition layer to form a pattern.

The development of the above-described composition layer can be performed using a developer.

As the developer, an alkali aqueous solution is preferable. Examples of an alkali compound which can be included in the alkali aqueous solution include sodium hydroxide, potassium hydroxide, sodium carbonate, potassium carbonate, sodium hydrogen carbonate, potassium hydrogencarbonate, tetramethyl ammonium hydroxide, tetraethyl ammonium hydroxide, tetrapropyl ammonium hydroxide, tetrabutylammonium hydroxide, and choline (2-hydroxyethyltrimethylammonium hydroxide).

Examples of the development method include methods such as puddle development, shower development, spin development, and dip development.

Examples of the developer which is suitably used in the present specification include the developer described in paragraph [0194] of WO2015/093271A, and examples of the developing method which is suitably used include the developing method described in paragraph [0195] of WO2015/093271A.

In a case where the photosensitive layer and the precursor layer of the light absorbing layer are negative tone photosensitive layers, a predetermined cured film pattern can be formed by curing the composition layer located at the opening portion of the mask used during the exposure, and then removing the composition layer located at the non-opening portion of the mask. The cured film includes the resin layer and the light absorbing layer in this order from the base material side. The light absorbing layer has a first opening portion which penetrates in a thickness direction, and the resin layer has a second opening portion which penetrates in a thickness direction and communicates with the first opening portion.

As described above, in a case where the exposure is performed by the method of introducing a light scattering plate into an exposure machine, the method of applying exposure light from an oblique direction, and the like, in the cured film to be formed, the angle (Ob in FIGS. 6 and 7) between the inner wall surface of the resin layer and the base material can be less than 90°. That is, the inner wall surface of the second opening portion of the resin layer is inclined such that the area of the second opening portion is continuously reduced from the surface of the light absorbing layer on a side opposite to the base material toward the surface of the base material side. In addition, the inner wall surface of the first opening portion of the light absorbing layer is inclined such that the area of the first opening portion is continuously reduced from the surface on the air interface side toward the surface on the resin layer side, so that the inner wall surface of the first opening portion is present in substantially the same plane as the inner wall surface of the resin layer.

[Post-Exposing Step and Post-Baking Step]

The above-described manufacturing method of a laminate may include an exposing step of exposing the pattern obtained by the above-described developing step (post-exposing step) and/or a step of heating (post-baking step) the pattern.

In a case where both of the post-exposing step and the post-baking step are included, it is preferable that the post-baking is performed after the post-exposure.

An exposure amount of the post-exposure is preferably 100 to 5,000 $mJ/cm^2$ and more preferably 200 to 3,000 $mJ/cm^2$.

A temperature of the post-baking is preferably 80° C. to 250° C. and more preferably 90° C. to 160° C.

A post-baking time is preferably 1 to 180 minutes and more preferably 10 to 60 minutes.

[Light Reflecting Layer Forming Step]

The above-described manufacturing method of the laminate includes a step of forming a light reflecting layer on at least an inner wall surface of the resin layer formed on the base material, after the developing step.

The light reflecting layer may be formed on inner wall surfaces of both the resin layer and the light absorbing layer, which are formed on the base material. In addition, in a case where the light emitting element is not disposed (not mounted) on the base material, the light reflecting layer may be formed on the inner wall surfaces of the resin layer and the light absorbing layer formed on the base material, and on the exposed surface of the base material exposed through the opening portion of the resin layer by the development treatment. The light reflecting layer disposed on the inner wall surface of the resin layer and/or the light absorbing layer corresponds to the first light reflecting layer 208A in FIGS. 6 and 7; and the light reflecting layer disposed on the exposed surface of the base material exposed through the opening portion of the resin layer corresponds to the second light reflecting layer 208B in FIG. 8.

A step of forming the light reflecting layer is not particularly limited, and a sputtering method, a vapor deposition method, a plating method, printing with an ink containing metal particles (screen printing, ink jet printing, or the like), or the like can be adopted. In addition, the light reflecting layer may be formed by patterning such that only necessary portions are left by a known method such as wet etching and dry etching.

By performing the above-described step, the first light reflecting layer and the second light reflecting layer can be formed. In a case where the light emitting element is not disposed (not mounted) on the base material, it is also preferable that the first light reflecting layer and the second light reflecting layer are integrally formed by a method such as vapor deposition.

[Light Emitting Element Disposing Step]

In a case where the base material does not have the light emitting element on the exposed surface exposed by the second opening portion, the above-described manufacturing method of the laminate includes a step of disposing the light emitting element on the exposed surface of the base material exposed through the second opening portion of the resin layer (in a case where the light reflecting layer is formed on the exposed surface of the base material exposed through the second opening portion of the resin layer in the above-described light reflecting layer forming step, on the light reflecting layer).

Laminate According to Third Embodiment

The laminate according to a third embodiment includes, in the following order, a base material and a light absorbing layer, in which a thickness of the light absorbing layer is 3 m or more, the light absorbing layer has an opening portion which penetrates in a thickness direction of the light absorbing layer, the laminate further includes a light emitting element which is disposed on the base material exposed through the opening portion, and the laminate further includes a first light reflecting layer on an inner wall surface of the opening portion of the light absorbing layer.

In a case where the laminate according to the third embodiment is applied to a display element, the display element including the laminate according to the third embodiment has excellent black density in a case of black display and has excellent brightness in a case of white display. The case where the display element is in white display is intended to mean that the light emitting element in the laminate is in the light-on state, and the case where the display element is in black display state is intended to mean that the light emitting element in the laminate is in the light-off state. That is, the case where the display element is in white display or black display does not intend to indicate light emission color of the light emitting element in the laminate.

In addition, the LED may be, for example, an LED having a peak wavelength in a visible light region (hereinafter, also referred to as "visible light LED"), or an LED having a peak wavelength in an ultraviolet region (hereinafter, also referred to as "UV-LED").

Hereinafter, the fact that, in a case where the laminate according to the third embodiment is applied to a display element, the display element is more excellent in black density in a case of black display and is more excellent in brightness in a case of white display, and/or the fact that the display element has more excellent contrast in a bright room (a ratio of brightness (white brightness) in the case of white display to brightness (black brightness) in the case of black display in a bright room environment) is also referred to as "effects of the present invention are more excellent".

Hereinafter, a configuration of the laminate according to the third embodiment will be described in more detail with reference to FIGS. 10 and 11.

Figure 10:
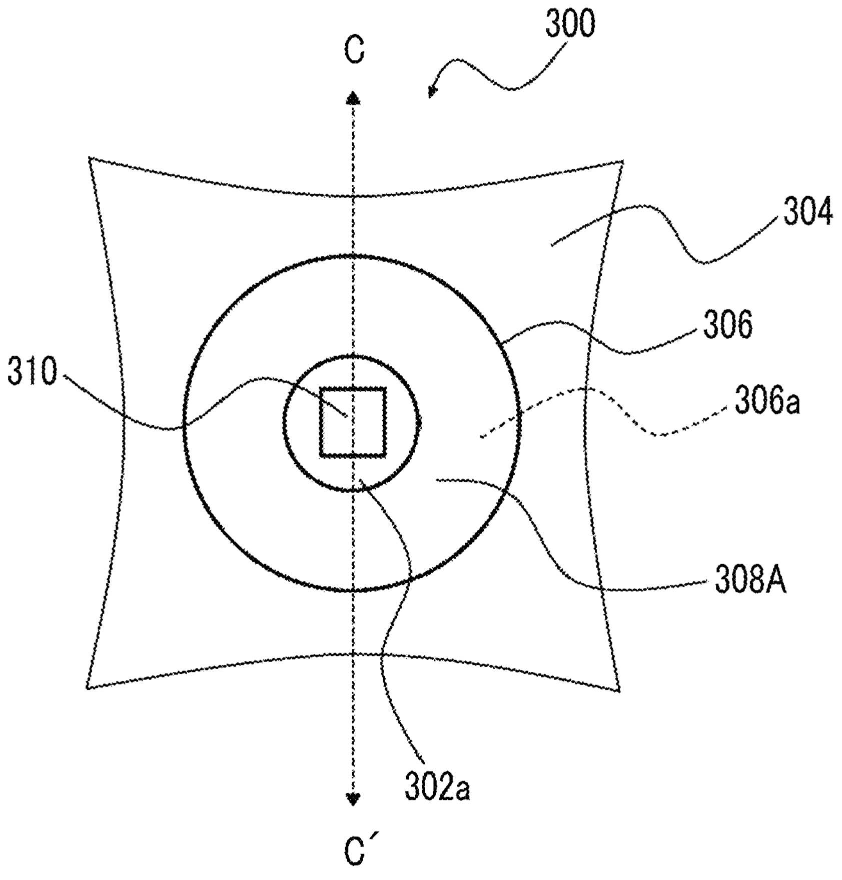
FIG. 10 is a top schematic view showing an example of a laminate according to a third embodiment.
Figure 11:
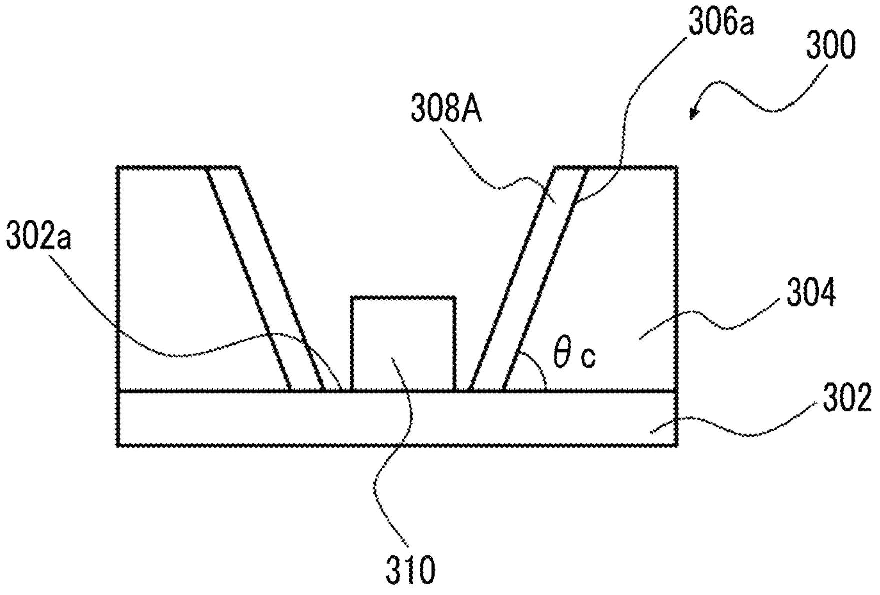
FIG. 11 is a schematic cross-sectional view taken along a C-C' cross section in FIG. 10.

FIG. 10 is a top schematic view showing an example of the laminate according to the third embodiment, and FIG. 11 is a schematic cross-sectional view taken along a C-C' cross section in FIG. 10.

A laminate 300 shown in FIGS. 10 and 11 includes a base material 302 and a light absorbing layer 304 having a thickness of 3 μm or more in this order. The light absorbing layer 304 has an opening portion 306 which penetrates in a thickness direction of the light absorbing layer 304.

An inner wall surface 306*a* of the opening portion 306 of the light absorbing layer 304 is inclined such that an area of the opening portion 306 is continuously reduced from a surface on the light absorbing layer 304 side toward a surface of the base material 302 side. In other words, an angle θc between the inner wall surface 306*a* and the base material 302 is less than 90°.

A first light reflecting layer 308A is disposed on the inner wall surface 306*a* of the light absorbing layer 304 so as to cover the inner wall surface 306*a*.

A light emitting element 310 is disposed on an exposed surface 302*a* of the base material 302 exposed through the opening portion 306.

In a case where the laminate according to the third embodiment is applied to a display element, the display element has excellent black density in a case of black display and also has excellent brightness in a case of white display.

An estimated action mechanism of the laminate according to the third embodiment is as follows.

In a case where the display element (not shown) is in white display (the light emitting element 310 is in a light-on state), light emitted from the light emitting element 310 is reflected by the first light reflecting layer 308A, and light reflection efficiency (light extraction efficiency) is improved, and as a result, the brightness is increased. On the other hand, in a case where the display element is in black display (the light emitting element 310 is in a light-off state), reflection of external light is suppressed by the light absorbing layer 304, and the black density is excellent. Furthermore, in a case where the display element is in white display, the light absorbing layer 304 also has a function of absorbing stray light which is erroneously incident into the first light reflecting layer 308A.

A shape of the opening portion 306 is not particularly limited, and examples thereof include a circle and a quadrangular.

An area of the exposed surface 302*a* of the base material 302 exposed through the opening portion 306 is, for example, preferably 100 to 2,500 $\mu m^2$. A size of the opening portion 306 can be appropriately set, for example, in relation to the area of the exposed surface 302*a* of the base material 302 exposed through the opening portion 306 and the angle θc between the inner wall surface 306*a* and the base material 302.

In addition, in the laminate 300, the angle θc between the inner wall surface 306*a* and the base material 302 is set to be less than 90°, but may be 90°. From the viewpoint that the effects of the present invention are more excellent, θc is preferably less than 90°, preferably 10° to 80°, more preferably 15° to 80°, and still more preferably 20° to 80°.

The angle θc between the inner wall surface 306*a* and the base material 302 corresponds to an angle between a projection surface obtained by projecting the inner wall surface 306*a* onto the base material 302 and the inner wall surface 306*a*.

The inner wall surface 306*a* of the opening portion 306 of the light absorbing layer 304 is inclined such that the area of the opening portion 306 is continuously reduced from the surface on the light absorbing layer 304 side toward the surface of the base material 302 side. A reduction rate of the area of the opening portion 306 can be appropriately set such that the angle θc between the inner wall surface 306*a* and the base material 302 is to be a predetermined angle.

Hereinafter, each element constituting the laminate according to the third embodiment will be described.

The base material and the light reflecting layer, constituting the laminate according to the third embodiment, are the same as the base material and the light reflecting layer, constituting the laminate according to the second embodiment, and suitable aspects thereof are also the same.

In addition, the light absorbing layer constituting the laminate according to the third embodiment is the same as the light absorbing layer constituting the laminate according to the first embodiment in points other than the thickness, and a suitable aspect thereof is also the same.

The thickness of the light absorbing layer in the laminate according to the third embodiment is 3 μm or more, preferably 5 μm or more, more preferably 10 μm or more, still more preferably 16 μm or more, and particularly preferably 30 μm or more. The upper limit value thereof is not particularly limited, but is, for example, preferably 100 μm or less and more preferably 50 μm or less.

In the laminate according to the third embodiment, from the viewpoint that the effects of the present invention are more excellent, it is preferable that the thickness of the light absorbing layer is larger than the thickness of the light emitting element.

Modification Example of Laminate According to Third Embodiment

Figure 12:
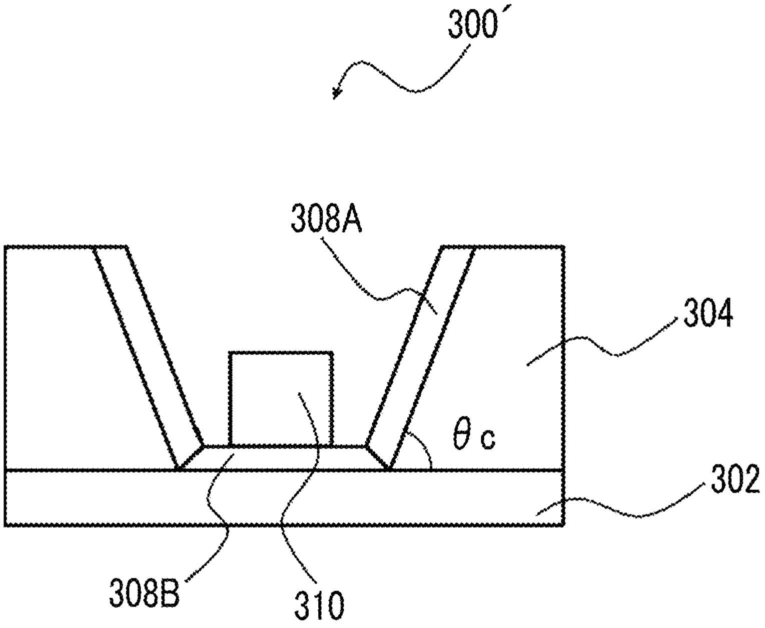
FIG. 12 is a schematic cross-sectional view showing another example of the laminate according to the third embodiment.

As a laminate 300' shown in FIG. 12, a second light reflecting layer 308B may be provided between the base material 302 exposed through the opening portion 306 of the light absorbing layer 304 (corresponding to the exposed surface 302*a* of the base material 302 exposed through the opening portion 306 of the light absorbing layer 304 in FIGS. 10 and 11) and the light emitting element 314.

The first light reflecting layer 308A and the second light reflecting layer 308B may be integrally provided of the same material, or may be respectively provided of different materials.

Transfer Film According to Third Embodiment

The transfer film according to a third embodiment includes a temporary support and a photosensitive precursor layer of a light absorbing layer, in which a thickness of the precursor layer of the light absorbing layer is 3 μm or more.

The above-described laminate according to the third embodiment includes the light absorbing layer on the base material. The transfer film according to the third embodiment can be applied to formation of the light absorbing layer of the laminate according to the third embodiment described above. That is, the transfer film according to the third embodiment may be transferred onto a predetermined base material which may have a light emitting element, and by performing a pattern exposure treatment and a development treatment, a light absorbing layer (layer derived from the precursor layer of the light absorbing layer) having a predetermined opening portion can be formed on the base material.

Hereinafter, the configuration of the transfer film according to the third embodiment will be described in more detail with reference to the accompanying drawings.

Figure 13:
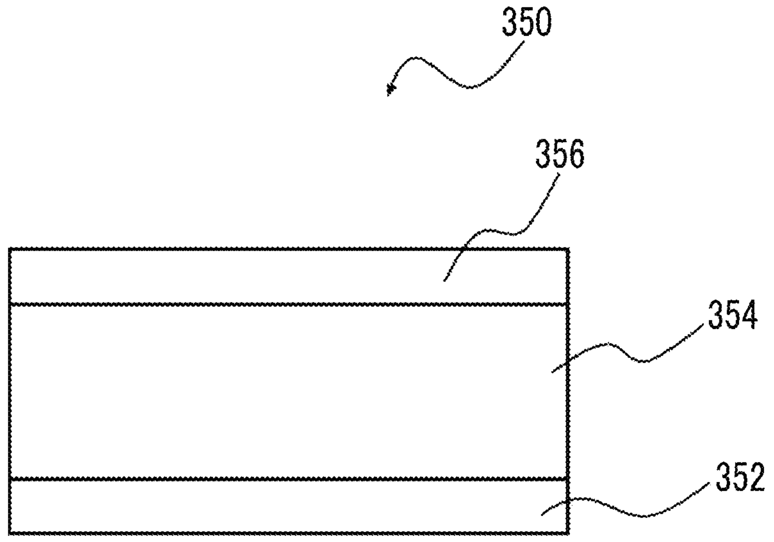
FIG. 13 is a schematic cross-sectional view showing an example of a transfer film according to a third embodiment.

FIG. 13 is a schematic cross-sectional view showing an example of the transfer film according to the third embodiment.

A transfer film 350 shown in FIG. 13 includes a temporary support 352, a precursor layer 354 of a light absorbing layer, having a thickness of 3 μm or more, and a protective film 356 in this order.

The precursor layer 354 of the light absorbing layer is a layer exhibiting photosensitivity, and may be either a positive tone photosensitive layer or a negative tone photosensitive layer, but is preferably a negative tone photosensitive layer.

The transfer film 350 shown in FIG. 13 is in a form in which the protective film 356 is disposed, but the protective film 356 may not be disposed.

The temporary support, the precursor layer of the light absorbing layer, and the protective film, constituting the transfer film according to the third embodiment, are the same as the temporary support, the light precursor layer of the light absorbing layer, and the protective film, constituting the transfer film according to the first embodiment, and suitable aspects thereof are also the same.

Manufacturing Method of Transfer Film According to Third Embodiment

The manufacturing method of the transfer film according to the third embodiment is not particularly limited, and a known method can be used.

Examples of the manufacturing method of the transfer film according to the third embodiment shown in FIG. 13 include a method including a step of applying a composition for forming the precursor layer of the light absorbing layer onto a surface of the temporary support to form a coating film, and then drying the coating film to form the precursor layer of the light absorbing layer.

Examples of a method of forming the composition for forming the precursor layer of the light absorbing layer and method of forming the precursor layer of the light absorbing layer include the same method as the method of forming the composition for forming the precursor layer of the light absorbing layer and method of forming the precursor layer of the light absorbing layer in the transfer film according to the first embodiment described above, and suitable aspects thereof are also the same.

In addition, in a case where the transfer film according to the third embodiment, shown in FIG. 13, further includes the protective film on a surface of the precursor layer of the light absorbing layer opposite to the temporary support, the manufacturing method of the transfer film according to the third embodiment includes a step of providing the protective film to be in contact with the surface of the precursor layer of the light absorbing layer opposite to the temporary support.

After manufacturing the transfer film according to the third embodiment by the above-described manufacturing method, a roll-shaped transfer film according to the third embodiment may be produced and stored by winding the transfer film according to the third embodiment. The roll-shaped transfer film according to the third embodiment is provided as it is in a bonding step described later with the substrate in a roll-to-roll method.

Examples of the protective film bonding step include the same forming method as the protective film bonding step in the transfer film according to the first embodiment described above, and a suitable aspect thereof is also the same.

In addition, as the manufacturing method of the transfer film according to the third embodiment shown in FIG. 13, a method in which the precursor layer of the light absorbing layer is formed on the protective film may be used.

Manufacturing Method of Laminate Using Transfer Film According to Third Embodiment As described above, the transfer film according to the third embodiment can be applied to formation of the light absorbing layer in the manufacturing of the laminate according to the third embodiment described above. Specifically, the transfer film according to the third embodiment may be transferred onto a predetermined base material which may have a light emitting element, and by performing a pattern exposure treatment and a development treatment, a light absorbing layer (layer derived from the precursor layer of the light absorbing layer) having a predetermined opening portion can be formed on the base material.

Hereinafter, the manufacturing method of the laminate according to the third embodiment using the transfer film according to the third embodiment will be described in detail.

The manufacturing method of the laminate according to the third embodiment includes: a bonding step of bonding the transfer film according to the third embodiment to a base material by bringing a surface of the transfer film on a side opposite to the temporary support into contact with the base material to obtain a precursor layer-attached base material including the base material, the precursor layer of the light-absorbing layer, and the temporary support in this order; an exposing step of exposing the precursor layer of the light-absorbing layer in the precursor layer-attached base material; and a developing step of developing the exposed precursor layer of the light-absorbing layer to form a light absorbing layer having an opening portion penetrating in a thickness direction, in which the manufacturing method further includes, between the bonding step and the exposing step or between the exposing step and the developing step, a peeling step of peeling the temporary support from the precursor layer-attached base material, a light reflecting layer forming step of forming a light reflecting layer on at least an inner wall surface of the opening portion of the light absorbing layer, and in a case where the base material includes no light emitting element on an exposed surface exposed through the opening portion, a light emitting element disposing step of disposing the light emitting element on the exposed surface.

Hereinafter, the procedure of the above-described steps will be specifically described. In the following description, a layer excluding the protective film formed on the temporary support of the transfer film according to the third embodiment may be referred to as “composition layer”.

[Bonding Step]

The bonding step is a step of bonding the transfer film according to the third embodiment to the base material such that a surface of the transfer film according to the third embodiment opposite to the temporary support of the transfer film (in other words, a surface of the composition layer) and the base material are in contact with each other, to obtain a precursor layer-attached base material including the base material, the composition layer (the composition layer includes the precursor layer of the light absorbing layer), and the temporary support in this order.

In a case where the transfer film according to the third embodiment has a configuration of including the protective film, the protective film is peeled off and then the bonding step is performed.

A specific procedure of the bonding step is the same as the bonding step in [Manufacturing method of laminate using transfer film according to first embodiment] described above, and a suitable aspect thereof is also the same.

In addition, the base material which can be used in the bonding step is the same as the base material which can be used in the bonding step in [Manufacturing method of laminate using transfer film according to first embodiment] described above, and a suitable aspect thereof is also the same. The base material may be a base material on which the light emitting element has already been mounted, or may be a base material on which the light emitting element has not been mounted. In a case where the base material on which the light emitting element has not been mounted is used, after the exposing step, developing step, and light reflecting layer forming step are performed, a step of disposing the light emitting element in the opening portion of the light absorbing layer is performed.

[Exposing Step]

The exposing step is a step of exposing the composition layer including the precursor layer of the light absorbing layer in a patterned manner. Here, the "exposure in a patterned manner" refers to exposure in a form of performing the exposure in a patterned manner, that is, a form in which an exposed portion and a non-exposed portion are present.

A positional relationship between the exposed portion and the non-exposed portion in the exposure in a patterned manner is not particularly limited and is appropriately adjusted.

In a case where the exposing step is performed using a mask, typically, a cured film having a predetermined opening portion in a thickness direction is obtained according to a mask pattern. For example, in a case where the laminate according to the third embodiment is manufactured using the transfer film according to the third embodiment in which the precursor layer of the light absorbing layer as a negative tone photosensitive layers is included, a composition layer located at an opening portion of the mask is exposed to be cured, and a composition layer located at a non-opening portion of the mask is not exposed and is removed by the developing step described later. That is, by passing through the exposing step, a cured film having an opening portion penetrating in a thickness direction can be formed at a position corresponding to the non-opening portion of the mask. The pattern shape of the opening portion in the mask may be appropriately set according to a desired shape. As the mask, a mask for through-hole formation can be suitably used.

The exposure may be performed from the side opposite to the base material of the composition layer, or may be performed from the base material side of the composition layer.

An exposure procedure, exposure conditions, and the like in [Exposing step] of the manufacturing method of the laminate according to the third embodiment are the same as the exposure procedure, the exposure conditions, and the like in [Exposing step] of the manufacturing method of the laminate according to the second embodiment, and suitable aspects thereof are also the same.

[Peeling Step]

The peeling step is a step of peeling off the temporary support from the precursor layer-attached base material, between the bonding step and the exposing step or after the exposing step. In a case where the developing step is performed after the exposing step, the peeling step may be performed after the exposing step and before the developing step.

The peeling method is not particularly limited, and the same mechanism as the cover film peeling mechanism described in paragraphs [0161] and [0162] of JP2010-072589A can be used.

[Developing Step]

The developing step is a step of developing the exposed composition layer to form a pattern.

In a case where the precursor layer of the light absorbing layer is a negative tone photosensitive layer, a predetermined cured film pattern can be formed by curing the composition layer located at the opening portion of the mask used during the exposure, and then removing the composition layer located at the non-opening portion of the mask. Since the transfer film according to the third embodiment includes the precursor layer of the light absorbing layer as the composition layer, the light absorbing layer having an opening portion penetrating in a thickness direction can be formed by the main developing step.

As described above, in a case where the exposure is performed by the method of introducing a light scattering plate into an exposure machine, the method of applying exposure light from an oblique direction, and the like, in the light absorbing layer to be formed, the angle (θc in FIGS. 11 and 12) between the inner wall surface and the base material can be less than 90°. That is, the inner wall surface of the opening portion of the light absorbing layer is inclined such that the area of the opening portion is continuously reduced from the surface on the air interface side toward the surface on the base material side.

A development procedure, development conditions, and the like in [Developing step] of the manufacturing method of the laminate according to the third embodiment are the same as the development procedure, the development conditions, and the like in [Developing step] of the manufacturing method of the laminate according to the second embodiment, and suitable aspects thereof are also the same.

[Post-Exposing Step and Post-Baking Step]

The above-described manufacturing method of a laminate may include an exposing step of exposing the pattern obtained by the above-described developing step (post-exposing step) and/or a step of heating (post-baking step) the pattern.

In a case where both of the post-exposing step and the post-baking step are included, it is preferable that the post-baking is performed after the post-exposure.

An exposure amount of the post-exposure is preferably 100 to 5,000 mJ/$cm^2$ and more preferably 200 to 3,000 mJ/$cm^2$.

A temperature of the post-baking is preferably 80° C. to 250° C. and more preferably 90° C. to 160° C.

A post-baking time is preferably 1 to 180 minutes and more preferably 10 to 60 minutes.

[Light Reflecting Layer Forming Step]

The above-described manufacturing method of the laminate includes a step of forming a light reflecting layer on at least an inner wall surface of the light absorbing layer formed on the base material, after the developing step.

The light reflecting layer is formed on the inner wall surface of the light absorbing layer formed on the base material, but in a case where the light emitting element is not disposed (not mounted) on the base material, the light reflecting layer may be formed on the inner wall surface of the light absorbing layer formed on the base material, and on the exposed surface of the base material exposed through the opening portion of the light absorbing layer by the development treatment. The light reflecting layer disposed on the inner wall surface of the light absorbing layer corresponds to the first light reflecting layer 308A in FIGS. 10 to 12; and the light reflecting layer disposed on the exposed surface of the base material exposed through the opening portion of the light absorbing layer corresponds to the second light reflecting layer 308B in FIG. 12.

A step of forming the light reflecting layer is not particularly limited, and a sputtering method, a vapor deposition method, a plating method, printing with an ink containing metal particles (screen printing, ink jet printing, or the like), or the like can be adopted. In addition, the light reflecting layer may be formed by patterning such that only necessary portions are left by a known method such as wet etching and dry etching.

By performing the above-described step, the first light reflecting layer and the second light reflecting layer can be formed. In a case where the light emitting element is not disposed (not mounted) on the base material, it is also preferable that the first light reflecting layer and the second light reflecting layer are integrally formed by a method such as vapor deposition.

[Light Emitting Element Disposing Step]

In a case where the base material does not have the light emitting element on the exposed surface exposed by the opening portion of the light absorbing layer, the above-described manufacturing method of the laminate includes a step of disposing the light emitting element on the exposed surface of the base material exposed through the opening portion of the light absorbing layer (in a case where the light reflecting layer is formed on the exposed surface of the base material exposed through the opening portion of the light absorbing layer in the above-described light reflecting layer forming step, on the light reflecting layer).

EXAMPLES

Hereinafter, the present invention will be described in more detail with reference to Examples. The material, the amount used, the proportion, the process contents, the process procedure, and the like shown in Examples can be appropriately changed, within a range not departing from the gist of the present invention. Therefore, the scope of the present invention should not be construed as being limited by the following examples.

In the following, "parts" or "%" is based on mass unless otherwise specified.

[Preparation of Composition for Forming Precursor Layer of Light Absorbing Layer]

Compositions (A-1 to A-3) for forming a precursor layer of a light absorbing layer were prepared based on components and blending amounts shown in Table 1. The unit of the blending amount of each component shown in Table 1 is part by mass.

Hereinafter, preparation methods of black pigment dispersion liquids 1 to 3 in Table 1 will be shown.

[Preparation of Black Pigment Dispersion Liquid 1]

Carbon black, a dispersant, a polymer, and a solvent were mixed so as to have the following formulation of a black pigment dispersion liquid 1, and a dispersion treatment was carried out using a three-roll and a beads mill to obtain a black pigment dispersion liquid 1. A particle diameter of the black pigment was 163 nm.

<Formulation of Black Pigment Dispersion Liquid 1>

| | |
|---|---|
| Resin-coated carbon black produced by the following procedure | 13.1% by mass |
| Dispersant 1 having the following structure | 0.65% by mass |
| Polymer (random copolymer of benzyl methacrylate/methacrylic acid = 72/28 (molar ratio); weight-average molecular weight: 37,000) | 6.72% by mass |
| Propylene glycol monomethyl ether acetate | 79.53% by mass |

(Production of Resin-Coated Carbon Black)

<<Production of Carbon Black>>

The carbon black was produced by an ordinary oil furnace method, except that a raw material oil having a small amount of Na, Ca, and S was used, and water treated with an ion exchange resin was used as a quenched water. Next, 100 g of the obtained carbon black was placed in a cylindrical kiln having an inner diameter of 10 cm and a length of 10 cm, and rotated at 9 rpm while being brought into contact with a mixed gas of air and ozone (ozone: 6,000 ppm) at room temperature for 4 hours.

<<Production of Resin-Coated Carbon Black>>

Preparation of Carbon Black Dispersion Liquid

First, according to Example 1 of JP1996-337736A (JP-H8-337736A), 30 g of glycidyl methacrylate, 90 g of the produced carbon black, and 480 g of ethyl carbitol acetate were charged into a separable flask provided with a stirring blade and a reflux condenser, 6,000 g of stainless steel beads having a diameter of 3 mm was added thereto, and the

TABLE 1

| composition of precursor layer of light absorbing layer | Each component | Composition A-1 (blending amount: part by mass) | Composition A-2 (blending amount: part by mass) | Composition A-3 (blending amount: part by mass) |
|---|---|---|---|---|
| Black pigment dispersion liquid | Black pigment dispersion liquid 1 shown below | 180.9 | | |
| | Black pigment dispersion liquid 2 using Carbon black UB-1 manufactured by Mitsubishi Materials Corporation | | 180.9 | |
| | Black pigment dispersion liquid 3 using Carbon black UB-2 manufactured by Mitsubishi Materials Corporation | | | 12.1 |
| Alkali-soluble resin | Polymer P-1 solution (solid content = 40.5% by mass) | 141.2 | | 198.5 |
| | Polymer P-2 solution (solid content = 36.2% by mass) | | 141.2 | |
| Polymerizable compound | A-NOD-N (manufactured by Shin-Nakamura Chemical Co., Ltd.) | 3.40 | 13.60 | 5.10 |
| | A-DCP (manufactured by Shin-Nakamura Chemical Co., Ltd.) | 10.2 | | 15.30 |
| | 8UX-15A (manufactured by Taisei Fine Chemical Co., Ltd.) | 6.80 | | 10.20 |
| | A-DPH (manufactured by Shin-Nakamura Chemical Co., Ltd.) | 2.27 | 9.10 | 3.41 |
| Polymerization initiator | OXE-02 (manufactured by BASF SE) | 4.05 | 4.05 | 4.05 |
| Additive | MEGAFACE F-551A (manufactured by DIC Corporation) | 0.26 | 0.26 | 0.26 |
| Solvent | Propylene glycol monomethyl ether acetate | 246.8 | 246.8 | 246.8 |
| | Methyl ethyl ketone | 404.2 | 404.2 | 404.2 |

mixture was stirred at 160° C. for 30 minutes to obtain a mixture of graft carbon black and ethyl carbitol acetate (concentration of graft carbon black: 20% by mass).

Next, the graft carbon black was collected using a centrifuge, and then the unreacted glycidyl methacrylate adhering to the carbon black was removed by vacuum drying (100° C., 0.1 torr, 10 hours). Thereafter, a surface oxidation treatment (re-oxidation) was performed again on half the amount of the graft carbon black under the same conditions as described above.

Next, 30 g of the graft carbon black subjected to the above-described re-oxidation was dispersed in 650 cc of pure water. In this case, ethanol was used as a dispersant, a sand mill containing zirconia beads having a diameter of 1 mm was used as a disperser, and carbon black having a particle diameter of 5 microns or less was selected by filtration.

Preparation of Resin Emulsion

Next, 0.7 g of a curing agent (2-ethyl-4-methylimidazole ("EMI24" manufactured by Oil Chemical Co., Ltd.)) was added to and sufficiently dissolved in a resin solution (phenol novolac-type epoxy resin: 3.4 g, toluene: 30 cc) dissolved with toluene, 300 cc of water and 60 cc of ethanol were added thereto, and the mixture was stirred by a homogenizer at 9,000 rpm for 30 minutes to prepare a resin emulsion. The obtained resin emulsion had a diameter of 5 microns.

Coating Treatment

Next, the carbon black surface was coated with a resin. Specifically, the carbon black dispersion liquid was stirred with a screw while the above-described resin emulsion was gradually added thereto, and the mixture was heated while maintaining the stirring, and then subjected to a curing treatment at 70° C. for 4 hours from the start of evaporation of toluene.

Next, the mixture was filtered to remove water, and then put into a vacuum dryer and dried at 62° C. for 10 hours to remove moisture and solvent, thereby obtaining resin-coated carbon black. The obtained resin-coated carbon black had a residual solvent amount of approximately 50 ppm by mass and a residual moisture content of approximately 500 ppm by mass.

(Dispersant 1)

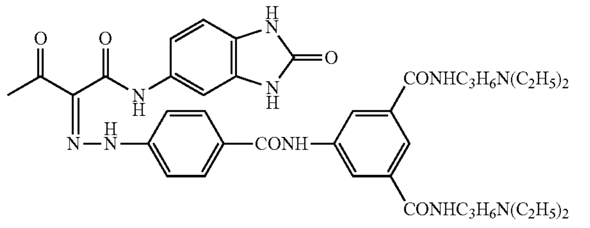

[Preparation of Black Pigment Dispersion Liquids 2 and 3]

Black pigment dispersion liquids 2 and 3 were prepared in the same manner as in the preparation of the black pigment dispersion liquid 1, except that the carbon black materials were each changed to Carbon black UB-1 manufactured by Mitsubishi Materials Corporation and Carbon black UB-2 manufactured by Mitsubishi Materials Corporation.

Hereinafter, details of other abbreviations and product names in Table 1 are shown.

"Polymer P-1 solution": PGMEA solution (solid content: 40.5% by mass) of a polymer P-1 [copolymer of benzyl methacrylate and methacrylic acid, compositional ratio (mass basis) of copolymer=70/30, weight-average molecular weight (Mw)=5,000]; the polymer P-1 corresponds to the alkali-soluble resin "Polymer P-2 solution": PGMEA solution (solid content: 36.2% by mass) of a polymer P-2 [polymer having the following structure, weight-average molecular weight (Mw) =18,000]; the polymer P-2 corresponds to the alkali-soluble resin, and the polymer P-2 solution is the same as "Polymer P-2 solution (solid content: 36.2% by mass)" used in the precursor layer of the light reflecting layer, which is described in the later-described section Polymer P-2: formulation of constitutional units in the following structural formula represents a molar ratio

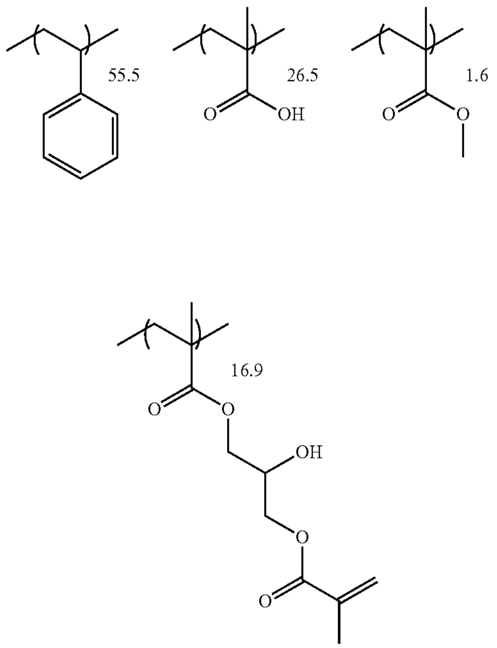

"A-NOD-N": 1,9-nonanediol diacrylate (manufactured by Shin-Nakamura Chemical Co., Ltd.)

"A-DCP": tricyclodecane dimethanol diacrylate (manufactured by Shin-Nakamura Chemical Co., Ltd.)

"8UX-15A": tri- or higher functional urethane (meth) acrylate (manufactured by Taisei Fine Chemical Co., Ltd.)

"A-DPH": dipentaerythritol polyacrylate (manufactured by Shin-Nakamura Chemical Co., Ltd.)

"OXE-02": oxime ester-based photopolymerization initiator (Irgacure OXE 02, manufactured by BASF SE)

"MEGAFACE F551A": fluorine-based surfactant (manufactured by DIC Corporation)

[Preparation of Compositions (B-1 to B-5) for Forming Precursor Layer of Light Reflecting Layer, and Preparation of Comparative Photosensitive Composition (B-1')]

Compositions (B-1 to B-5) for forming a precursor layer of a light reflecting layer and a comparative photosensitive composition (B-1') were prepared based on components and blending amounts shown in Table 2. The unit of the blending amount of each component shown in Table 2 is part by mass.

TABLE 2 composition of precursor layer of light reflecting layer

| | Each component | Composition (blending amount: part by mass) B-1 | B-2 | B-3 | B-4 | B-5 | B'-1 |
|---|---|---|---|---|---|---|---|
| White pigment dispersion liquid | W dispersion liquid T-01 (rutile type titanium oxide, pigment concentration: 30% by mass, manufactured by TOKYO PRINTING INK MFG. CO., LTD.) | 51.9 | 29 | 37.7 | 62.8 | | |
| Silver nano-particle dispersion liquid | Smart Gravure (concentration: 55% by mass, manufactured by GENES INK) | | | | | 27.1 | |
| Alkali-soluble resin | Polymer P-2 solution (solid content = 36.2% by mass) | 19.80 | 30.20 | 26.20 | 14.80 | 22.00 | 43.30 |
| Polymerizable compound | A-NOD-N (manufactured by Shin-Nakamura Chemical Co., Ltd.) | 3.05 | 4.65 | 4.04 | 2.28 | 3.39 | 6.68 |
| | A-DPH (manufactured by Shin-Nakamura Chemical Co., Ltd.) | 1.43 | 2.17 | 1.89 | 1.07 | 1.59 | 3.12 |
| | ARONIX TO-2349 (manufactured by TOAGOSEI CO., LTD.) | 0.54 | 0.83 | 0.73 | 0.41 | 0.61 | 1.20 |
| Polymerization initiator | B-CIM (manufactured by Hampford Research Inc.) | 0.83 | 1.27 | 1.10 | 0.62 | 0.92 | 1.82 |
| Sensitizer | SB-PI 701 (manufactured by Sanyo Trading Co., Ltd.) | 0.01 | 0.01 | 0.01 | 0.01 | 0.01 | 0.01 |
| Chain transfer agent | N-phenyl carbamoyl methyl-N-carboxymethyl aniline (manufactured by FUJIFILM Wako Pure Chemical Corporation) | 0.16 | 0.16 | 0.16 | 0.16 | 0.16 | 0.16 |
| Polymerization inhibitor | TDP-G (manufactured by Kawaguchi Chemical Industry Co., Ltd.) | 0.08 | 0.08 | 0.08 | 0.08 | 0.08 | 0.08 |
| Additive | CBT-1 (manufactured by Johoku Chemical Co., Ltd.) | 0.03 | 0.03 | 0.03 | 0.03 | 0.03 | 0.03 |
| | 4-Hydroxymethyl-4-methyl-1-phenyl-3-pyrazolidone (manufactured by FUJIFILM Wako Pure Chemical Corporation) | 0.01 | 0.01 | 0.01 | 0.01 | 0.01 | 0.01 |
| | MEGAFACE F-551A (manufactured by DIC Corporation) | 0.26 | 0.26 | 0.26 | 0.26 | 0.26 | 0.26 |
| Solvent | Propylene glycol monomethyl ether acetate | 5.89 | 15.32 | 11.79 | 1.47 | 27.84 | 27.33 |
| | Methyl ethyl ketone | 16.00 | 16.00 | 16.00 | 16.00 | 16.00 | 16.00 |

[Method of Preparing P-2 Solution (Solution of Polymer P-2 with Solid Content of 36.2% by Mass)]

A P-2 solution (solution of the polymer P-2 with a solid content of 36.2% by mass) was prepared by the following polymerization step and addition step.

113.5 g of propylene glycol monomethyl ether was charged into a flask and heated to 90° C. under a nitrogen stream. To this liquid, a solution in which 172 g of styrene, 4.7 g of methyl methacrylate, and 112.1 g of methacrylic acid had been dissolved in 30 g of propylene glycol monomethyl ether and a solution in which 27.6 g of a polymerization initiator V-601 (manufactured by FUJIFILM Wako Pure Chemical Corporation) had been dissolved in 57.7 g of propylene glycol monomethyl ether was simultaneously added dropwise over 3 hours. After the dropwise addition, 2.5 g of V-601 was added three times every hour. Thereafter, the reaction was continued for another 3 hours. Thereafter, the reaction solution was diluted with 160.7 g of propylene glycol monomethyl ether acetate and 233.3 g of propylene glycol monomethyl ether. The reaction solution was heated to 100° C. under an air stream, and 1.8 g of tetraethylammonium bromide and 0.86 g of p-methoxyphenol were added thereto. 71.9 g of glycidyl methacrylate (Blemmer GH manufactured by NOF Corporation) was added dropwise thereto over 20 minutes. After the dropwise addition, the reaction solution was reacted at 100° C. for 7 hours to obtain a solution of a resin P-2. The concentration of solid contents of the obtained solution was 36.2% by mass. The weight-average molecular weight in terms of standard polystyrene in GPC was 18,000, the number-average molecular weight was 7,800, the dispersity was 2.3, and the acid value of the polymer was 124 mgKOH/g. The amount of residual monomer measured by gas chromatography was less than 0.1% by mass with respect to the solid content of the polymer in any of the monomers. The structure of the polymer P-2 is shown below.

Polymer P-2: formulation of constitutional units in the following structural formula represents a molar ratio The polymer P-2 corresponds to the alkali-soluble resin.

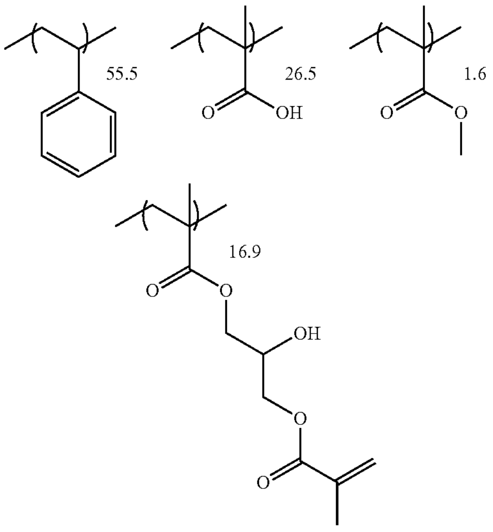

Hereinafter, details of abbreviations and product names of other components in Table 2 are shown.

"A-NOD-N": 1,9-nonanediol diacrylate (manufactured by Shin-Nakamura Chemical Co., Ltd.)

"A-DPH": dipentaerythritol polyacrylate (manufactured by Shin-Nakamura Chemical Co., Ltd.)

"ARONIX TO-2349": carboxyl group-containing monomer (manufactured by TOAGOSEI CO., LTD.)

"B-CIM": 2,2'-bis(2-chlorophenyl)-4,4',5,5'-tetraphenyl-1,2'-biimidazole (manufactured by Hampford Research Inc.)

"SB-PI 701": 4,4'-bis(diethylamino)benzophenone (manufactured by Sanyo Trading Co., Ltd.)

"TDP-G": phenothiazine (manufactured by Kawaguchi Chemical Industry Co., Ltd.)

"CBT-1": carboxybenzotriazole (manufactured by Johoku Chemical Co., Ltd.)

"MEGAFACE F551A": fluorine-based surfactant (manufactured by DIC Corporation)

[Preparation of Composition for Forming Interlayer]

| | |
|---|---|
| PVA 205 (polyvinyl alcohol, manufactured by Kuraray Co., Ltd., saponification degree = 88%, polymerization degree 550) | 32.2 parts by mass |
| Polyvinylpyrrolidone (manufactured by Ashland Japan., Co., Ltd., K-30) | 14.9 parts by mass |
| Distilled water | 24 parts by mass |
| Methanol | 429 parts by mass |

Example 1

[Production of Transfer Film]

As a temporary support, a polyethylene terephthalate film (LUMIRROR 16KS40, manufactured by Toray Industries, Inc.; thickness: 16 μm) was prepared. The composition A-1 for forming a precursor layer of a light absorbing layer was applied onto the temporary support such that the thickness after drying was 2 μm, and dried at 100° C. for 1 minute to form a precursor layer of a light absorbing layer. The composition B-1 for forming a precursor layer of a light reflecting layer was applied onto the precursor layer of the light absorbing layer such that the thickness after drying was 10 μm, and dried at 100° C. for 3 minutes to form a precursor layer of a light reflecting layer. A polyethylene terephthalate film (LUMIRROR 16KS40, manufactured by Toray Industries, Inc.; thickness: 16 μm) was pressure-bonded to the precursor layer of the light reflecting layer. By the above-described procedure, a transfer film 1 including the temporary support, the precursor layer of the light absorbing layer, the precursor layer of the light reflecting layer, and the protective film in this order was obtained.

[Production of Micro LED Display Element]

A micro LED display element was produced using the transfer film 1 according to the following procedure. Specifically, a partition wall layer was formed using the transfer film 1 before an LED chip was bonded to a bonding member on an array substrate. Hereinafter, a specific procedure thereof will be described.

First, the protective film of the transfer film 1 was peeled off, the transfer film 1 was bonded to the array substrate under the following lamination conditions, and the precursor layer-attached substrate was produced by laminating, on the array substrate, the precursor layer of the light reflecting layer, the precursor layer of the light absorbing layer, and the temporary support in this order.

Heating temperature of array substrate: 40° C.

Temperature of rubber roller: 110° C.

Linear pressure: 3 N/cm

Transportation speed: 2 m/min

A distance between a surface of an exposure mask (mask for through-hole formation) and a surface of the temporary support was set to 125 μm. Using a proximity exposure machine (Hitachi High-Tech Electronics Engineering Co., Ltd.) including an ultra-high pressure mercury lamp, the precursor layer of the light reflecting layer and the precursor layer of the light absorbing layer were irradiated in a patterned manner with i-rays at an exposure amount of 60 $mJ/cm^2$ through the temporary support. In this case, the pattern and position of the exposure mask were adjusted such that a through-hole was formed in a bonding portion to which the LED chip was bonded in which a taper angle of the partition wall layer (refer to the taper angle θ in FIG. 1) was an angle shown in Table 3.

After the exposure treatment, the temporary support was peeled off, and the precursor layer of the light reflecting layer and the precursor layer of the light absorbing layer after the exposure were developed with an aqueous solution of 1% by mass soda carbonate at a temperature of 32° C. for 60 seconds. Next, the residue was removed by jetting ultrapure water from an ultra-high pressure washing nozzle to the laminate obtained after the development treatment, and then air was blown to remove moisture.

Next, the pattern in the obtained laminate was exposed to an exposure amount of 400 $mJ/cm^2$ (i-rays) using a post-exposure machine (manufactured by Ushio Inc.) including a high pressure mercury lamp (post-exposure). After the exposure, a post-baking treatment was performed at 145° C. for 30 minutes.

By the above-described procedure, a cured film (partition wall layer formed by laminating the light reflecting layer and the light absorbing layer in this order) having a through-hole pattern, in which a through-hole was disposed at a position corresponding to the bonding portion, was formed on the array substrate.

An LED chip was bonded to the array substrate on which the partition wall layer had been formed by the above-described procedure, according to a method described in JP2021-163945A. As an antireflection film, AR100-T062V-BD (manufactured by Dexerials Corporation) was bonded to an outermost surface of the display element. In this way, a micro LED display element was produced.

Examples 2 to 19 and Comparative Examples 1 to 3

Transfer films of Examples 2 to 19 and Comparative Examples 1 to 3 were produced by the same procedure as in Example 1, except that the thickness and formulation of each layer shown in Table 3 were adjusted.

In addition, micro LED display elements of Examples 2 to 19 and Comparative Examples 1 to 3 were produced by the same procedure as in Example 1, except that the process conditions were appropriately adjusted so that the taper angle of the partition wall shown in Table 3 was obtained.

In Comparative Example 3, a transfer film and a micro LED display element were produced using the comparative photosensitive composition instead of the composition for forming the precursor layer of the light reflecting layer. The transfer film of Comparative Example 3 included the temporary support, the precursor layer of the light absorbing layer, the interlayer, a comparative photosensitive resin layer, and the protective film in this order.

In addition, in Example 10, a transfer film was produced by the same procedure as in Example 1, except that, after the formation of the precursor layer of the light absorbing layer and before the application of the composition for forming the precursor layer of the light reflecting layer, a composition for forming an interlayer was applied such that the thickness after drying was 1 μm, and then dried at 120° C. for 1 minute to form an interlayer. That is, the transfer film 10 obtained in Example 10 included the temporary support, the precursor layer of the light absorbing layer, the interlayer, the precursor layer of the light reflecting layer, and the protective film in this order. In addition, a micro LED display element of Example 10 was produced by the same procedure as in Example 1 using the obtained transfer film.

In each of the produced micro LED elements, a thickness of the LED chip was 8 μm.

The transfer films produced in Examples 1 to 19 correspond to the transfer film according to the first embodiment described above. In addition, the laminates produced in Examples 1 to 19 correspond to the laminate according to the first embodiment described above. That is, the partition wall in the procedure described in the above section is intended to be a laminated structure including the light reflecting layer and the light absorbing layer, and the taper angle is intended to be an angle between the inner wall surface of the light reflecting layer and the base material.

Examples 2-1 to 2-9 and Comparative Examples 2-1 and 2-2

Production of Transfer Film of Example 2-1

As a temporary support, a polyethylene terephthalate film (LUMIRROR 16KS40, manufactured by Toray Industries, Inc.; thickness: 16 μm) was prepared. The composition A-1 for forming a precursor layer of a light absorbing layer was applied onto the temporary support such that the thickness after drying was 2 μm, and dried at 100° C. for 1 minute to form a precursor layer of a light absorbing layer. The composition B'-1 for forming a photosensitive layer was applied onto the precursor layer of the light absorbing layer such that the thickness after drying was 10 μm, and dried at 100° C. for 3 minutes to form a photosensitive layer. A polyethylene terephthalate film (LUMIRROR 16KS40, manufactured by Toray Industries, Inc.; thickness: 16 μm) was pressure-bonded to the photosensitive layer. By the above-described procedure, a transfer film 2-1 including the temporary support, the precursor layer of the light absorbing layer, the photosensitive layer, and the protective film in this order was obtained.

Production of Micro LED Display Element of Example 2-1

In addition, a cured film (partition wall formed by laminating the resin layer and the light absorbing layer in this order) having a through-hole pattern, in which a through-hole was disposed at a position corresponding to the bonding portion, was formed on the array substrate by the same procedure as in [Production of micro LED display element] of Example 1 described above, except that the process conditions were appropriately adjusted so that the taper angle of the partition wall shown in Table 4 was obtained.

After the partition wall was produced, a 300 nm-thick silver layer was vapor-deposited on the opening portion of the partition wall and the outer layer surface of the partition wall (surface of the partition wall on a side opposite to the base material side) by a known vapor deposition method. Next, the vapor-deposited film on the outer layer surface of the partition wall was removed by patterning using an etching resist, thereby forming a light reflecting layer on the opening portion of the partition wall (inner wall surface of the second opening portion of the resin layer shown in FIG. 8, inner wall surface of the first opening portion of the light absorbing layer, and base material surface exposed through the second opening portion of the resin layer). After forming the light reflecting layer, the LED chip was bonded and the antireflection film was bonded by the same procedures as in [Production of micro LED display element] in Example 1. In this way, a micro LED display element of Example 2-1 was produced.

Production of Transfer Films and Production of Micro LED Display Elements of Examples 2-2 to 2-9 and Comparative Examples 2-1 and 2-2

Transfer films of Examples 2-2 to 2-9 and Comparative Examples 2-1 and 2-2 were produced by the same procedure as in Example 2-1, except that the layer configuration and layer thickness were adjusted as shown in Table 4.

In addition, micro LED display elements of Examples 2-2 to 2-9 and Comparative Examples 2-1 and 2-2 were produced by the same procedure as in Example 2-1, except that the process conditions were appropriately adjusted so that the taper angle of the partition wall shown in Table 4 was obtained.

The transfer films produced in Examples 2-1 to 2-8 correspond to the transfer film according to the second embodiment described above. In addition, the laminates produced in Examples 2-1 to 2-8 correspond to the laminate according to the second embodiment described above. That is, the partition wall in the procedure described in the above section is intended to be a laminated structure including the resin layer and the light absorbing layer, and the taper angle is intended to be an angle between the inner wall surface of the first opening portion of the resin layer and the base material.

In addition, the transfer film produced in Example 2-9 corresponds to the transfer film according to the third embodiment described above. In addition, the laminate produced in Example 2-9 corresponds to the laminate according to the third embodiment described above. That is, the partition wall in the procedure described in the above section is intended to be the light absorbing layer, and the taper angle is intended to be an angle formed by the inner wall surface of the opening portion of the light absorbing layer and the base material.

[Optical Properties]

[Optical Density (OD) of Light Absorbing Layer and Precursor Layer of Light Absorbing Layer]

The optical density (OD) of the precursor layer of the light absorbing layer in the transfer films of Examples 1 to 19 and Comparative Examples 2 and 3, and the optical density (OD) of the light absorbing layer in the pattern of the micro LED display elements of Examples 1 to 19 and Comparative Examples 2 and 3 were measured using a Macbeth densitometer (manufactured by Macbeth, TD-904, using a visual filter), and it was confirmed that the optical densities (OD) were all in a range of 3.0 to 6.0.

In addition, the optical density (OD) of the precursor layer of the light absorbing layer in the transfer films of Examples 2-1 to 2-9 and Comparative Example 2-2, and the optical density (OD) of the light absorbing layer in the pattern of the micro LED display elements of Examples 2-1 to 2-9 and Comparative Example 2-2 were measured using a Macbeth densitometer (manufactured by Macbeth, TD-904, using a visual filter), and it was confirmed that the optical densities (OD) were all in a range of 3.0 to 6.0.

[L* Value and Integral Reflectance of Light Reflecting Layer and Comparative Resin Layer]

The L* value and the integral reflectance were measured for measurement film samples (the light reflecting layer and the comparative resin layer) having a thickness of 30 μm, which were produced by the following procedure, thereby evaluating reflection characteristics of the light reflecting layer and the comparative resin layer in the pattern of the micro LED display elements of Examples 1 to 19 and Comparative Examples 1 to 3. The comparative resin layer corresponds to a layer formed of the comparative photosensitive composition B'-1.

(Production of Film Sample)

The compositions B-1 to B-5 and B'-1 were applied onto a glass substrate such that the thickness after drying was 30 μm, and dried at 100° C. for 3 minutes to form a film.

Next, a proximity exposure machine (Hitachi High-Tech Electronics Engineering Co., Ltd.) including an ultra-high pressure mercury lamp, the entire surface was exposed by irradiating the entire surface with i-rays at an exposure amount of 60 mJ/$cm^2$. Next, the entire surface was exposed to an exposure amount of 400 mJ/$cm^2$ (i-rays) using an exposure machine (manufactured by Ushio Inc.) including a high pressure mercury lamp.

After the entire surface exposure, a post-baking treatment was performed at 145° C. for 30 minutes.

In the six types of films obtained as described above (each film formed of the compositions B-1 to B-5 and B'-1), it was confirmed that all the films formed of the compositions B-1 to B-4 had an L* value of 80 or more in the CIE1976 (L*, a*, b*) color space with respect to total reflection (incidence angle: 8°, light source: D-65 (visual field: 2°)). In addition, it was confirmed that all the films formed of the compositions B-1 to B-5 had an integral reflectance of visible light having a wavelength of 400 to 700 nm of 60% or more.

On the other hand, it was confirmed that the film formed from the composition B'-1 had an L* value of less than 50, an integral reflectance of visible light having a wavelength of 400 to 700 nm of 20% or less, and did not substantially have light reflectivity.

These measurements were performed using a spectrophotometer V-570 manufactured by JASCO Corporation in a measurement environment of 25° C.

In addition, regarding the integral reflectance of the light reflecting layer (silver film) in the pattern of the micro LED display elements of Examples 2-1 to 2-9, the integral reflectance of visible light having a wavelength of 400 to 700 nm was measured using a spectrophotometer V-570 manufactured by JASCO Corporation in a measurement environment of 25° C., and it was confirmed that the integral reflectance was 60% or more.

[Reflectivity of Light Reflecting Layer at Wavelength of 385 nm]

For the composition B-1 for forming the light reflecting layer of Example 17, a measurement film sample (light reflecting layer) having a thickness of 30 μm was produced according to the procedure described in the above section of [L* value and integral reflectance of light reflecting layer and comparative resin layer]. Next, in a case where the reflectivity at a wavelength of 385 nm was measured with respect to the produced measurement film sample, it was confirmed that the reflectivity at a wavelength of 385 nm was 60% or more.

In addition, in a case where the reflectivity of the light reflecting layer (silver film) in the pattern of the micro LED display elements of Examples 2-1 to 2-9 was measured at a wavelength of 385 nm, it was confirmed that the reflectivity at a wavelength of 385 nm was 60% or more.

[Evaluation]

The following evaluations were carried out for each of the micro LED display elements produced in Examples and Comparative Examples.

In each of the produced micro LED display elements of Examples 1 to 19 and Comparative Examples 1 to 3, and each of the produced micro LED display elements of Examples 2-1 to 2-9 and Comparative Examples 2-1 and 2-2, the LED chip used was a visible light LED.

[Black Density in Case of Black Display]

In a dark room environment, the micro LED display element with black display was visually observed by allowing a fluorescent lamp to be reflected obliquely, and was classified according to the following evaluation standard. The results are shown in Tables 3 and 4. It is preferable that the reflection of light of the fluorescent lamp was suppressed.

(Evaluation Standard)

A: there was no whiteness, and the black display level was good.

B: slightly whitish

C: clearly white fog was observed.

[Measurement of Brightness in Case of White Display]

Using a brightness meter BM-5A (manufactured by TOPCON CORPORATION), the brightness of the produced micro LED display element in a case of white display was measured and classified according to the following evaluation standard. The results are shown in Tables 3 and 4.

A: 300 cd/$m^2$ or more

B: 200 cd/$m^2$ or more and less than 300 cd/$m^2$

C: less than 200 cd/$m^2$

[Measurement of Contrast in Bright Room]

In a bright room environment in which the illuminance of the micro LED display element surface was 250 1×, using a brightness meter BM-5A (manufactured by TOPCON CORPORATION), the brightness (black brightness) in a case of black display and the brightness (white brightness) in a case of white display were measured, and the contrast in a bright room was calculated as a ratio of the white brightness to the black brightness. The evaluation was classified according to the following evaluation standard. The results are shown in Tables 3 and 4.

A: 220 or more

B: 180 or more and less than 220

C: 140 or more and less than 180

D: 100 or more and less than 140

E: less than 100

TABLE 3

| | Configuration of transfer film | | | | | | Taper angle of partition wall (manufacturing condition of micro LED display element) | Number of micro LED display element | Evaluation result | | |
|---|---|---|---|---|---|---|---|---|---|---|---|
| | Number of transfer film | Precursor layer of light absorbing layer | | Interlayer Thickness | Precursor layer of light reflecting layer | | | | Black density in case of black display | Brightness in case of white display (relative value) | Contrast in bright room |
| | | Type of composition | Thickness | | Type of composition | Thickness | | | | | |
| Example 1 | 1 | A-1 | 2 μm | None | B-1 | 10 μm | 90° | 1 | A | A | D |
| Example 2 | 2 | A-1 | 2 μm | None | B-2 | 10 μm | 90° | 2 | A | A | D |
| Example 3 | 3 | A-1 | 2 μm | None | B-3 | 10 μm | 90° | 3 | A | A | D |
| Example 4 | 4 | A-1 | 2 μm | None | B-4 | 10 μm | 90° | 4 | A | A | D |
| Example 5 | 5 | A-1 | 2 μm | None | B-1 | 5 μm | 90° | 5 | A | B | D |
| Example 6 | 6 | A-1 | 2 μm | None | B-1 | 15 μm | 90° | 6 | A | A | D |
| Example 7 | 7 | A-1 | 2 μm | None | B-1 | 20 μm | 90° | 7 | A | A | D |
| Example 8 | 8 | A-1 | 1 μm | None | B-1 | 10 μm | 90° | 8 | A | A | D |
| Example 9 | 9 | A-1 | 3 μm | None | B-1 | 10 μm | 90° | 9 | A | A | D |
| Example 10 | 10 | A-1 | 2 μm | 1 μm | B-1 | 10 μm | 90° | 10 | A | A | D |
| Example 11 | 1 | A-1 | 2 μm | None | B-1 | 10 μm | 80° | 11 | A | A | C |
| Example 12 | 1 | A-1 | 2 μm | None | B-1 | 10 μm | 60° | 12 | A | A | C |
| Example 13 | 1 | A-1 | 2 μm | None | B-1 | 10 μm | 40° | 13 | A | A | C |
| Example 14 | 11 | A-1 | 2 μm | None | B-5 | 10 μm | 90° | 14 | A | A | D |
| Example 15 | 12 | A-2 | 2 μm | None | B-1 | 10 μm | 90° | 15 | A | A | D |
| Example 16 | 1 | A-1 | 2 μm | None | B-1 | 20 μm | 60° | 16 | A | A | B |
| Example 17 | 1 | A-1 | 2 μm | None | B-1 | 30 μm | 60° | 17 | A | A | A |
| Example 18 | 1 | A-1 | 2 μm | None | B-1 | 40 μm | 60° | 18 | A | A | A |
| Example 19 | 1 | A-1 | 2 μm | None | B-1 | 10 μm | 20° | 19 | A | A | C |
| Comparative Example 1 | R1 | None | — | None | B-1 | 10 μm | 90° | R1 | C | A | E |
| Comparative Example 2 | R2 | A-1 | 2 μm | None | B-1 | 2 μm | 90° | R2 | A | C | E |
| Comparative Example 3 | R3 | A-1 | 2 μm | None | B'-1 | 2 μm | 90° | R3 | A | C | E |

From the results shown in Table 3, it was confirmed that, in the transfer film of Examples, in a case of being used for pattern formation in the production of the display element including the LED chip, the black density in the case of black display was excellent, the brightness in the case of white display was excellent, and the contrast in a bright room was also excellent.

In addition, from the comparison of Examples, it was confirmed that, in a case where the thickness of the precursor layer of the light reflecting layer was 10 μm or more, the brightness in the case of white display was more excellent.

In addition, from the comparison of Examples, it was confirmed that, in a case where the taper angle of the partition wall in the laminate was 20° to 80°, the contrast in a bright room was more excellent.

In addition, from the comparison of Examples, it was confirmed that, in a case where the thickness of the precursor layer of the light reflecting layer in the transfer film (and the light reflecting layer in the laminate) was 16 μm or more (preferably 30 μm or more), the contrast in a bright room was more excellent.

On the other hand, in the case of the transfer films of Comparative Examples, none of the desired effects were obtained.

TABLE 4

| | Configuration of transfer film | | | | | | Taper angle of partition wall (manufacturing condition of micro LED display element) | Presence or absence of silver vapor deposition | Number of micro LED display element | Evaluation result | | |
|---|---|---|---|---|---|---|---|---|---|---|---|---|
| | Number of transfer film | Precursor layer of light absorbing layer | | Interlayer Thickness | Precursor layer of light reflecting layer | | | | | Black density in case of black display | Brightness in case of white display (relative value) | Contrast in bright room |
| | | Type of composition | Thickness | | Type of composition | Thickness | | | | | | |
| Example 2-1 | 2-1 | A-1 | 2 μm | None | B'-1 | 10 μm | 90° | Y | 2-1 | A | A | D |
| Example 2-2 | 2-1 | A-1 | 2 μm | None | B'-1 | 10 μm | 80° | Y | 2-2 | A | A | C |
| Example 2-3 | 2-1 | A-1 | 2 μm | None | B'-1 | 10 μm | 60° | Y | 2-3 | A | A | B |
| Example 2-4 | 2-1 | A-1 | 2 μm | None | B'-1 | 10 μm | 40° | Y | 2-4 | A | A | B |
| Example 2-5 | 2-1 | A-1 | 2 μm | None | B'-1 | 10 μm | 20° | Y | 2-5 | A | A | C |
| Example 2-6 | 2-1 | A-1 | 2 μm | None | B'-1 | 20 μm | 60° | Y | 2-6 | A | A | A |
| Example 2-7 | 2-1 | A-1 | 2 μm | None | B'-1 | 30 μm | 60° | Y | 2-7 | A | A | A |
| Example 2-8 | 2-1 | A-1 | 1 μm | None | B'-1 | 40 μm | 60° | Y | 2-8 | A | A | A |
| Example 2-9 | 2-2 | A-3 | 30 μm | None | None | — | 60° | Y | 2-9 | A | A | A |
| Comparative Example 2-1 | R2-1 | None | — | None | B'-1 | 10 μm | 90° | Y | R2-1 | C | A | E |

TABLE 4-continued

| | Configuration of transfer film | | | | | | Taper angle of partition wall | | | Evaluation result | | |
|---|---|---|---|---|---|---|---|---|---|---|---|---|
| | | Precursor layer of light absorbing layer | | | Precursor layer of light reflecting layer | | | | | | | |
| | Number of transfer film | Type of composition | Thickness | Interlayer Thickness | Type of composition | Thickness | (manufacturing condition of micro LED display element) | Presence or absence of silver vapor deposition | Number of micro LED display element | Black density in case of black display | Brightness in case of white display (relative value) | Contrast in bright room |
| Comparative Example 2-2 | R2-2 | A-1 | 2 μm | None | B'-1 | 2 μm | 90° | N | R2-2 | A | C | E |

From the results shown in Table 4, it was confirmed that, in the display elements using the laminates of Examples (Examples 2-1 to 2-8: examples according to the second embodiment, Example 2-9: example according to the third embodiment), the black density in the case of black display was excellent, the brightness in the case of white display was excellent, and the contrast in a bright room was also excellent.

In addition, from the comparison of Examples 2-1 to 2-8, it was confirmed that, in a case where the taper angle of the partition wall was 20° to 80°, the contrast in a bright room was more excellent. In addition, the same tendency was confirmed in Example 2-9.

In addition, from the comparison of Examples 2-1 to 2-8, it was confirmed that, in a case where the thickness of the light reflecting layer in the laminate according to the second embodiment was 16 μm or more, the contrast in a bright room was more excellent. In addition, it was confirmed that, in a case where the thickness of the light absorbing layer in the laminate of Example 2-9 according to the third embodiment was 16 μm or more, the contrast in a bright room was more excellent.

On the other hand, in the case of the transfer films of Comparative Examples, none of the desired effects were obtained.

Examples 1A to 19A and Examples 2-1A to 2-9A

Each transfer film of Examples 1A to 19A and Examples 2-1A to 2-9A was produced by the same method as in Examples 1 to 19 and Examples 2-1 to 2-9, except that the temporary support and cover film used in the production of the transfer film were changed to the following materials. Next, a micro LED display element was produced using each of the obtained transfer films by the same method as in Examples 1 to 19 and Examples 2-1 to 2-9, and the above-described evaluations were carried out.

As a result, the micro LED display element in which each of the transfer films of Examples 1A to 19A and Examples 2-1A to 2-9A was produced had the same evaluation results as each of the micro LED display elements of Examples 1 to 19 and Examples 2-1 to 2-9.

Temporary support: product name "LUMIRROR (registered trademark) 16FB40", manufactured by Toray Industries, Inc., thickness: 16 m, PET film Cover film: product name "Alphan (registered trademark) E-210F", manufactured by Oji F-Tex Co., Ltd., thickness: 50 m, polypropylene film

Example 17B

Figure 14:
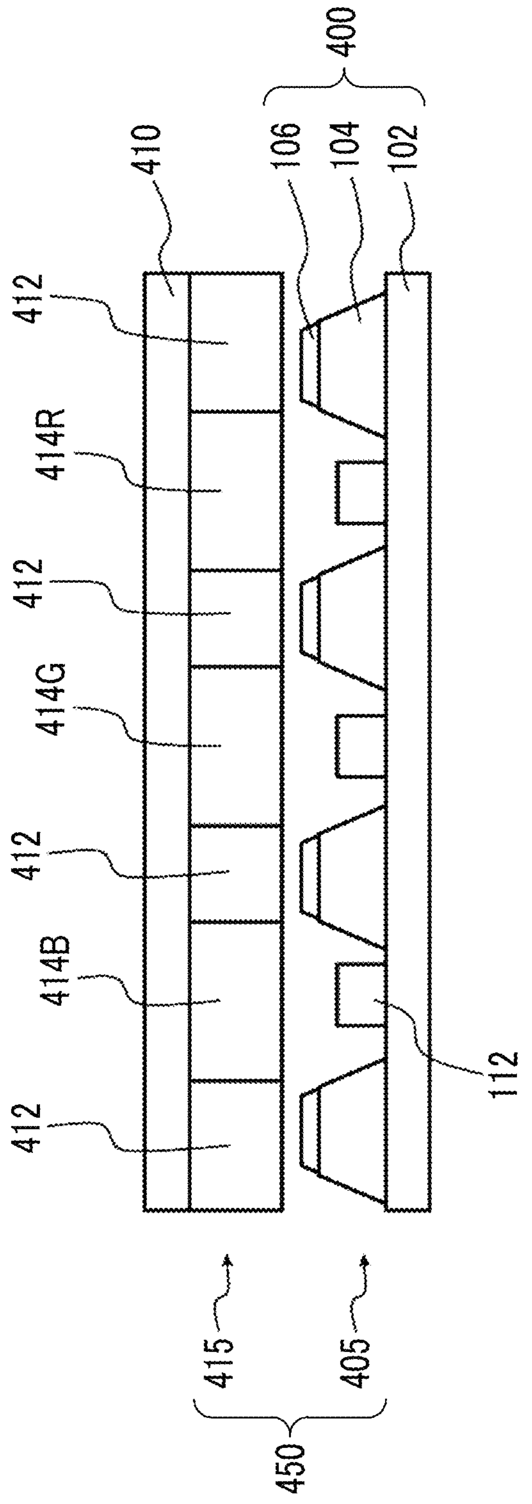
FIG. 14 is a schematic view of a micro LED display element produced in Examples.

A micro LED display element was produced in the same manner as in Example 17, except that an UV-LED having a light emission wavelength of 385 nm was used as the LED chip, and a color conversion member including a color conversion pixel that converted UV light into each of BGR colors was disposed on the partition wall structure. FIG. 14 shows a schematic view of the produced micro LED display element. A micro LED display element 450 shown in FIG. 4 includes a laminate 405 on which an UV-LED (light emitting element) 112 is mounted, and a color conversion member 415. The laminate 405 includes a base material 102, the UV-LED (light emitting element) 112 disposed on the base material 102, and a partition wall 400 disposed on the base material 102 so as to surround the UV-LED (light emitting element) 112; and the partition wall 400 has a configuration in which a light reflecting layer 104 having a thickness of 3 μm or more and a light absorbing layer 106 are arranged in this order. In addition, the color conversion member 415 includes a base material 410, a color conversion layer including a color conversion pixel 414B which is disposed on the base material 410 and converts UV light into blue (B), a color conversion pixel 414G which is disposed on the base material 410 and converts UV light into green (G), and a color conversion pixel 414R which is disposed on the base material 410 and converts UV light into red (R), and a color mixing prevention layer 412 which prevents color mixing of light between the color conversion pixels.

In addition, in a case where the produced micro LED display element was evaluated by the same methods as in Example 17, it was confirmed that the black density in the case of black display, the brightness in the case of white display, and the contrast in a bright room were also good. In addition, it was confirmed that the optical density of the light absorbing layer at a wavelength of 385 nm was 3 or more, and the light reflectivity at 385 nm was 60% or more in a measurement sample having a thickness of 30 μm for measuring light reflectivity.

Example 2-7B

A micro LED display element was produced and evaluated in the same manner as in Example 2-7 (see FIG. 14; however, the partition wall 400 in FIG. 14 had the same structure as the partition wall produced in the micro LED display element of Example 2-7), except that an UV-LED having a light emission wavelength of 385 nm was used as the LED chip, and a color conversion member including a color conversion pixel that converted UV light into each of BGR colors was disposed on the partition wall structure. It was confirmed that the black density in the case of black display, the brightness in the case of white display, and the contrast in a bright room were also good. In addition, it was confirmed that the optical density of the light absorbing layer at a wavelength of 385 nm was 3 or more.

Example 2-9B

A micro LED display element was produced and evaluated in the same manner as in Example 2-9 (see FIG. 14; however, the partition wall 400 in FIG. 14 had the same structure as the partition wall produced in the micro LED display element of Example 2-9), except that an UV-LED having a light emission wavelength of 385 nm was used as the LED chip, and a color conversion member including a color conversion pixel that converted UV light into each of BGR colors was disposed on the partition wall structure. It was confirmed that the black density in the case of black display, the brightness in the case of white display, and the contrast in a bright room were also good. In addition, it was confirmed that the optical density of the light absorbing layer at a wavelength of 385 nm was 3 or more.

EXPLANATION OF REFERENCES

30: display device
10: array substrate
12: LED chip
14: partition wall layer
16: conductive layer
18: light reflecting layer
20: light absorbing layer
40, 50, 250, 350: transfer film
41, 252, 352: temporary support
43, 254, 354: precursor layer of light absorbing layer
45: precursor layer of light reflecting layer
47, 258, 356: protective film
51: interlayer
100, 200, 300, 200', 300', 405: laminate
112, 214, 310: light emitting element
102, 202, 302, 410: base material
102*a*, 202*a*, 302*a*: exposed surface of base material
104: light reflecting layer
208A, 308A: first light reflecting layer
208B, 308B: second light reflecting layer
106, 206, 304: light absorbing layer
204: resin layer
256: photosensitive layer
θa, θb, θc: angle
108, 210: first opening portion
108*a*, 210*a*: inner wall surface of first opening portion
110, 212: second opening portion
110*a*, 212*a*: inner wall surface of second opening portion
306: opening portion
306*a*: inner wall surface of opening portion
450: micro LED display element
112: UV-LED (light emitting element)
415: color conversion member
400: partition wall
414B, 414G, 414R: color conversion pixel
412: color mixing prevention layer

What is claimed is:

1. A manufacturing method of a laminate using a transfer film,
the transfer film comprising, in the following order:
a temporary support;
a photosensitive precursor layer of a light absorbing layer; and
a photosensitive precursor layer of a light reflecting layer,
wherein a thickness of the precursor layer of the light reflecting layer is 3 μm or more, and
the manufacturing method of a laminate, comprising:
a bonding step of bonding the transfer film to a base material by bringing a surface of the transfer film on a side opposite to the temporary support into contact with the base material to obtain a precursor layer-attached base material including the base material, the precursor layer of the light reflecting layer, the precursor layer of the light-absorbing layer, and the temporary support in this order;
an exposing step of exposing the precursor layer of the light reflecting layer and the precursor layer of the light-absorbing layer in the precursor layer-attached base material; and
a developing step of developing the exposed precursor layer of the light reflecting layer and the exposed precursor layer of the light-absorbing layer to form a pattern having a light reflecting layer and a light absorbing layer in order from the base material side,
wherein the manufacturing method further includes, between the bonding step and the exposing step or between the exposing step and the developing step, a peeling step of peeling the temporary support from the precursor layer-attached base material.

2. The manufacturing method of a laminate according to claim 1,
wherein the precursor layer of the light reflecting layer contains an alkali-soluble resin, a polymerizable compound, and a photopolymerization initiator.

3. The manufacturing method of a laminate according to claim 1,
wherein the precursor layer of the light absorbing layer contains an alkali-soluble resin, a polymerizable compound, and a photopolymerization initiator.

4. The manufacturing method of a laminate according to claim 1,
wherein the thickness of the precursor layer of the light reflecting layer is 5 μm or more.

5. The manufacturing method of a laminate according to claim 2,
wherein the precursor layer of the light reflecting layer contains particles having a refractive index higher than a refractive index of a cured substance of the polymerizable compound.

6. The manufacturing method of a laminate according to claim 5,
wherein the particles include titanium oxide.

7. The manufacturing method of a laminate according to claim 1,
wherein the precursor layer of the light reflecting layer contains metal particles.

8. The manufacturing method of a laminate according to claim 1,
wherein the precursor layer of the light reflecting layer contains hollow particles.

9. The manufacturing method of a laminate according to claim 1,
wherein the precursor layer of the light reflecting layer contains a liquid crystal compound.

10. The manufacturing method of a laminate according to claim 1,
wherein a thickness of the precursor layer of the light absorbing layer is 1 μm or more.

11. The manufacturing method of a laminate according to claim 1,
wherein the precursor layer of the light absorbing layer contains carbon black.

12. The manufacturing method of a laminate according to claim 1, the transfer film comprising, in the following order:

the temporary support;

the photosensitive precursor layer of a light absorbing layer; and the photosensitive precursor layer of a light reflecting layer, wherein the precursor layer of the light reflecting layer contains an alkali-soluble resin, a polymerizable compound, and a photopolymerization initiator, the precursor layer of the light absorbing layer contains an alkali-soluble resin, a polymerizable compound, and a photopolymerization initiator, the thickness of the precursor layer of the light reflecting layer is 5 μm or more, and a thickness of the precursor layer of the light absorbing layer is 1 μm or more.

13. The manufacturing method of a laminate according to claim 1, further comprising:

an interlayer between the precursor layer of the light absorbing layer and the precursor layer of the light reflecting layer.

14. A laminate formed by the manufacturing method of a laminate according to claim 1.

15. A micro LED display element comprising:

the laminate according to claim 14.

16. A manufacturing method of a laminate using a transfer film, the transfer film comprising, in the following order:

a temporary support;

a photosensitive precursor layer of a light absorbing layer, and a photosensitive layer, wherein a thickness of the photosensitive layer is 3 μm or more, and the manufacturing method of a laminate, comprising:

a bonding step of bonding the transfer film to a base material by bringing a surface of the transfer film on a side opposite to the temporary support into contact with the base material to obtain a precursor layer-attached base material including the base material, the photosensitive layer, the precursor layer of the light-absorbing layer, and the temporary support in this order;

an exposing step of exposing the photosensitive layer and the precursor layer of the light-absorbing layer in the precursor layer-attached base material; and a developing step of developing the exposed photosensitive layer and the exposed precursor layer of the light-absorbing layer to form a light absorbing layer having a first opening portion penetrating in a thickness direction and a resin layer having a second opening portion penetrating in a thickness direction and communicating with the first opening portion, wherein the manufacturing method further includes, between the bonding step and the exposing step or between the exposing step and the developing step, a peeling step of peeling the temporary support from the precursor layer-attached base material, a light reflecting layer forming step of forming a light reflecting layer on an inner wall surface of the second opening portion of the resin layer, and in a case where the base material includes no light emitting element on an exposed surface exposed through the second opening portion, a light emitting element disposing step of disposing the light emitting element on the exposed surface.

17. The manufacturing method of a laminate according to claim 16, the transfer film comprising, in the following order:

the temporary support;

the photosensitive precursor layer of a light absorbing layer; and the photosensitive layer, wherein the precursor layer of the light absorbing layer contains an alkali-soluble resin, a polymerizable compound, and a photopolymerization initiator, the photosensitive layer contains an alkali-soluble resin, a polymerizable compound, and a photopolymerization initiator, the thickness of the precursor layer of the light absorbing layer is 1 μm or more, and a thickness of the photosensitive layer is 5 μm or more.

18. A laminate formed by the manufacturing method of a laminate according to claim 16.

19. A manufacturing method of a laminate using a transfer film, the transfer film comprising:

a temporary support; and a photosensitive precursor layer of a light absorbing layer, wherein a thickness of the precursor layer of the light absorbing layer is 3 μm or more, and an optical density of the precursor layer of the light absorbing layer at a wavelength of at least one of 385 nm and 550 nm is 3.0 to 6.0, and the manufacturing method of a laminate, comprising:

a bonding step of bonding the transfer film to a base material by bringing a surface of the transfer film on a side opposite to the temporary support into contact with the base material to obtain a precursor layer-attached base material including the base material, the precursor layer of the light-absorbing layer, and the temporary support in this order;

an exposing step of exposing the precursor layer of the light-absorbing layer in the precursor layer-attached base material; and a developing step of developing the exposed precursor layer of the light-absorbing layer to form a light absorbing layer having an opening portion penetrating in a thickness direction, wherein the manufacturing method further includes, between the bonding step and the exposing step or between the exposing step and the developing step, a peeling step of peeling the temporary support from the precursor layer-attached base material, a light reflecting layer forming step of forming a light reflecting layer on an inner wall surface of the opening portion of the light absorbing layer, and in a case where the base material includes no light emitting element on an exposed surface exposed through the opening portion, a light emitting element disposing step of disposing the light emitting element on the exposed surface.

20. The manufacturing method of a laminate according to claim 19, the transfer film comprising:

the temporary support; and the photosensitive precursor layer of a light absorbing layer, wherein a thickness of the precursor layer of the light absorbing layer is 3 μm or more, the precursor layer of the light absorbing layer contains an alkali-soluble resin, a polymerizable compound, and a photopolymerization initiator and an optical density of the precursor layer of the light absorbing layer at a wavelength of at least one of 385 nm and 550 nm is 3.0 to 6.0.

21. A laminate formed by the manufacturing method of a laminate according to claim 19.

22. A transfer film comprising, in the following order:

a temporary support;

a photosensitive precursor layer of a light absorbing layer; and a photosensitive precursor layer of a light reflecting layer, wherein a thickness of the precursor layer of the light reflecting layer is 3 μm or more, and the precursor layer of the light reflecting layer contains hollow particles.

23. A transfer film comprising, in the following order:

a temporary support;

a photosensitive precursor layer of a light absorbing layer;

an interlayer; and a photosensitive precursor layer of a light reflecting layer, wherein a thickness of the precursor layer of the light reflecting layer is 3 μm or more.

* * * * *